United States Patent [19]

Brandyberry et al.

[11] Patent Number: 4,542,469
[45] Date of Patent: Sep. 17, 1985

[54] PROGRAMMABLE DEMAND REGISTER WITH TWO WAY COMMUNICATION THROUGH AN OPTICAL PORT AND EXTERNAL READING DEVICES ASSOCIATED THEREWITH

[75] Inventors: Robert E. Brandyberry; Mark M. Forbes, both of Lafayette; David D. Gloyeski, Battle Ground; Russell F. Greafnitz, Lafayette; Glen R. Phillips, West Lafayette; Robert L. Straw, Linden; Kevin L. Stricker, West Lafayette; William A. Szabela, West Point; Richard R. Webeck; Glenn A. Mayfield, both of West Lafayette; William L. Vollmer, Lafayette, all of Ind.

[73] Assignee: Duncan Electric Company, Inc., Lafayette, Ind.

[21] Appl. No.: 407,608

[22] Filed: Aug. 12, 1982

[51] Int. Cl.$^4$ .................. G06F 15/20; G01R 19/165
[52] U.S. Cl. ................................. 364/483; 364/492; 340/870.28
[58] Field of Search ............ 364/483, 492, 464; 324/103 R, 116; 340/870.28, 870.29

[56] References Cited
U.S. PATENT DOCUMENTS 3,422,441 1/1969 Chapsky ................... 346/74
3,932,730 1/1976 Ambrosio ............... 235/61.9 R Primary Examiner—Edward J. Wise
Attorney, Agent, or Firm—John R. Nesbitt

[57] ABSTRACT

A Programmable Demand Register (PDR TM) which has a multi-function externally programmable time based measuring system is disclosed. An optical communication port is provided for bidirectional communication of data, said meter being capable of recordation of energy consumption in several different modes, according to the decision of the meter programmer. Meter programming is accomplished by means of any one of three separate devices, namely a Programmer/Reader (P/R) which is a sophisticated computerized device fully adapted to reprogram the PDR TM to function in any one or combination of modes as desired, to both receive and store data, and to output said data to a central billing recordation computer, and a billing period resetter (BPR) which is a battery powered device also adapted for two way communication, but limited to resetting the BPR as to data in the BPR memory, but not as to mode of operation of the BPR, and an inexpensive lightweight BPR-1 which also has two way communication capabilities, but limited to resetting the various meter functions, after insertion of a manually programmed password by the actuation of a series of switches.

23 Claims, 87 Drawing Figures

F = FORWARD TRANSITION
R = REVERSE TRANSITION
Σ = ERROR TRANSITION

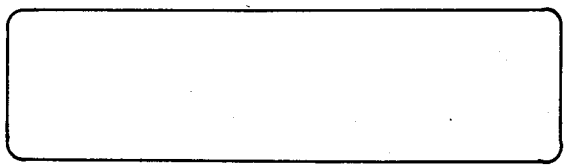
FIG. 9
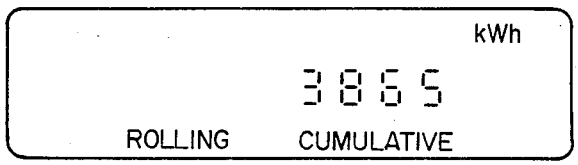
FIG. 10
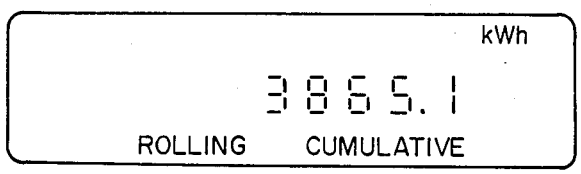
FIG. 11
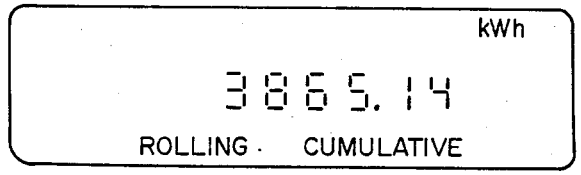
FIG. 12
FIG. 13

```
FFE7634F
```
FIG. 38

```
CODE#
  6    03 43
```
FIG. 39

```
CODE#
  7    0.0072
```
FIG. 40

```
CODE#
  8    0.0864
```
FIG. 41

```
CODE#
  9    93  28
```
FIG. 42

```
ROLLING   BLOCK   CUMULATIVE
```
FIG. 43

BPR BLOCK
DIAGRAM

PROGRAMMABLE DEMAND REGISTER WITH TWO WAY COMMUNICATION THROUGH AN OPTICAL PORT AND EXTERNAL READING DEVICES ASSOCIATED THEREWITH

BACKGROUND OF THE INVENTION

Until now, electric meters have been primarily electro-mechanical devices. These traditional type meters have slowly evolved, through many generations of improved devices, addressing such issues as reduction of friction losses in the meter, calibration accuracy, maintenance, tamper proof construction modes, and surge protection and detection. Many other incremental improvements have been made in electro-mechanical devices, until the recent meters are about as efficient and trouble free as an electro-mechanical meter can be.

A programmable electric energy meter has recently been patented and is described in U.S. Pat. No. 4,298,839, but this meter cannot be selectively enabled, and disabled, as to its several functions by an external device. In this sense, the meter described in U.S. Pat. No. 4,298,839, is not even programmable, at least not as respects the device proposed herein.

Applicants have designed and developed a solid-state Programmable Demand Register TM (PDR TM) which is so much a departure from the traditional electric meter that it does not even employ the familiar dials on the register face. For use in programming, and/or reading functions in conjunction with the PDR TM, a Programmer/Reader TM (P/R TM) is proposed and for reading and resetting the PDR TM a Billing Period Resetter (BPR) or a BPR-1 is proposed.

SUMMARY OF THE INVENTION

In accordance with the present invention a programmable demand register (PDR) is provided which includes a programmed sequence of operations controlled by a logic control circuit for continuous (under interrogation) readout of various parameters inserted into the meter according to energy flow therethrough.

A unique feature of the present PDR TM is that, unlike the one or two other electronic meters known to applicants, the various modes of meter information stored in the meter not only are programmed into the meter upon manufacture, but may be selectively enabled and disabled, by an external control device, which applicants call a Programmer/Reader (P/R) so that the PDR TM may function in various capacities to record as many separate functions as the manufacturer cares to preprogram into the meter, and in field operation, the meter user need only utilize such of the functions as he may find desirable and useful.

The meter is both reset, interrogated, and reprogrammed by the device called a Programmer/Reader (P/R) which is not separately powered, but which has a keyboard function and logic circuits which can, collectively, reset the readings into the PDR TM itself, or enable or disable meter functions, and which includes a password for "electronic key" entry into the PDR TM, and which further inserts the reading date into the PDR TM. These keying functions and date recordation functions tend to eliminate false interrogations of the PDR TM, and provide security against power theft by insertion of false readings into the meter. The P/R (not having a separate on board power source) is a lightweight portable unit which may easily be carried by the meter reader, and the P/R also includes output means adapted for communication with a central billing data processing computer.

Another, still smaller device for use with the PDR TM, is the billing period resetter (BPR) which does not include the capabilities described above for the P/R, but which does contain a keyboard and small microprocessor which is adapted to both receive information from the PDR TM for recordation in its internal memory, and to retransmit reset signals to the PDR TM, even though it has no capability to reset the function, non-function mode of the various energy recordation functions of the PDR TM. Another still cheaper device, BPR,-1, is proposed which has a simple switch circuit that gives password access into the PDR TM (which of course is also an access provided and required by both the P/R and the BPR) and the BPR-1 does also include a simple on-board memory circuit for receipt of the password data from the PDR TM after the correct password entry is generated. The BPR-1 resets the PDR TM, and, while not capable of inputing the date of resetting, it does put in an arbitrary signal which at least indicates to the PDR TM (and which is stored in the memory of the PDR TM) that resetting has occurred.

BRIEF DESCRIPTION OF THE DRAWINGS

FIGS. 9 through 47 are various display modes that appear on the face of the PDR TM at various times of PDR TM operation. The information portrayed in each figure is obvious, except for FIG. 9, which is open. This is the "logo flash mode" and would be the logo of the PDR TM manufacturer.

FIG. 10 is the "segment check" mode.

FIGS. 11, 12, 13 and 14 are "energy display modes".

FIGS. 15, 16, 17 and 18 are present $\overline{kW}$ modes.

FIGS. 19, 20, 21 and 22 are maximum $\overline{kW}$ modes.

FIGS. 23, 24, 25 and 26 are cumulative $\overline{kW}$ modes.

FIG. 27 is an alarm on $\overline{kW}$ display mode.

FIG. 28 is a load off $\overline{kW}$ mode.

FIG. 29 is the MP ration mode.

FIG. 30 is a meter constant display mode.

FIG. 31 is a demand interval length mode.

FIG. 32 is a frequency display mode.

FIG. 33 is a transformer factor mode.

FIGS. 34 through 42 are code display modes which are used to indicate information that does not have a specific annunciator assigned.

FIG. 43 shows the mode indicators.

FIG. 44 indicates the SIO meter status.

FIG. 45 indicates an error mode.

FIG. 46 indicates the end of demand interval mode.

FIG. 47 indicates the consumer alert and load control modes.

DETAILED DESCRIPTION OF THE INVENTION

Figure 1:
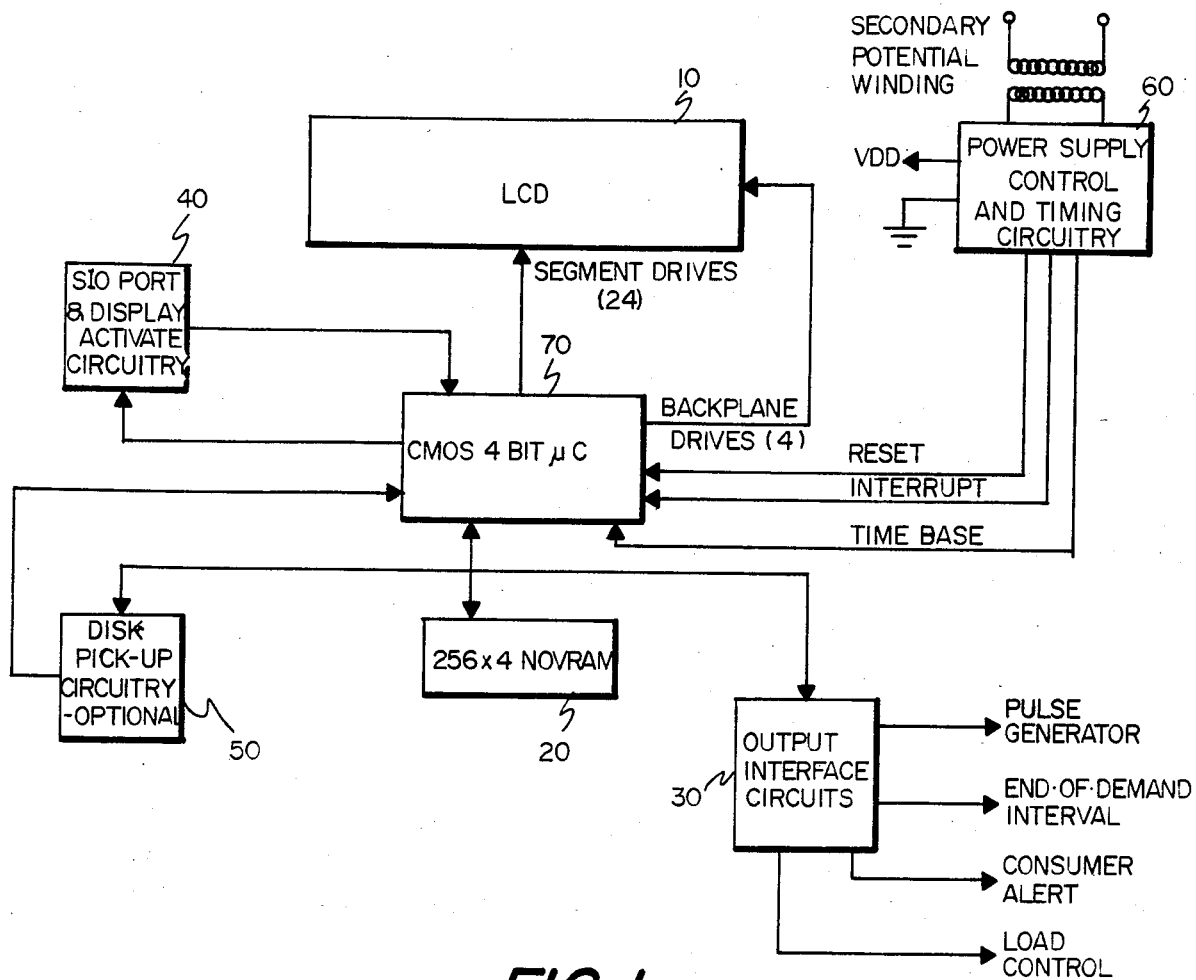
FIG. 1 is a block diagram of the PDR TM.

The basic PDR ™ block diagram is shown in FIG. 1. As will be readily appreciated, the new register consists, essentially, of seven parts which are functionally portrayed in FIG. 1. Part 10 comprises the liquid crystal display (LCD) which is used to display information stored in the PDR ™. A typical display, the date of last reset (in this case June 28, 1981) is shown at 90 in FIG. 2. The CPU, shown in FIG. 1, at 70, generates the signals which drive the LCD.

Part 20 is the non-volatile random access memory (NOVRAM) for PDR ™. This part of the register contains 2K bits of memory which is organized as a 256×6 static random access memory (RAM) overlaid bit-for-bit with a non-volatile 256×4 electrically erasable Programmable Read Only Memory ($E^2$PROM). The RAM read/write cycles and non-volatile store and recall functions of the register are controlled by the CPU. Use of the NOVRAM is unique in meters, and permits retention of stored data even after a power failure.

Part 30 comprises the control hardware which decodes the external control signals produced by the CPU and makes them compatible with devices external to the PDR ™, such as an external consumer alert indicator.

Figure 2:
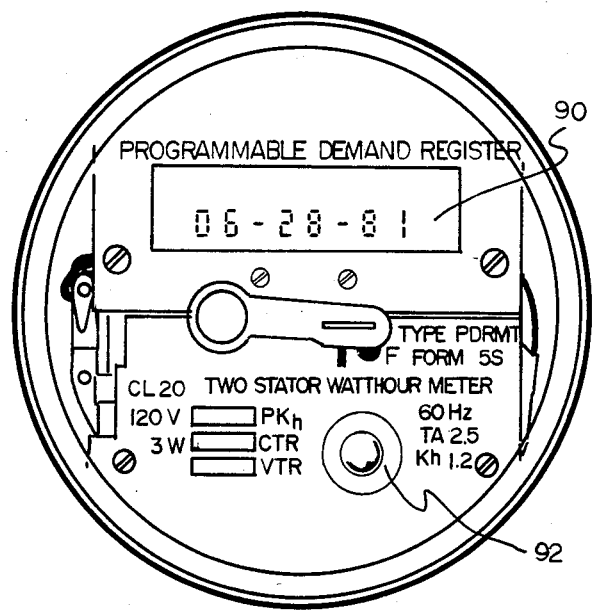
FIG. 2 is a front view of the PDR TM.
Figure 3:
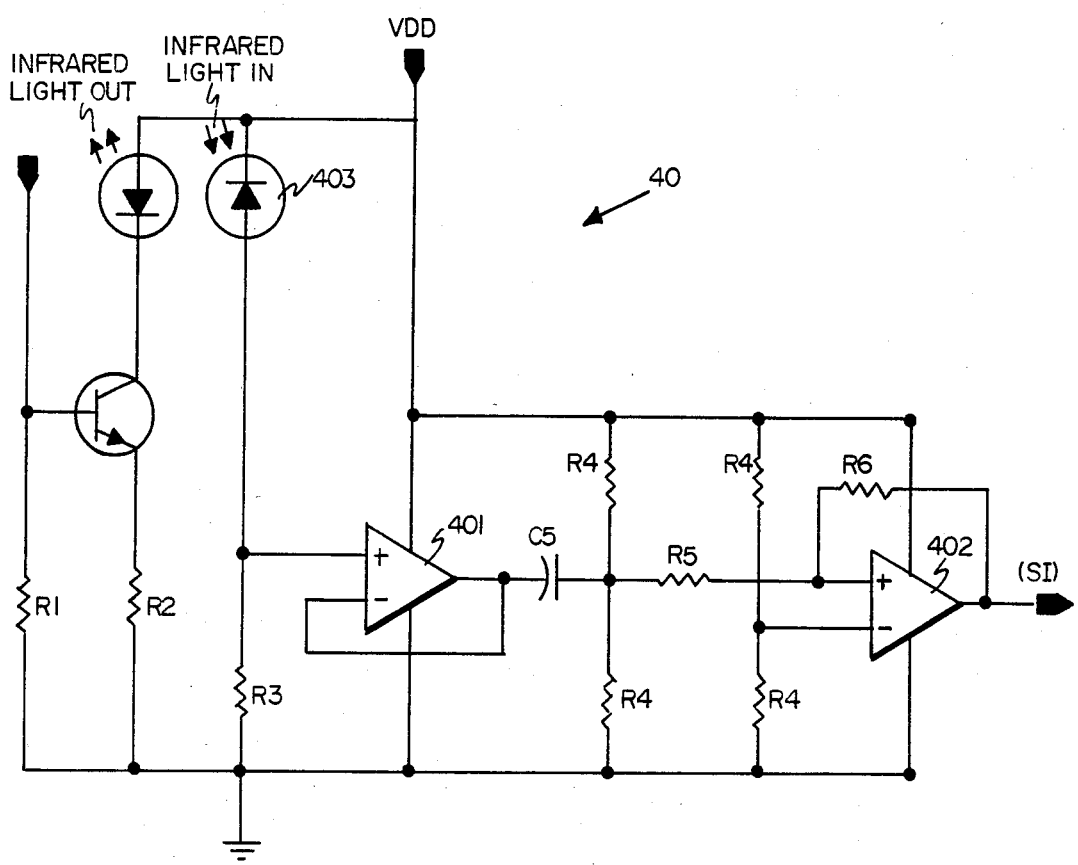
FIG. 3 is a schematic diagram of the optical port associated circuitry

Part 40 comprises the optical port (shown in FIG. 2 at 92). This port emits infrared light as controlled by the serial output (SO) pin of the CPU and converts the incoming infrared light to an analogous signal on the serial input pin (SI) (shown in FIG. 3) of the CPU. The infrared input is detected by the use of a differentiator 401 followed by a hysteresis amplifier 402. An abrupt change in the light level on the photo detector 403 is differentiated causing a voltage output spike which is input to the hysteresis amplifier 402. A positive going spike from the differentiator 401 changes a low output on the hysteresis amplifier 402 to a high output. A negative going spike from the differentiator 401 changes a high output on the hysteresis amplifier 402 to a low output.

Part 60 comprises the PDR ™ power supply circuitry (shown in FIG. 5) and includes four major functions as follows:

(1) Filtration and regulation of the incoming voltage (about 9 vac from the secondary on the potential core) to produce a constant 5 volt D.C. which is supplied to the integrated circuits throughout the PDR ™. This is accomplished by bridge rectifier CR8, capacitor C9 and C10, and regulator 602.

(2) Provides a constant impedance load for the potential secondary winding. This is accomplished by the use of amplifier 601, transistor Q5, and resistors R21, R22 and R23. Resistor R21 senses the total PDR ™ system D.C. current. Resistors R22 and R23 set a reference to amplifier 601. Amplifier 601 controls the base and thus the current flowing through Q5.

When system current decreases, the current through R21 decreases. Since R23>>R21, the reference set by R22 and R23 remains constant but the voltage drop across R21 decreases. Using the node between R21 and R23 as a reference, this is seen as a decrease in voltage at the negative terminal of amplifier 601. This action drives the output of amplifier 601 up which causes Q5 to conduct more current. When the current through Q5 increases, the current through R21 also increases. Thus, lowering of system current causes rising Q5 current.

An increase in system current is felt as an increase in the voltage across R21. The output of amplifier 601 decreases to compensate for the increase at the negative terminal. This action tends to turn Q5 off, Thus drawing less Q5 and system current.

Changes in input voltages are felt across R22 and R23. If the input voltage increases, the voltage at the positive terminal of amplifier 602 also increases. This causes an increase at the output of amplifier 601 which in turn causes more current to flow through Q5. Thus a rise in input voltage causes a corresponding rise in PDR ™ current. If the voltage decreases across R22 and R23, the voltage at the positive terminal of amplifier 602 also decreases. This causes a voltage decrease at the output of amplifier 601 which is applied to the base of Q5 causing less current to flow through Q5. Therefore, a drop in input voltage causes a corresponding drop in system current.

Therefore, with constant voltages, the current tends to stay the same in this circuit. If the voltage rises the current tends also to rise, if the voltage lowers the current tends to drop. Thus the secondary coil "sees" a constant impedance from this circuit. The input impedance is set by:

$$R21(R22+R23)/R23$$

Thus the secondary coil "sees" a constant load.

(3) Generation of a square wave with a frequency equal to that of the line. This is accomplished by resistor R24 and invertor 603.

(4) Produces the control signals to indicate utility line status to the CPU wherein "status" is defined to mean the presence or lack thereof of power to the register.

This is done by resistors R13 through R18 amplifiers 609, 610 and 611, and logic 604 through 608, and C7. Resistors R17 and R18 set the gain on amplifier 609 which has an internal reference. The resultant one volt reference signal is sent to both hysteresis amplifiers 610 and 611. During power up, the output of amplifier 610 is kept low due to its inputs. This low signal is used to keep power off of amplifier 611 and it forces a high level logic on the outputs of gates 604 and 606. This forces a low level on the interrupt line and a high level as the reset line. When the voltage across R15 and R16 becomes high enough to switch amplifier 610 to a high level output, power is applied to amplifier 611, flip flop 607 is no longer forced into the set state and flip flop 608 in no longer forced into the reset state. When the voltage across R19 and R20 becomes large enough to set hysteresis amplifier 611 to a high level output the actions of the flip flops will be as follows: flip flop 607 will become reset due to the high logic level on its reset pin and flip flop 608 will remain reset. The system would now begin operating normally. As the input voltage drops across R19 and R20, amplifier 611 initiates a power fail by switching to a low level output. This causes a logic one to be latched into the interrupt flip flop 608 and the system goes into a power fail state. Should the power come back immediately, the CPU will remain in the power fail state until the store pulse is received on gate 606 or flip flop 607. The store pulse is the indication that the CPU has completed the power fail routine.

Figure 4:
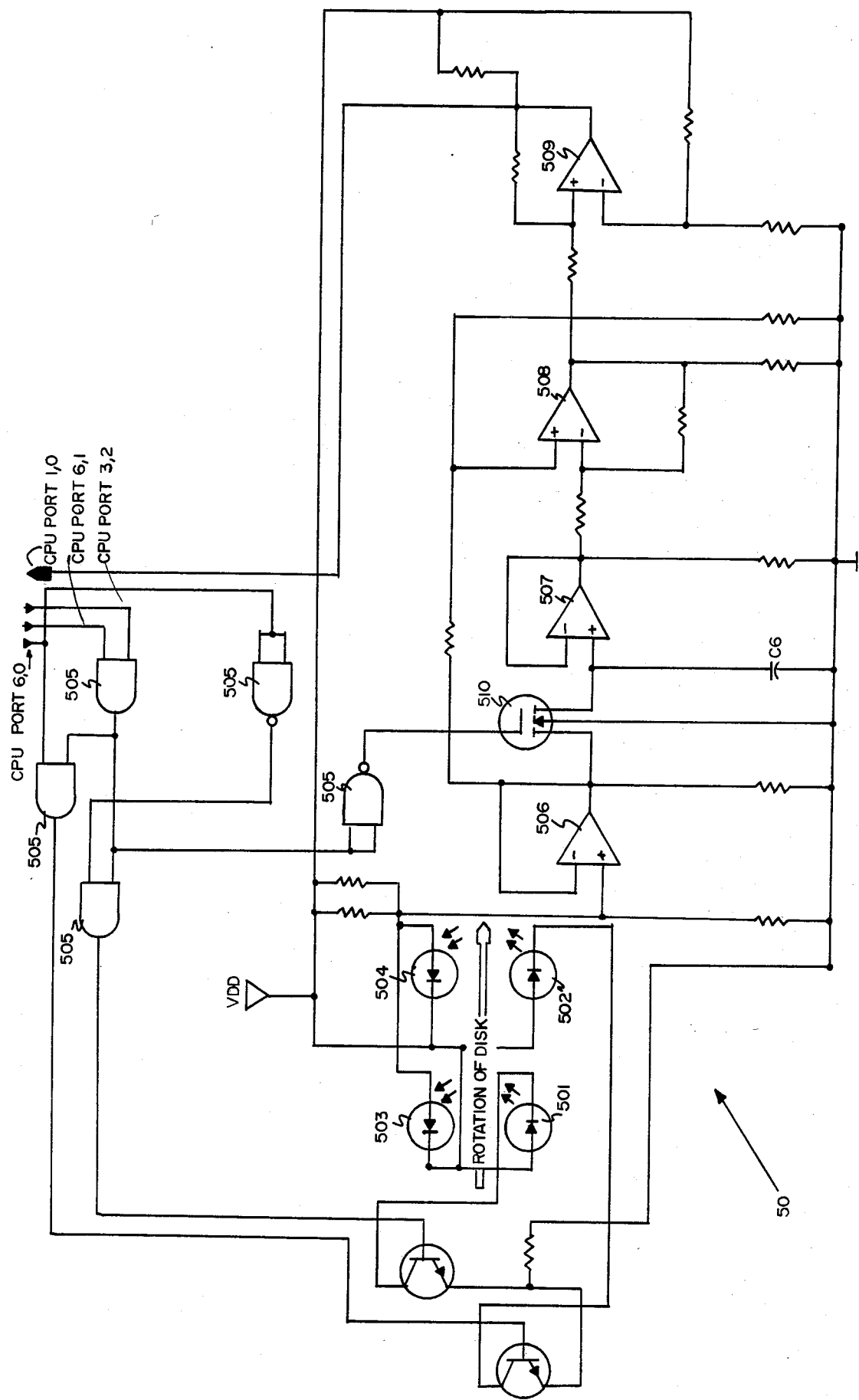
FIG. 4 is a schematic diagram of the disk pick-up circuitry.

Part 50 comprises the disk pick-up circuitry which, when properly activated by the CPU, produces the signals said by the CPU to determine disk rotation. The single disk pick-up circuit shown in FIG. 4 is used for detection on both emitter/detector pairs 501, 502, 503 and 504. In conjunction with the CPU, the disk pick-up circuitry will compare a sample of the ambient light level on the photo receiver 503 or 504 with the light level on the photo receiver when the photo emitter 501 or 502 is pulsed. Thus, the ouput of the disk pick-up circuitry is a signal analogous to the presence or lack thereof of a shutter mechanism between the photo emitter and photo detector. As indicated, in PDR TM, two such emitter/detector arrangements are used to detect movement and direction of the meter disk. Logic ports (3,2), (6,0) and (6,1) from the CPU are used to select the particular emitter/detector pair. Decoding circuitry 505 is used to activate the disk pick-up circuitry and to prevent excess emitting of infrared radiation. Amplifier 506 is a unity gain buffer for the detector. The signal from the unity gain buffer is sent to a sample and hold buffer 507 and the differential amplifier 508. A sample of the ambient level of light is gated through the F.E.T. switch 510 and "stored" on C6 of the sample and hold buffer. That signal is applied to the differential amplifier 508 through the unity gain buffer 507. The emitter 501 or 502 is then pulsed, the signal from the unity gain buffer 506 is applied directly to the differential amplifier 508. The comparison is made on the differential amplifier 508 between the just sampled signal and that of the previously sampled ambient noise level. That signal is sent directly to a hystersis amplifier 509 for final conditioning before entering the CPU or Logic port 1,0. The ambient level sensing and the final stage of hysterisis give this circuit good signal stability and ambient light reception.

Part 70 comprises the circuitry of the Central Processing Unit (CPU) of the PDR TM. The particular circuitry used is not shown herein as it is that of the NEC 7503 micro-controller which is programmable, in the configuration of the PDR TM, to control the following functions:

(1) Control and monitor PDR TM hardware
(2) Time keeping and internal framing
(3) Power and energy calculation
(4) Determination of maximum demand
(5) Serial communications
(6) Display signal handling
(7) External control signal processing of:
   (a) Customer alert
   (b) Load Control
   (c) End of demand interval
   (d) Pulse generation

I OPERATING MODES

PDR TM has three basic operating modes, startup, normal, and power fail. The object of each operating mode is to calculate and maintain the proper demand and energy information within the meter. In this section, the main functions performed in each of the three operating modes will be outlined. Each function represents a process that takes place within the PDR TM's central processing unit.

(A) During startup, (see 701 of FIG. 7) the PDR TM must restore the status of all demand and energy registers, calculate values for the energy and power constants, and initialize the timing routines. Below is a more detailed outline of the startup operations.

PDR TM begins its startup routine by initiating all CPU registers and PDR TM hardware. The CPU will then restore the status of the meter parameters, code numbers, the demand and energy registers as well as various status registers within PDR TM. After completion of this stage, the PDR TM will have virtually the identical data in its internal registers as it had just prior to the previous power fail. The CPU then performs eight diagnostic tests to determine if some error condition exists. Error conditions include, zeros in all meter constant locations, zeros in all transformer factor locations, or a frequency not equal to 50 or 60 Hz. PDR TM will recover from an erroneous startup by placing default values into the corrupt registers.

The PDR TM will calculate the values of the power and energy constants according to the meter parameters within the PDR TM.

Upon completion of $C_p$ and $C_E$ calculation, the PDR TM will set up its internal timer for either 50 HZ or 60 HZ operation. This setup is dependent on the programmed value for frequency. Serial communication in PDR TM is tied in directly to the timing clock; therefore, the setting up of the system timing also sets up the proper serial port operation. The system interrupts are then enabled and PDR TM begins operating in the normal mode.

(B) During the normal operating mode (see 702 through 711 in FIG. 7), the central processing unit within PDR TM must keep relative real time, calculate energy, segment the demand information, determine the maximum demand for the billing period, maintain the display information, control relay outputs, handle serial communications as needed, and more. Below is an outline of all functions as they are performed in the normal operating mode.

Figure 7:
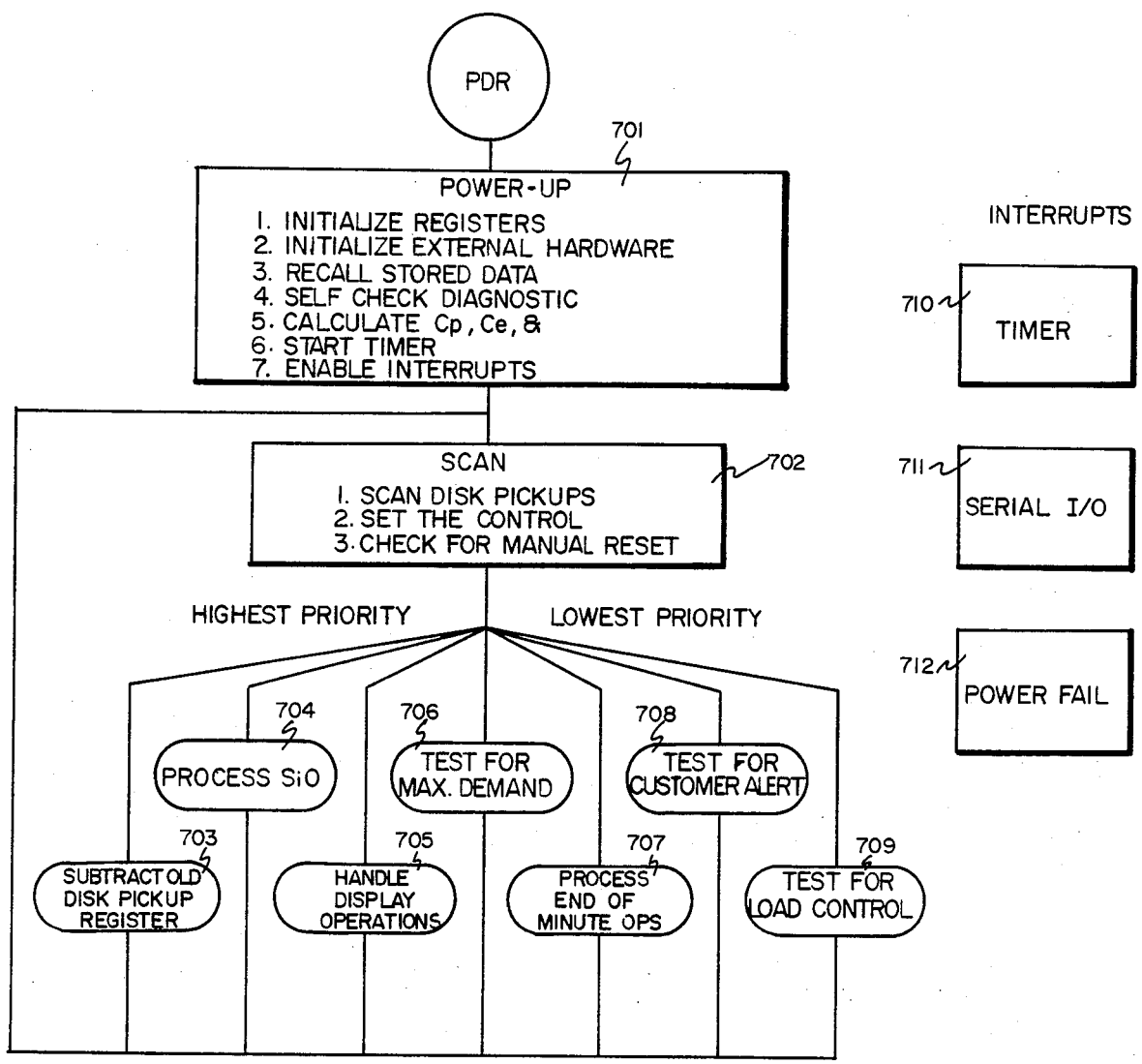
FIG. 7 is an operative description of PDR TM function.
Figure 14:
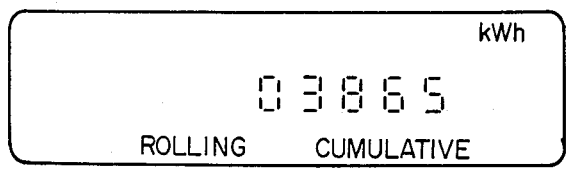
Figure 15:
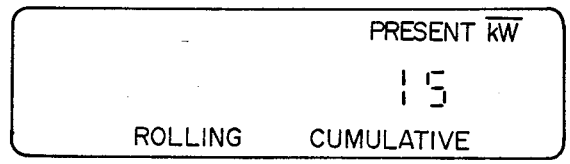
Figure 16:
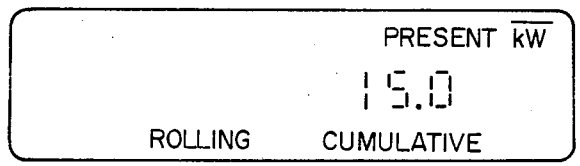
Figure 17:
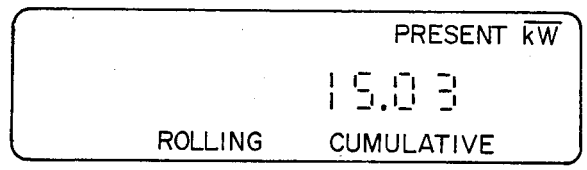
Figure 18:
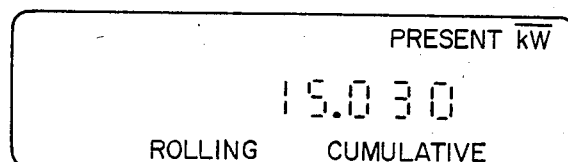
Figure 19:
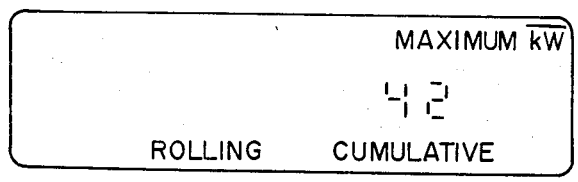
Figure 20:
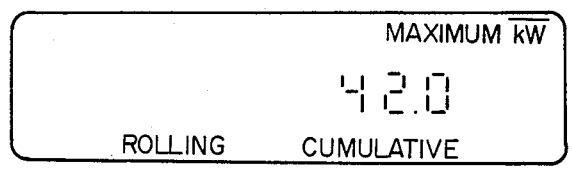
Figure 21:
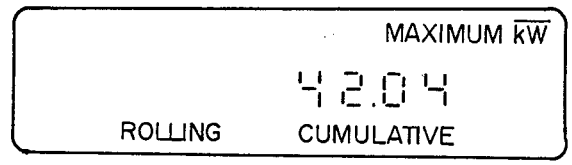
Figure 22:
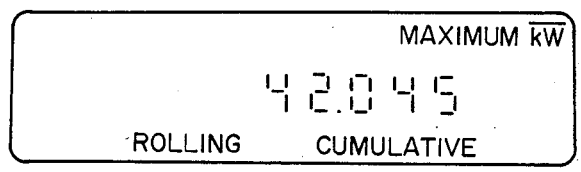
Figure 23:
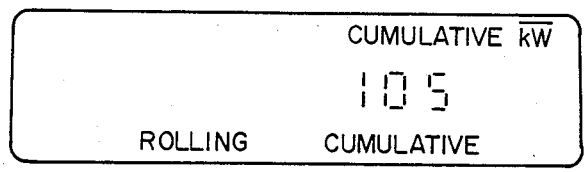
Figure 24:
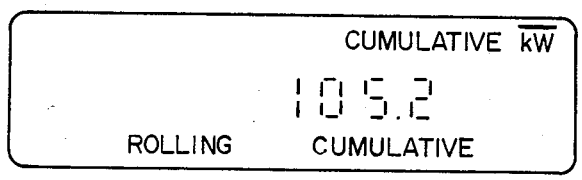
Figure 25:
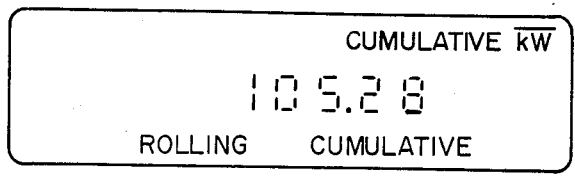
Figure 26:
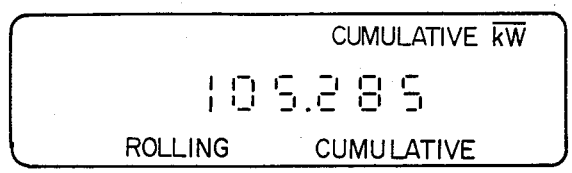

During the normal operating mode, the PDR TM must keep time and segment the power information for the correct calculation of demand (710 of FIG. 7). Time keeping, within PDR TM, is based on the incoming line frequency. The demand information is segmented by accumulating the number of disk rotations every minute. The resultant average demand for a particular minute is stored in a non-volatile ram for use in calculating demand. Boxes 703 and 707 in FIG. 7 depict the areas in the system software in which the demand information is manipulated every minute. In the event of a power fail, this information is used to initialize the demand registers correctly. In PDR TM, demand can be calculated in two ways, using either a block or a rolling block demand interval. An explanation of each type of demand interval is given hereafter under "Segmentation of demand information in PDR TM". The time keeping section of PDR TM is also responsible for the production of the end of demand interval indication. At the end of a demand interval, the "end of demand interval" annunciator will illuminate for 16 seconds and the end of demand interval relay contact will become closed for 16 seconds. The timing routine also handles the activity indicator, L & G logo, is made to change states (on/off) every second. The state change of the activity indicator takes place during PDR TM's time keeping routine. The proper activity indication is a sign that indicates that the PDR TM is operating correctly in the normal mode.

Figure 8:
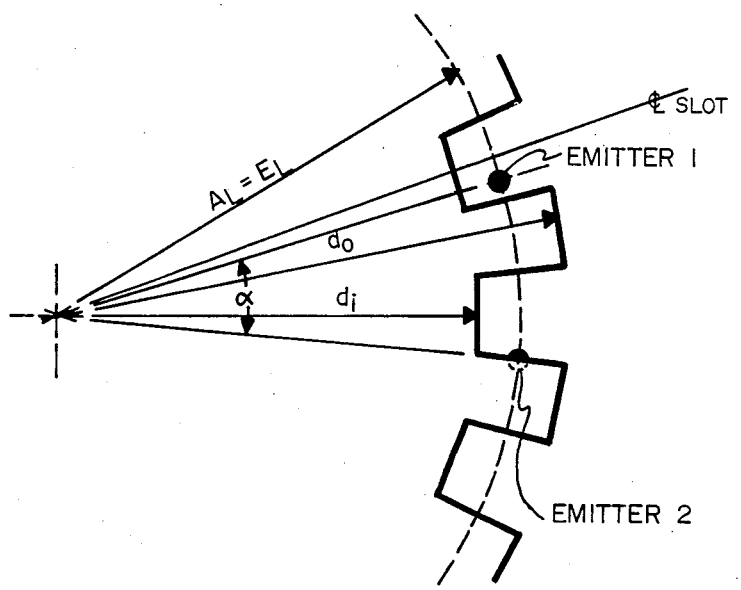
FIG. 8 is a chart showing the parameters for PDR TM disk pick-up design.

Power and energy information is calculated by detecting disk rotation. Box 702 of FIG. 7 represents the highest priority routine in the main program loop, the SCAN routine. The SCAN routine sends pulses to the disk pick-up circuit 50 (FIG. 1) to determine the status of the shutter disk (FIG. 8) with respect to the emitter/detector pairs 501, 502, 503 and 504 (shown in FIG. 4). Changes in status are detected as either forward, reverse, or erroneous rotation. The energy used by the meter is recorded by a single disk pick-up which is shown in various rotational positions in FIGS. 81, 82, 83 and 84. This disk is mounted in a conventional manner and determined in response to the electromagnetic conditions generated in the meter coils by virtue of the energy and power flow through the meter. Conversion of disk rotation into power or energy information is done by adding the power and energy registers every time a total revolution is detected.

The design parameters for the number and location of disk slots (shown as 1 through 10 in FIG. 81) are set forth below.

Figure 81:
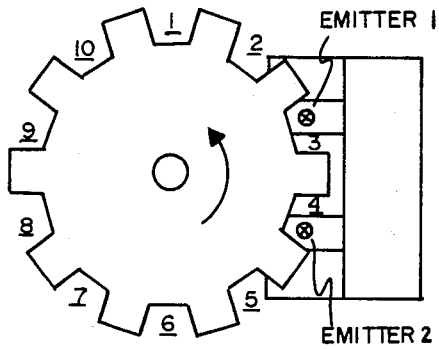
FIGS. 81 through 84 are diagramattic representations of the pick-up disk of the PDR ™ showing the four discrete positions respecting the emitters.
Figure 82:
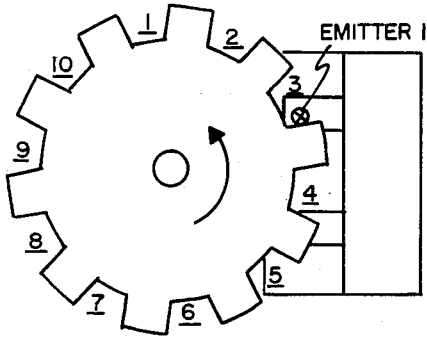
Figure 83:
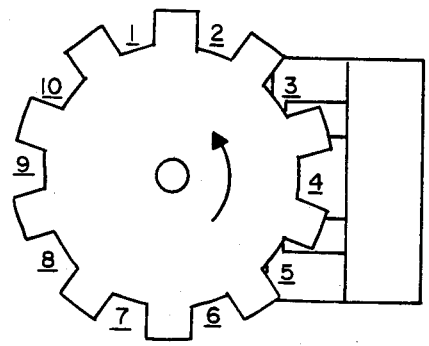
Figure 84:
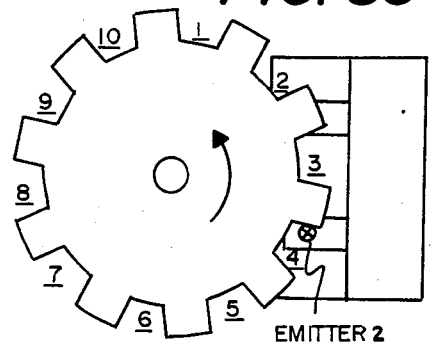

First, it should be appreciated that there are only 4 discrete states for the conditions of emitters #1 and #2 of the PDR TM, as shown in FIG. 81, which states are represented as a "1" in binary code when the emitter is clear, and an "0" when the emitter is obscured by the disk. These states are depicted in the following Table:

TABLE 1

| Emitter #1 | Emitter #2 |
|---|---|
| 1 | 1 |
| 1 | 0 |
| 0 | 0 |
| 0 | 1 |

In order to obtain these states in a discrete manner, the slot spacing and the number of slots is critical. In the example shown, namely using a disk with 10 slots, each slot takes up 1/10 of the disk arc, or 36°. Since each slot has four discrete states (00, 01, 10, 11) the ideal spacing for each of the slots would be ¼ of 36°. The general case for disc spacing would be:

$$360/4 \; slots = 90/x$$

(where "x" is the number of slots)

In a particular meter it may be convenient to use anywhere from 1 to $N_s$ shutter slots. Generally speaking, the fewer the slots the smaller the disk required, so it is largely a matter of design as to slot number. For proper device function, namely attainment of the 4 discrete states set out in Table 1, as portrayed in FIGS. 81, 82, 83 and 84, the shutter aperture location ($A_L$) must be properly positioned with respect to the encoder, emitter and receiver locations (collectively called $E_L$), namely $A_L$ must geometrically overlap $E_L$. This relationship is shown in FIG. 85 wherein $d_o$ = the outside edge of the shutter, $d_i$ is the inside edge of the shutter, and $N_s$ is the number of shutter slots and the proper overlapping is achieved by satisfaction of the expressions:

$$A_L = \frac{1}{2}\left[\frac{d_o - d_i}{2} + d_i\right]$$

$$\alpha = 4.5 \; N_s$$

It should be appreciated that the mechanical parameters, $d_o$ and $d_i$, are subject to the overall electronic constraints of the meter and, even though the 10 slot configuration shown is optimum for the parameters of the PDR TM proposed, the design configuration shown that attains discrete separation of 4 positions per slot will not always require 10 slots.

The maximum demand in a billing period is determined by comparing the present demand register with the maximum demand register, FIG. 7, box 706. If the present demand is greater than the maximum demand, then the maximum demand is updated to equal the present demand. This process is handled almost immediately after the present demand becomes larger than the maximum demand. Therefore, the maximum demand can be seen to follow the present demand as the present demand climbs through the maximum demand value.

The pulse generator circuitry is activated according to the rotation of the disk and the programmed value of MP. Pulse generator circuitry will change states every time the disk rotates "MP" times, i.e., if the PDR TM has a programmed MP value of 1.5, then the pulse generator circuitry would change states every time the disk made 1.5 revolutions.

The serial communication functions in PDR TM, boxes 704 and 711, are performed as called for by a programmer/reader or one of the BPR's. In the normal operating mode, the PDR TM is constantly "looking" for a serial communicating device. If no device is detected, then no action will be taken by PDR TM. If a device is detected, then action will be performed according to the communication that takes place. Note, if the PDR TM detects a reflection on its serial I/O port, the action will be treated as a "display activate" and the central processing unit will switch the LCD to the next display sequence.

The status of the customer alert relay is determined by the status of the customer alert bit in the "register type" register and by comparing the present demand register with the alarm on preset register, box 708, FIG. 7. If the present demand is greater than the alarm on preset and the customer alert bit is set then the customer alert relay will be switched to the "on" state. The customer alert relay will remain in the "on" state until either of the two conditions are false or a power fail occurs.

The status of the load control relay is determined by the status of the load control bit in the "register type" register and by comparing the present demand register with the load off preset register, box 709, FIG. 7. If the present demand is greater than the load off preset and the load control bit is set then the load control relay will be switched to the "on" state. The load control relay will remain in the "on" state until either of the two conditions are false or a power fail occurs.

Display information in PDR TM is updated every 250 milliseconds (about θ second), box 705, FIG. 7. The display is updated by moving the proper display information to the display area within the central processing unit.

(C) Power Fail

Figure 5:
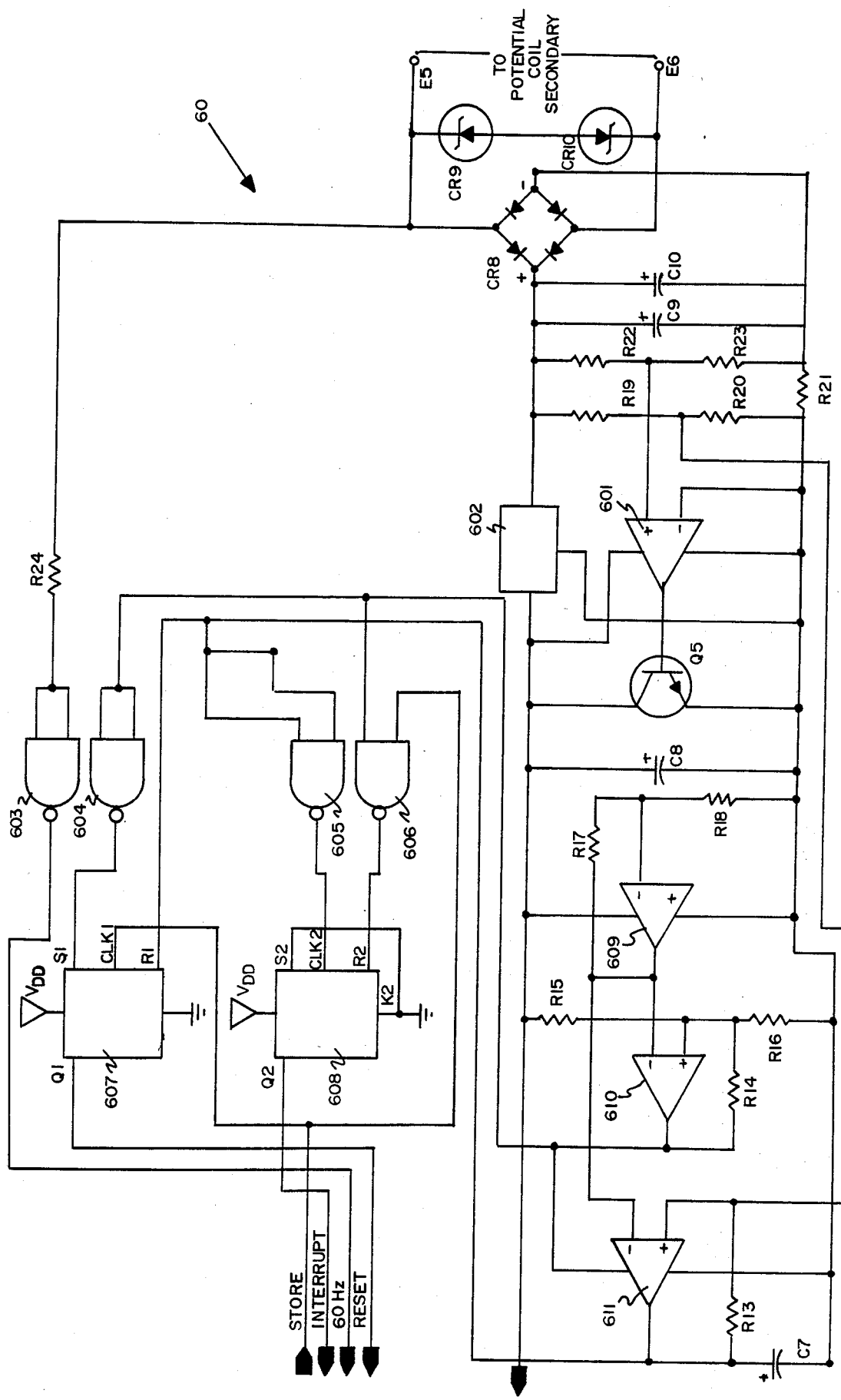
FIG. 5 is a schematic diagram of the power supply.
Figure 6:
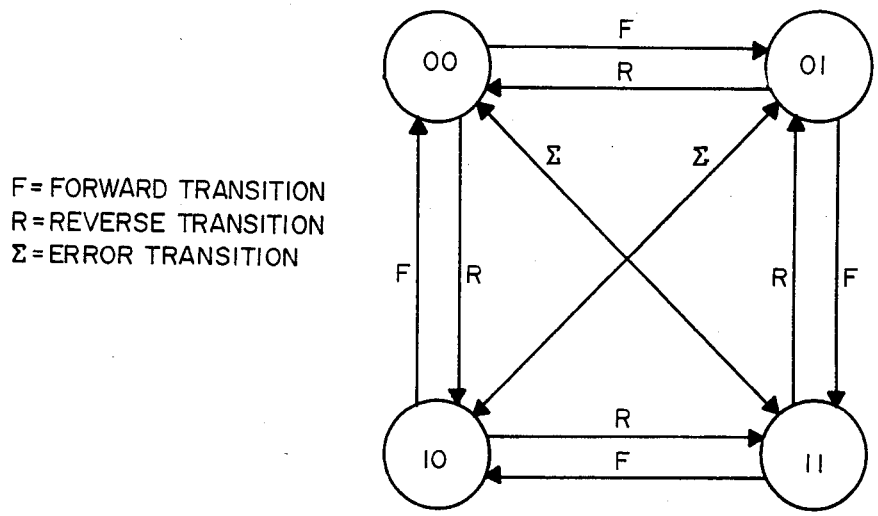
FIG. 6 is a graph showing the code output for various meter disk rotation transitions.

In PDR TM, a power fail is generated any time the line voltage drops below approximately 80% of its rated value for more than 120 milliseconds. After a power fail is detected, the PDR TM immediately enters the power fail mode of operation, box 712, FIG. 7. The purpose of the power fail operating mode is to prepare the PDR TM for the time when power is once again detected. PDR TM wil not enter the startup mode until the voltage has recovered to approximately 90% of its rated value. The PDR TM must prepare for the event power returns to the line immediately. This is handled by the hardware on the PDR TM circuit board (FIG. 5). The central processing unit will not enter the power up mode until all the power fail operations have been completed. All excess hardware is turned off. The serial I/O port and the control relay circuitry is disabled. All unnecessary hardware will remain inactive until the completion of the "startup" routine after power is again detected. The power fail counter is incremented. In the event the meter should accumulate more than 9999 power fails, the power fail register will "roll over" to 0000. All registers that are important to the proper calculation of energy and demand are stored in the non-volatile ram. All registers that are not important to PDR TM's operation are not saved. An example of an unimportant register is the display sequence number register, i.e., after a power fail, the display will always begin in the base (logo flash only) display sequence.

II SERIAL COMMUNICATIONS

Figure 59:
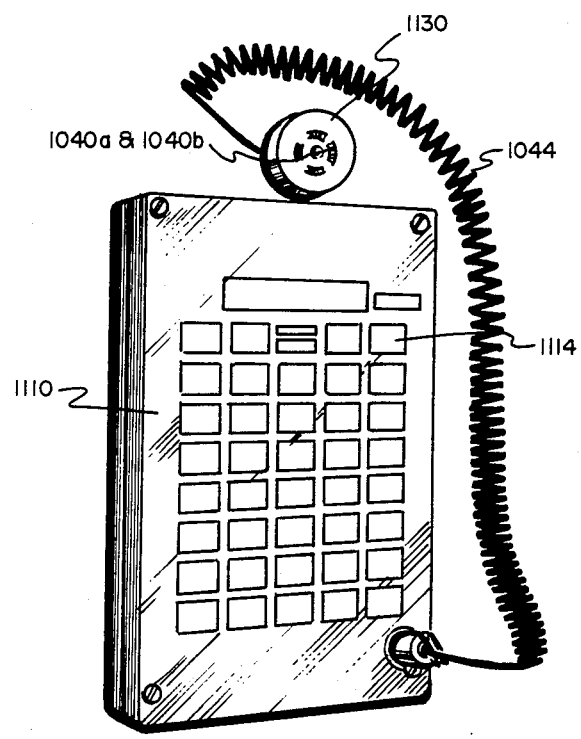
FIG. 59 is a perspective view of the P/R.
Figure 60:
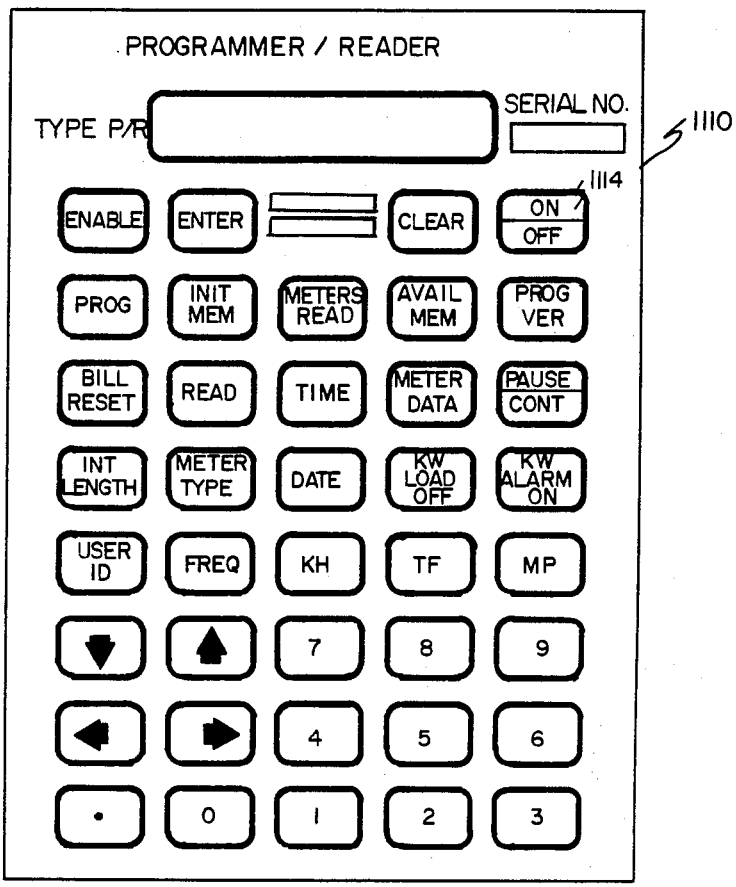
FIG. 60 is a top plan view of the P/R showing its keyboard.
Figure 67:
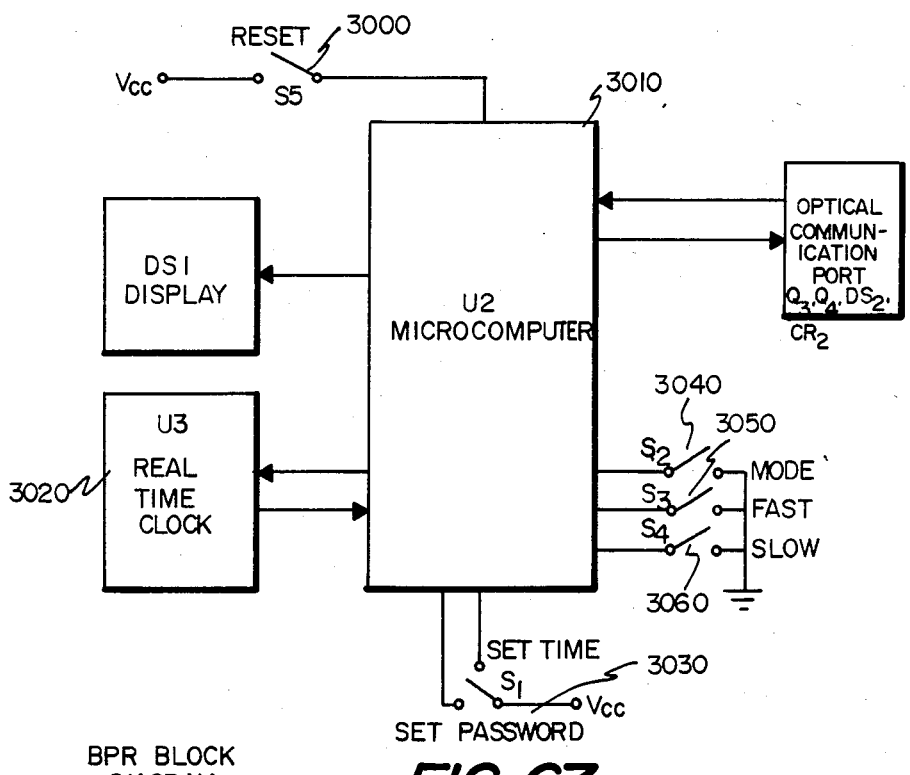
FIG. 67 is a block diagram for the BPR.
Figure 61:
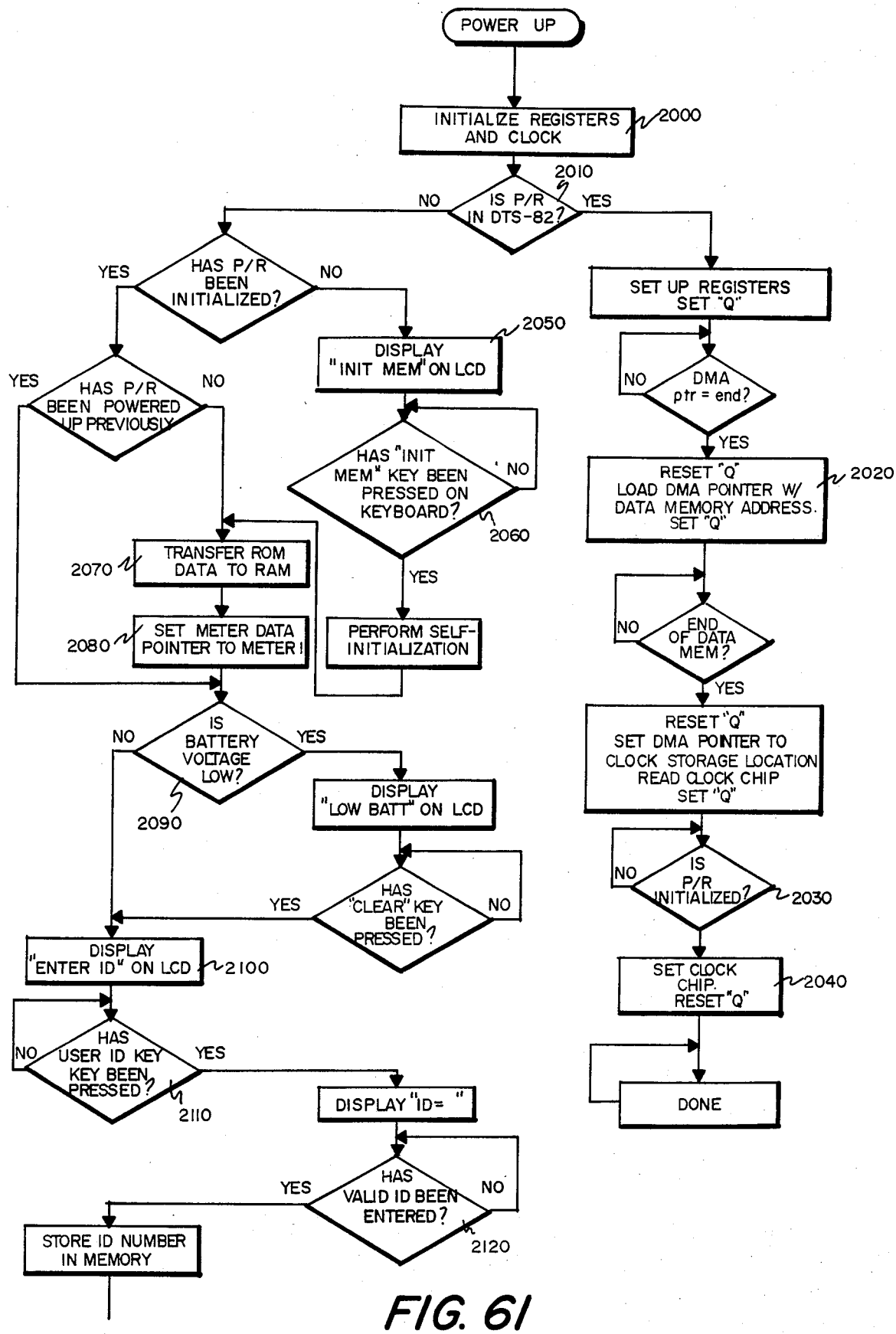
FIGS. 61 through 65 are operational flow charts for the P/R.
Figure 62:
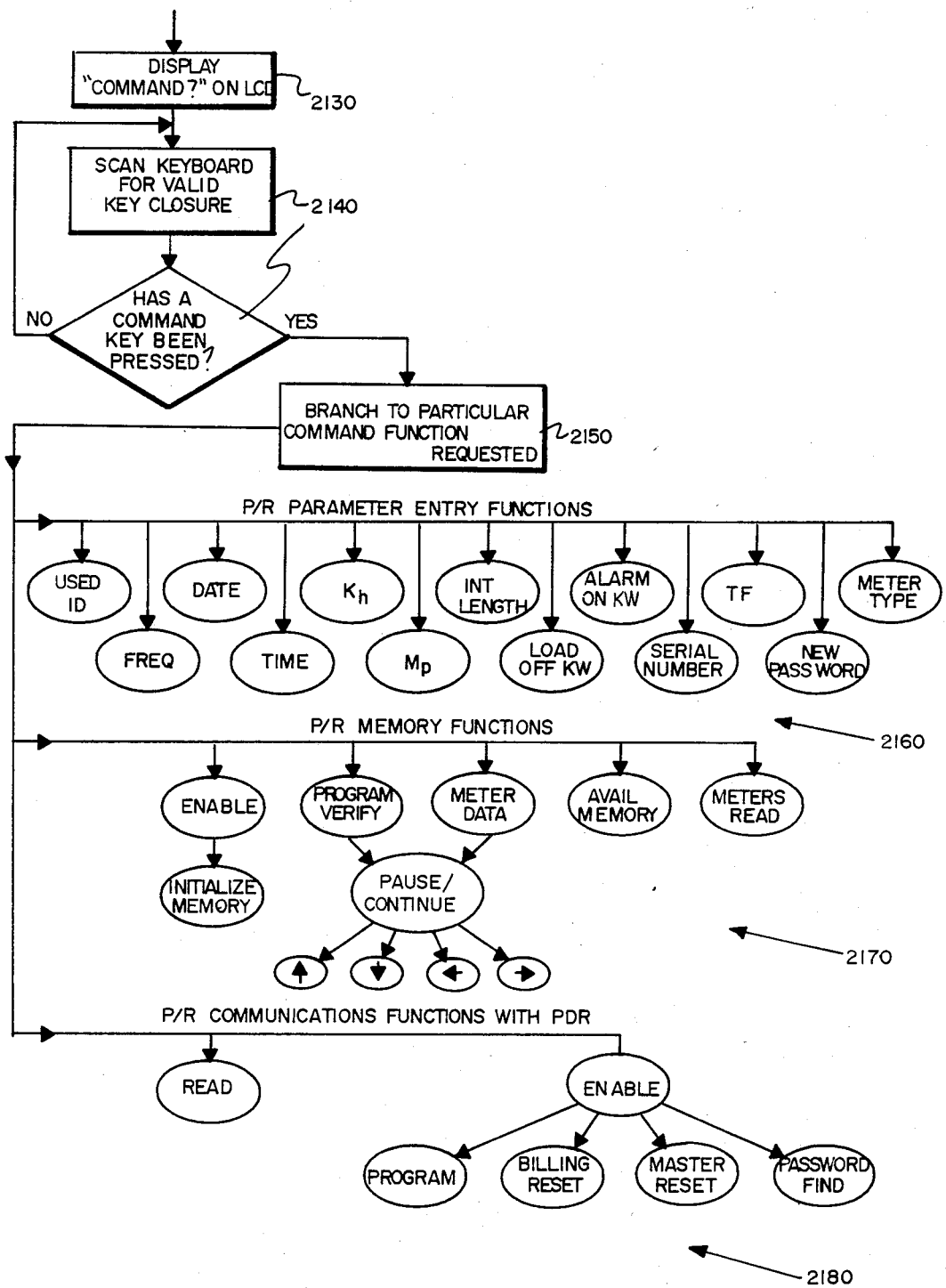
Figure 63:
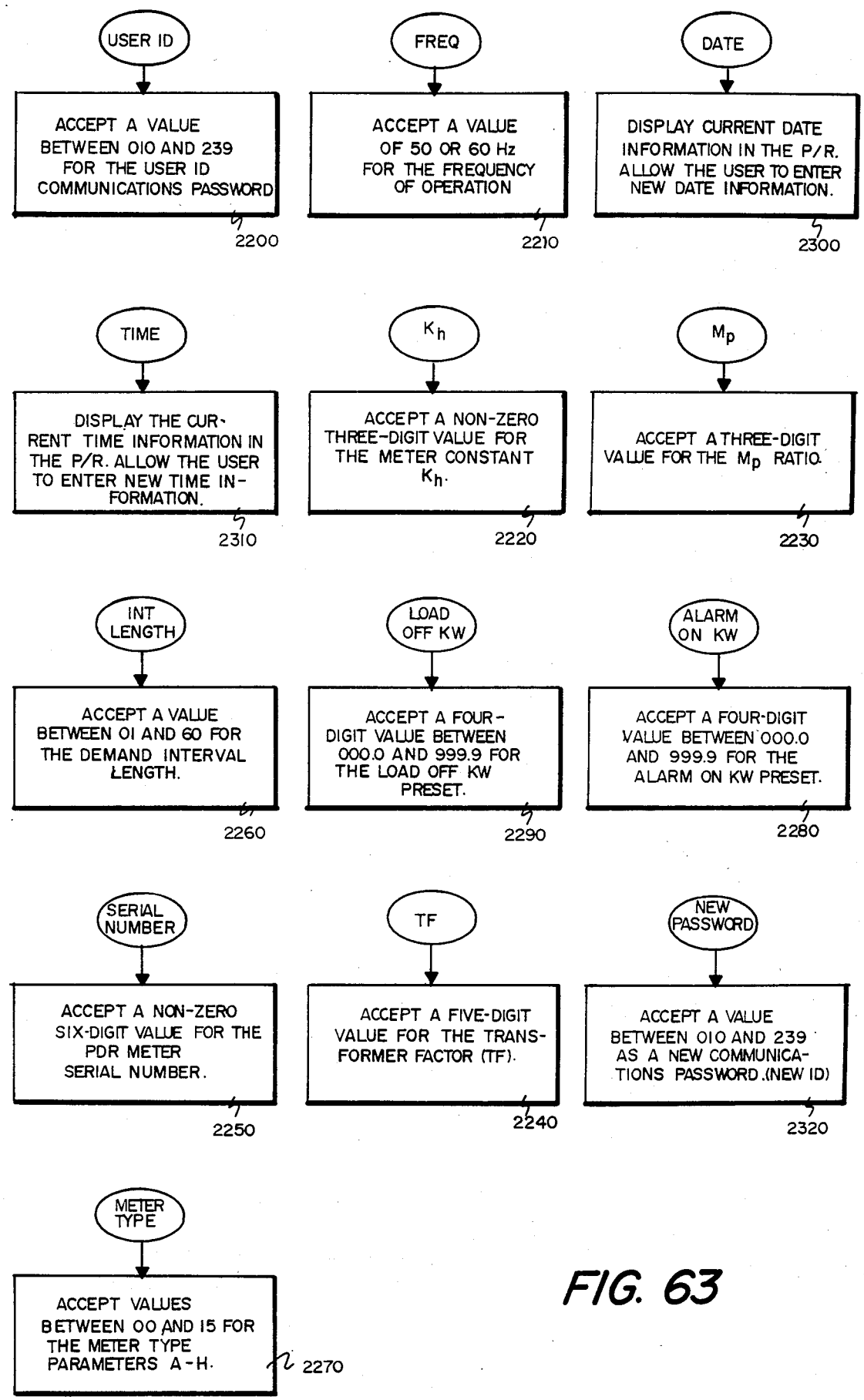
Figure 64:
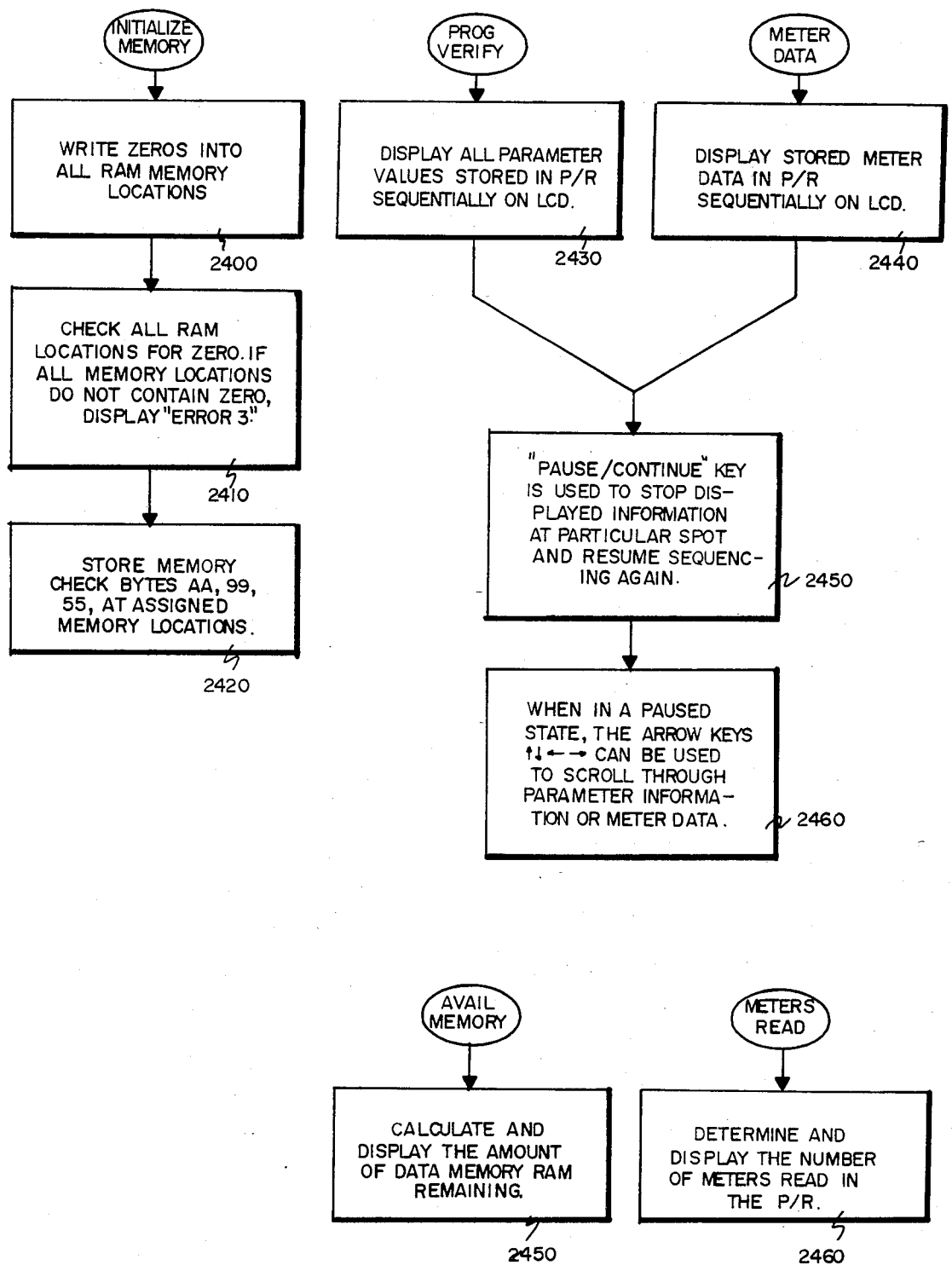
Figure 65:
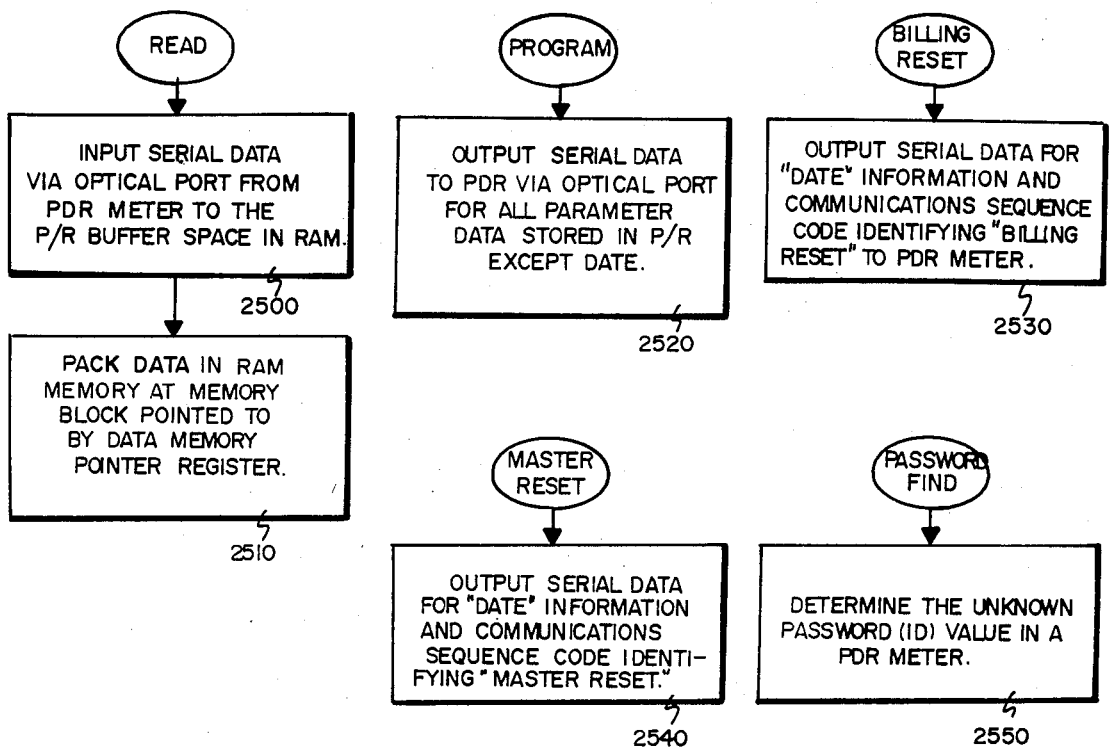
Figure 78:
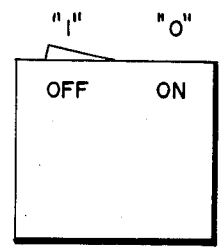
FIG. 78 is a diagrammatic showing of a side view of a switch shown in FIG. 77.
Figure 79:
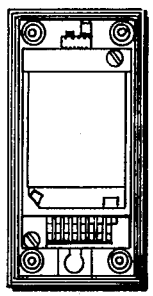
FIG. 79 is a top view of the BPR-1 with its cover removed.
Figure 80:
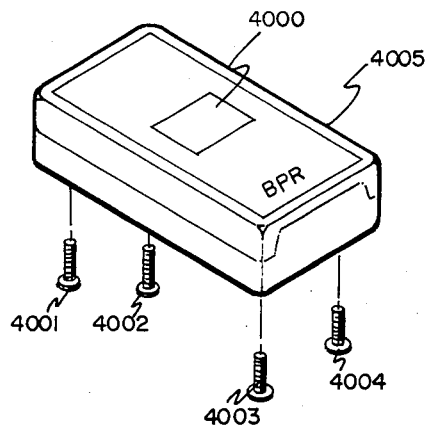
FIG. 80 is a perspective view of the cover of the BPR-1.

Serial communication is performed with the use of P/R TM, BPR, or BPR-1. Using various commands, the PDR TM can be billing reset, master reset, programmed, and or read. The serial communication protocol is designed with a redundant check on all data sent between the PDR TM and the communicating device. This greatly minimizes the possibility of erroneous reading or programming. In addition to the redundant check, the PDR TM also requires that the communicating device send a "password" that is used as an electronic key for entry into any communicating function. The password has a range from 16 to 255. Note that when programming the password into PDR TM, values below 16 are avoided for functional reasons. Communication is performed via PDR TM's optical port (FIG. 2) and the optical port in the P/R wand shown in FIG. 59 or the optical port in either the BPR (FIG. 67) or BPR-1 (FIG. 78). The P/R and BPR's will be more fully described hereinafter.

(A) Billing Reset Function

When a billing reset is performed with either a P/R, a BPR, a BPR-1, or mechanically, the following functions are performed in the PDR TM.

1. The "reset" annunciator becomes activated on the liquid crystal display for a total of 16 seconds. During this time, further reset attempts are rejected to avoid possible problems with multiple resets.
2. If the cumulative demand bit is set in the "register type" register, then the maximum demand will be added to the cumulative demand.
3. The maximum demand is then reset to zero. Note that in cases where the present demand is greater than zero, the maximum demand will not stay at zero.
4. The billing reset accumulator is incremented by one.
5. The date of reset is entered into the PDR TM according to the method of reset (see chart below).

| Method of Reset | Format of Date |
| --- | --- |
| P/R | 06-28-81 (actual date) |
| BPR | 06-28-81 (actual date) |
| BPR-1 | 88-88-88 (pseudo date) |
| Mechanical | 00-00-00 (null date) |

(B) Master Reset Function

A master reset may be performed only with a P/R. When a master reset is performed, the following functions are performed in the PDR TM.

1. Energy (KWH) is reset to zero.
2. Present demand is reset to zero.
3. Maximum demand is reset to zero.
4. Cumulative demand is reset to zero.
5. The billing reset accumulator is reset to zero.
6. The date of the master reset is entered into the "date of last reset" register.

(C) Program Function

The PDR TM can be programmed only with the P/R. When the PDR TM is programmed, the meter parameters, register type, and the serial number are all entered into the PDR TM from the P/R. Once normal operation begins, the "programmed" annunciator will become activated on the liquid crystal display for a total of 16 seconds. During this time, further program attempts are not rejected. The P/R sends program information to the PDR TM at 472 bits per second. The program information is broken into three basic blocks of data, namely, type and serial number, preset values, and meter parameters. Below is a breakdown of the actions taken with the programming of each block of data.

When register type and serial number are programmed into the meter, the following functions are performed in the PDR TM:

1. The display sequence will change or not change in accordance with the data sent in the register type bits.
2. Customer alert, load control, the electronic detent (negative disk rotation), display time out, and the cumulative demand register will immediately begin to respond to the new register type bits.

3. When the register type bit that is used to set the meter into a rolling or a block interval is changed, the present demand along with all the previous demand segments are reset to zero. This is done to assure the proper transition from either a rolling interval to a block interval or vice versa. The PDR TM will now be operating in accordance with all the register type bits.

4. The meter serial number is changed according to the new serial number data sent. When the preset values are programmed into the PDR TM, the PDR TM takes action on the programmed values immediately. This means that the PDR TM will set or reset the control relays according to the new presets. At the end of this block of programming, the P/R also sends a new password. The PDR TM enters the new password immediately and will now reject any serial communications device that does not support the new password. The following functions are performed in the PDR TM when the preset values are programmed.

1. The "alarm on" preset value is altered in the PDR TM according to the "alarm on" data sent for the P/R.

2. In "load off" preset value is altered in the PDR TM according to the "load off" data sent for the P/R.

3. The password data is altered in the PDR TM according to the "password" data sent from the P/R.

When the meter parameters are programmed, the PDR TM meter values for KH ratio, demand interval length, frequency, MP ratio, and transformer factor, are changed in accordance with the meter data sent from the P/R. Upon completion of this transmission, the PDR TM will re-enter the initialization routine to restart the CPU with the newly sent data. When the initialization routine is complete, the PDR TM will begin to run in its normal mode.

When the meter parameters are programmed, the following functions are performed in the PDR TM:

1. The "KH" value, the demand interval length, the frequency, the "MP" ratio, and the transformer factor are altered in the PDR TM according to the respective meter data sent from the P/R.

2. The PDR TM will re-enter the initialization stage in which new values of CE and CP are calculated.

3. The normal mode of operation will then begin using all the newly programmed meter values.

4. The "programmed" annunciator will become illuminated for a period of 16 seconds.

(D) Read Function

The PDR TM may be read manually by scrolling through and tabulating the values of the various display sequences (described hereinafter), or by the read function of the P/R. During a read function, all pertinent PDR TM meter data are sent to the P/R. The PDR TM, P/R read function takes about 3 seconds to perform errorless communications. If for some reason, an error is detected by either the P/R or the PDR TM, the transmission sequence will be halted immediately and an error message will be displayed on the P/R. Upon completion of a successful read function, the read annunciator will become activated on the liquid crystal display for a total of 16 seconds. The following data are sent to the P/R from the PDR TM during the read function:

| Data # | Name | Mnemonic | Nibbles | Sample Data |
| --- | --- | --- | --- | --- |
| 1. | Power fails | PFC | 4 | 0016 |
| 2. | Energy | E | 11 | 0003865.1400 |
| 3. | MP ratio | MP | 3 | 01.0 |
| 4. | Transformer factor | TF | 5 | 00001 |
| 5. | Cumulative demand | PCUM | 8 | 0105.2850 |
| 6. | Meter constant | KH | 3 | 07.2 |
| 7. | Serial number | SN | 6 | 123456 |
| 8. | Date of last reset | DATE | 6 | 06-28-81 |
| 9. | Billing resets | BR | 3 | 014 |
| 10. | Load off preset | LOFF | 4 | 030.0 |
| 11. | Alarm on preset | AON | 4 | 025.0 |
| 12. | Maximum demand | PMAX | 7 | 042.0450 |
| 13. | Present demand | PRES | 7 | 015.0300 |
| 14. | Demand interval length | T | 2 | 05 |
| 15. | Frequency | FREQ | 2 | 60 |
| 16. | Register type | TYPE | 8 | FFE7634F |

III DISPLAY SEQUENCES & OVERRIDE ANNUNCIATORS

Information is displayed in the PDR TM via 22 basic display sequences and 10 override annunciators. In PDR TM, a display sequence refers to that information that is displayed on the liquid crystal display 90 (FIG. 1) at any one instant. An override annunciator is information which becomes illuminated according to various conditions within PDR TM. The PDR TM will scroll through to the next display sequence each time a reflection is detected on the optical port 92 (FIG. 2). This action is known as a "display activate" and it can be performed by placing a shiny object over the port. To obtain a second display activate, the object must first be removed from in front of the optical port and then placed there again. Throughout this section, the digits of the LCD will be referred to by their respective positions on the LCD, i.e., the right most digit of the LCD will be referred to as digit one or D1, the digit just to the left of D1 will be digit two or D2. This will continue until reaching the left most digit of the display, digit eight or D8. The 22 display sequences and 10 override annunciators are described from both an appearance and functional definition standpoint. The display sequences are broken down into three basic categories, namely, standard, meter parameter, and code number display sequences. The override annunciators are described according to their basic function. For example, SIO status indicators inform the viewer of the LCD about the present status of any serial communication.

(A) Standard Display Sequences and Definitions

In PDR TM, standard display sequences are those that indicate standard useful information that has been generated by the PDR TM (FIGS. 9 through 26), such as energy, present demand, maximum demand and cumulative demand. Also included in this group are the "base" display sequence and the "segment test" display sequence. Other than the base and segment check display sequences, the standard display sequences have specific annunciators that are used to aid in the identification of each display sequence, i.e., energy is identified by the "KWH" annunciator which becomes illuminated during the energy display sequence.

During a "logo flash only" display sequence (FIG. 9), all digit segments and indicating annunciators are off with the exception of the logo and the override annunciators. The logo will change states every second indicating that the PDR TM is operating in the "normal mode". The override annunciators will illuminate according to the present status of the PDR TM (see FIGS. 43 through 47). The logo flash only display sequence is used as the "base display sequence" in PDR TM. When PDR TM obtains power for the first time or after a power failure, the LCD will begin in the logo flash only display sequence. "Logo flash only" is the only display sequence that is not able to be disabled in the "register type" register.

During the "segment check" display sequence (FIG. 10), all digit segments and indicating annunciators are illuminated with the exception of the logo. The logo will continue to change states every second indicating normal mode operation. The "segment check" display sequence is used to check the operation of the LCD and its associated circuitry. If a segment (any annunciator or digit) is not illuminated during this display sequence, then a problem exists either with PDR TM's central processing unit, the LCD connection, or the LCD itself.

During the "energy display" sequence, the annunciator for kilowatthours "KWH" will be illuminated. The accumulated energy will be displayed according to the energy display mode set in the "register type" register. For readability on modes 0, 1 and 2 (FIGS. 11, 12 and 13 respectively), leading zeros down to the "ones" digit are not displayed in a mode 3 (FIG. 14), the energy is displayed using the first five digits left of the decimal point with no clipping of leading zeros. The mode indicators will be illuminated according to the status of the "rolling" and the "cumulative" bits in the "register type" register. The logo will change states every second indicating the normal operating mode. Although the energy register has a resolution of one ten thousandths of a kilowatthour (+/−0.0001 KWH), the value for energy that is displayed during this display sequence will be truncated according to the energy display mode register described later herein, i.e., if this display sequence is enabled on a meter with an accumulation of 0003865.1400 KWH, the display will appear as shown in FIGS. 11 through 14. "Energy" is an eleven digit register within the PDR TM that is used to indicate the total amount of energy a particular meter has accumulated. The energy register is updated each time the disk makes a complete revolution. For a disk moving in the negative direction, the energy will or will not be updated according to the status of the "disk rotation" bit in the "register type" register. The energy register in PDR TM has a resolution of +/−0.0001 KWH.

During the "present demand" display sequence, the annunciator for present demand "present KW" will be illuminated. The present demand will be displayed according to the demand display mode bits of the "register type" register. For readability, leading zeros down to the "ones" digit are not displayed. The mode indicators will be illuminated according to the status of the "rolling" and the "cumulative" bits in the "register type" register (shown in FIG. 43). The logo will change states every second indicating the normal operating mode. Although the present demand register has a resolution of one ten thousandths of a kilowatt (+/−0.0001 KW), the value for present demand that is displayed during this display sequence will be truncated according to the demand display mode register, i.e., if this display sequence is enabled on a meter with a present demand of 015.0300 KW, then the display will appear as shown in FIGS. 15, 16, 17 and 18. "Present demand" is a seven digit register within the PDR TM that is used to indicate the average kilowatts used in the present demand interval. The present demand register is updated each time the disk makes a complete forward revolution. In PDR TM, negative demand is not defined and negative disk rotation is ignored by PDR TM's demand registers. The present demand register in PDR TM has a resolution of +/−0.0001 KW.

During the "maximum demand" display sequence, the annunciator for maximum demand "maximum KW" will be illuminated. The maximum demand will be displayed according to the demand mode bits in the "register type" register. For readability, leading zeros down to the "ones" digit are not displayed. The mode indicators will be illuminated according to the status of the "rolling" and the "cumulative" bits in the "register type" register. The logo will change states every second indicating the normal operating mode. Note, although the maximum demand register has a resolution of one ten thousandths of a kilowatt (+/−0.0001 KW), the value for maximum demand that is displayed during this display sequence will be truncated according to the demand display register, i.e., if this display sequence is enabled on a meter with a maximum demand of 042.0450 KW, then the display will appear as shown in FIGS. 19, 20, 21 and 22. "Maximum demand" is a seven digit register within the PDR TM that is used to indicate the maximum demand that a particular meter has encountered in a billing period. The maximum demand register is updated each time the present demand register exceeds the maximum demand register. During a billing reset function the maximum demand register will be reset to zero. If the present demand is not zero at the time of the billing reset, the maximum demand register will be updated to read the new maximum demand. The maximum demand register will be updated to read the new maximum demand. The maximum demand register in PDR TM has a resolution of +/−0.0001 KW.

During the "cumulative demand" display sequence, the annunciator for cumulative demand "cumulative KW" will be illuminated. The cumulative demand will be displayed according to the demand display mode bits of the "register type" register. For readability, leading zeros down to the "ones" digit are not displayed. The mode indicators will be illuminated according to the status of the "rolling" and the "cumulative" bits in the "register type" register. The logo will change states every second indicating the normal operating mode. Although the cumulative demand register has a resolution of one ten thousandths of a kilowatt (+/−0.0001 KW), the value for cumulative demand that is displayed during this display sequence will be truncated according to the demand display register, i.e., if this display sequence is enabled on a meter with a cumulative demand of 0105.2580 KW, then the display will appear as shown in FIGS. 23, 24, 25 and 26. "Cumulative demand" is an eight digit register within the PDR TM that is used to indicate the sum of the previous maximum demand readings prior to the execution of the billing reset function. The cumulative demand register is updated each time a billing reset function is performed and, depending on the status of the cumulative demand, demand resolution bits of the "register type" register. The cumulative demand register in PDR TM has a resolution of +/−0.0001 KW.

(B) Meter Parameter Display Sequences and Definitions

In PDR ™, meter parameters (FIGS. 27 through 33) are data stored within PDR ™'s non-volatile memory that are used to determine the exact operation of PDR ™. The programmed preset values are also data stored within PDR ™'s non-volatile memory. These values are used as set points for PDR ™'s two external control relays. All these values are programmable with the use of a P/R.

Figure 27:
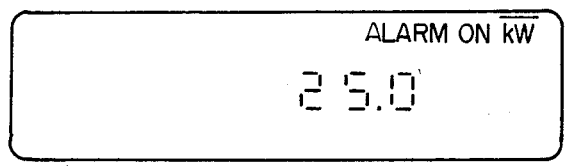

During the "alarm on preset" display sequence (FIG. 27), the annunciator for the alarm on preset "alarm on KW" will be illuminated. The logo will continue to change states every second indicating normal mode operation. The preset value for alarm on will be displayed using a "D4 D3 D2.D1" format. For readability, leading zeros down to digit two (D2) are not displayed, i.e., if this display sequence is enabled on a meter with an alarm on preset of 025.0 KW, then the display will appear as shown in FIG. 27. "Alarm on preset" is a four digit register within PDR ™ that is used as a set point for the setting and resetting of PDR ™'s customer alert relay. The contacts on the customer alert relay will be closed any time the present demand is greater than the alarm on preset and the "customer alert" bit in the "register type" register is set to 1. At all other times, the relay will be open circuit. The alarm on preset has a range from 000.0 KW to 999.9 KW.

Figure 28:
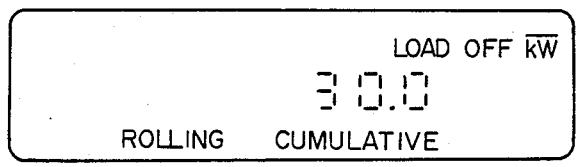

During the "load off preset" display sequence (FIG. 28), the annunciator for the load off preset "load off KW" will be illuminated. The logo will continue to change states every second indicating normal mode operation. The preset value for load off will be displayed using a "D4 D3 D2.D1" format. For readability, leading zeros down to digit two (D2) are not displayed, i.e., if this display sequence is enabled on a meter with a load off preset of 030.0 KW, then the display will appear as shown in FIG. 28. "Load off preset" is a four digit register within PDR ™ that is used as a set point for the setting and resetting of PDR ™'s load control relay. The contacts on this load control relay will be closed any time the present demand is greater that the load off preset and the "load control" bit in the "register type" register is set to 1. At all other times, the relay will be open circuit. The load off preset has a range from 000.0 KW to 999.9 KW.

Figure 29:
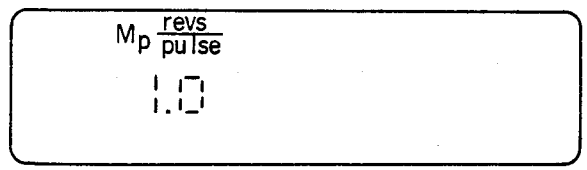

During the "MP ratio" display sequence (FIG. 29), the annunciator for the MP ratio "MP revs/pulse" will be illuminated. The logo will continue to change states every second indicating normal mode operation. The meter parameter "MP" will be displayed using a "D8 D7.D6" format. For readability, if digit eight (D8) is zero, then the parameter is shifted left and displayed using a "D8.D7" format, i.e., if this display sequence is enabled on a meter with an MP value of 01.0 revs/pulse, then the display will appear as shown in FIG. 29. "MP ratio" is a three digit register within PDR ™ that is used to determine the frequency of KY, KZ contact closures. The "MP" ratio is the number of revolutions the disk will make before the KY, KZ contact closures change state. The MP ratio is programmable from:

$$00.0 \frac{\text{revolutions}}{\text{pulse}} \text{ to } 99.9 \frac{\text{revolutions}}{\text{pulse}}$$

Figure 30:
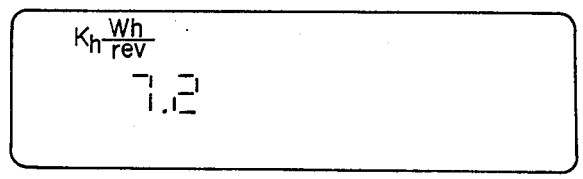

During the "meter constant" display sequence (FIG. 30), the annunciator for the meter constant "KH Wh/Rev" will be illuminated. The logo will continue to change states every second indicating normal mode operation. The meter constant "KH" will be displayed using a "D8 D7.D6" format. For readability, if digit eight (D8) is zero, then the constant is shifted left and displayed using a "D8.D7" format, i.e., if this display sequence is enabled on a meter with a programmed KH value of 07.2 Wh/Rev, then the display will appear as shown in FIG. 30. "KH" is the number of watthours represented by one revolution of the disk. In PDR ™, this value is stored in a 3 digit register and is programmable from:

$$00.1 \frac{\text{Watthours}}{\text{Revolutions}} \text{ To } 99.9 \frac{\text{Watthours}}{\text{Revolution}}$$

Figure 31:
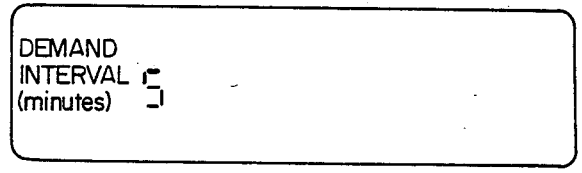

During the "Demand Interval Length" display sequence (FIG. 31), the annunciator "Demand interval (minutes)" will be illuminated. The logo will continue to change states every second indicating normal mode operation. The demand interval length meter parameter will be displayed using a "D8 D7" format. For readability, if digit eight (D8) is zero, then the parameter is shifted left and displayed using a "D8" format, i.e., if this display sequence is enabled on a meter with a demand interval length of 5 minutes, then the display will appear as shown in FIG. 31. "Demand interval length" is a two digit register within PDR ™ that is equal to the interval of time on which PDR ™ demand measurement is based. In PDR ™, the demand interval length has a range from 1 minute to 60 minutes inclusive.

Figure 32:
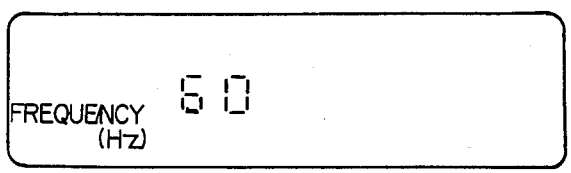

During the "frequency" display sequence (FIG. 32), the annunciator "frequency (HZ)" will be illuminated. The logo will continue to change states every second indicating normal mode operation. The frequency meter parameter will be displayed using a "D8 D7" format, i.e., if this display sequence is enabled on a meter running on a line frequency of 60 hertz, then the display will appear as shown in FIG. 32. In PDR ™, frequency is a two digit register used to set up the internal timer for interval framing. Values of 50 HZ or 60 HZ are allowed.

Figure 33:
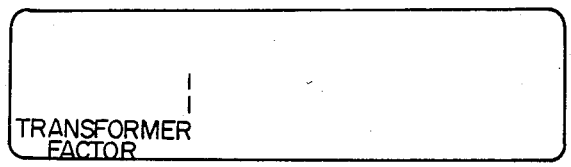

During the "transformer factor" display sequence (FIG. 33), the annunciator "transformer factor" will be illuminated. The logo will continue to change states every second indicating normal mode operation. The transformer factor meter paramemter will be displayed using a "D8 D7 D6 D5 D4" format. For readability, leading zero's are eliminated by shifting this number to the left until digit eight (D8) is no longer zero, i.e., if this display sequence is enabled on a meter with a transformer factor of 00001, then the display will appear as shown in FIG. 33. "Transformer factor" is a five digit register in PDR ™ that is used as a multiplier for the calculations of energy and demand. If the correct transformer factor is programmed into PDR ™ for a given application, then the PDR ™ will produce true values for energy and demand.

(C) Code Number Display Sequences and Definitions

In PDR ™, code number display sequences are used to indicate that information which does not have a specific annunciator assigned. Each of the previous 11 display sequences has a specific annunciator assigned to it for the ease of interpreting the information on the LCD. In general, the code number sequences can be easily identified by the annunciator "code #". Directly under this annunciator is digit eight of the LCD which is usually illuminated with the number that corresponds with the particular code number display sequence. There are, however, two exceptions to this rule. They are code number sequences 2 and 5. Both of these sequences use all eight digits of the display; therefore, to avoid confusion with any other code number sequence, the "code #" annunciator is left in the off state on these two sequences. The two sequences can be distinguished by the dashes used in the date of last reset (Code #2) to separate the month from the day and the day from the year. The register type display sequence (Code #5) does not have these dashes. For a visual representation of the above information, see the examples in FIGS. 34 through 42.

Figure 34:
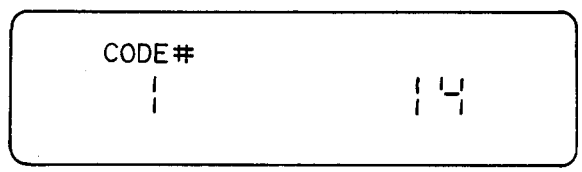

During the "billing resets" display sequence (FIG. 34), the annunciator "code #" will be illuminated. The left most digit of the display (D8) will be set to "1" indicating that this is the first code number sequence. The logo will continue to change states every second indicating that the PDR TM is operating in the normal mode. The number of billing resets will be displayed on the three right most digits (D3 D2 D1) of the display with the leading zero's of this number blanked for readability, i.e., this display sequence is enabled on a meter with 14 billing resets, the display will appear as shown in FIG. 34. "Billing resets" is a three digit register used by PDR TM to accumulate the total number of billing resets on a given meter. The number of billing resets will be incremented each time the PDR TM executes a billing reset function from a BPR, BPR-1, P/R, or mechanically. In the event the meter should accumulate more than 999 billing resets, the billing reset register will "roll over" to 000.

Figure 35:
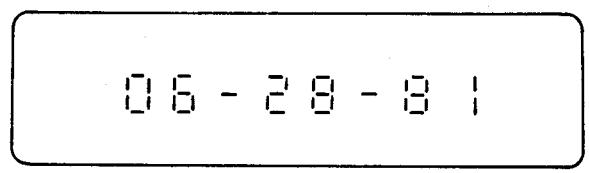

During the "last reset date" display sequence (FIG. 35), the annunciator "code #" is not illuminated. The logo will continue to change states every second indicating that the PDR TM is operating in the normal mode. The date of the last meter reset will be displayed using a "D8 D7 - D5 D4 - D2 D1" format, i.e., this display sequence is enabled on a meter with a last billing reset date of June 28, 1981, the display will appear as shown in FIG. 35. "Last reset date" is a six digit register within PDR TM which contains the date sent with the last billing reset. This date is dependent on the method in which the previous reset was performed, i.e., if the last billing reset was performed by a BPR-1, then the reset date will read "8 8 - 8 8 - 8 8".

Figure 36:
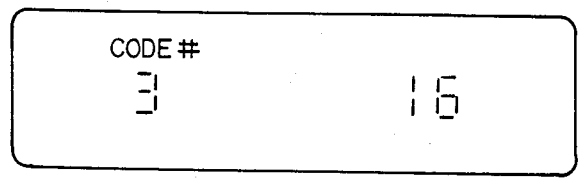

During the "Power fails" display sequence (FIG. 36), the annunciator "code #" will be illuminated. The left most digit of the display (D8) will be set to "3" indicating that this is the third code number sequence. The logo will continue to change states every second indicating that the PDR TM is operating in the normal mode. The number of power fails will be displayed on the four right most digits (D4 D3 D2 D1) of the display with the leading zero's of this number blanked for readability, i.e., if this display sequence is enabled on a meter with 16 power fails, the display will appear as shown in FIG. 36. "Power fails" is a four digit register used by PDR TM to accumulate the total number of power fails on that particular meter. In PDR TM, a power fail is generated any time the line voltage drops below approximately 80% of its rated value for more than 120 milliseconds. The PDR TM will not begin to run until the voltage has recovered to approximately 90% of its rated value. This reduces the possibility of having a meter cycle in and out of power fail operation. In the event the meter should accumulate more than 9999 power fails, the power fail register will "roll over" to 0000.

Figure 37:
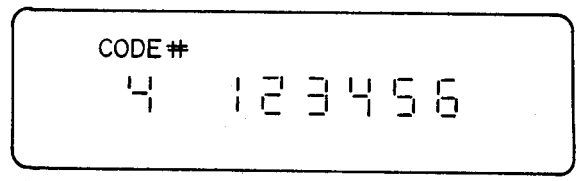
Figure 44:
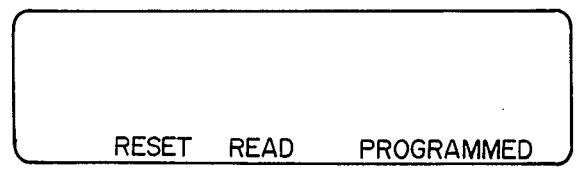

During the "Serial number" display sequence (FIG. 37), the annunciator "code #" will be illuminated. The left most digit of the display (D8) will be set to "4" indicating that this is the fourth code number sequence. The logo will continue to change state every second indicating that the PDR TM is operating in the normal mode. The programmed serial number will be displayed on the six right most digits (D6 D5 D4 D3 D2 D1) of the display, i.e., if this display sequence is enabled on a meter with a programmed serial number of 123456, the display will appear as shown in FIG. 37. "Serial number" is a six digit register within the PDR TM that is programmable from 000000 to 999999 by the P/R. In PDR TM, the "serial number" register is used only during the serial number display sequence. The meter serial number has no effect on the operation of PDR TM. PDR TM does, however, send the serial number to the P/R during a meter read operation where the serial number is used as a reference to the data from that particular PDR TM.

During the "register type" display sequence (FIG. 38), the annunciator "code #" will not be illuminated. The logo will continue to change states every second indicating that the PDR TM is operating in the normal mode. The register type will be displayed using a "D8 D7 D6 D5 D4 D3 D2 D1" format. The digits of the register type are displayed in a hexadecimal format which directly corresponds to the function of the PDR TM. This correspondence will be outlined below under "How to decode the register type information from the register type display". FIG. 38 is an example of a typical display of the register type on a meter with a register type that translates to "F F E 7 6 3 4 F". "Register type" is an eight digit register stored within the PDR TM that the central processing unit of PDR TM uses to determine the exact operation of PDR TM. Each programmable function or option of PDR TM is "bit mapped" into the "register type" register. That means that for each programmable function of PDR TM, there is a bit assigned to determine whether or not that function is to be performed or disallowed. For a more detailed breakdown of the meaning of the "register type" register and the programmable functions, see below under "How to decode the register type information from the register type display". Here is a list of PDR TM's programmable functions:

1. Display time out/no display time out
2. Negative disk rotation allowed/disallowed
3. Cumulative register/not cumulative register
4. Rolling interval/block interval
5. Customer alert/no customer alert
6. Load control/no load control
7. Display sequence enable/disable
8. Energy and demand resolution During the "time into interval" display sequence (FIG. 39), the annunciator "code #" will be illuminated. The left most digit of the display (D8) will be set to "6" indicating that this is the sixth code number sequence. The logo will continue to change state every second indicating that the PDR TM is operating in the normal mode. The time into the present demand interval will be displayed on the five right most digits of the LCD using a "D5 D4 D3 D2 D1" format. Where D5 and D4 are used to display minutes, D2 and D1 are used to display seconds, and D3 is left blank for readability, i.e., if this display sequence is enabled on a meter that is 3 minutes and 43 seconds into a demand interval, the display will appear as shown in FIG. 39. "Time into interval" is two, two digit registers indicating relative real time within the PDR TM. The internal time on PDR TM is derived from the line frequency. For block demand intervals, both registers should be used to determine the time that has elapsed in the present demand interval. The PDR TM segments its demand information every minute; therefore, on rolling intervals the seconds register (digits 1 and 2) are used to determine the time into the present demand minute. Although the PDR TM will update demand and energy information as it is calculated from disk revolutions, much of the bookkeeping required to maintain up to 60 minutes of past demand information is handled at the end of every minute (FIG. 7, Box 707).

During the "energy constant" display sequence (FIG. 40), the annunciator "code #" will be illuminated. The left most digit of the display (D8) will be set to "7" indicating that this is the seventh code number sequence. The logo will continue to change states every second indicating that the PDR TM is operating in the normal mode. The calculated energy constant for the register will be displayed on the five right most digits of the LCD using a "D5.D4 D3 D2 D1" format, i.e., if this display sequence is enabled on a meter with an energy constant of 0.0072, the display will appear as shown in FIG. 40. Note, in the event that the energy constant is greater than 9.9999, the format of this display sequence will become "D4 D3 D2.D1" with the leading zero's of this number blanked for readability. In PDR TM, the energy constant is a seven digit register that contains the calculated amount of energy represented by one disk revolution. The energy constant has a range from 000.0000 to 999.9999. This quantity is calculated by the equation:

$$CE = TF \times KH$$

where:
CE = energy constant
KH = meter constant
TF = transformer factor

During the "power constant" display sequence (FIG. 41), the annunciator "code #" will be illuminated. The left most digit of the display (D8) will be set to "8" indicating that this is the eighth code number sequence. The logo will continue to change states every second indicating that the PDR TM is operating in the normal mode. The calculated power constant for the register will be displayed on the five right most digits of the LCD using a "D5.D4 D3 D2 D1" format, i.e., if this display sequence is enabled on a meter with a power constant of 0.0864, the display will appear as shown in FIG. 41. In the event that the power constant is greater than 9.9999, the format of this display sequence will become "D4 D3 D2.D1" with the leading zero's of this number blanked for readability. In PDR TM, the power constant is a seven digit register that contains the calculated amount of power one disk revolution represents. The power constant has a range from 000.0000 to 999.9999. This quantity is calculated by the equation:

$$CP = \frac{KH \times TF \times 60}{T}$$

where:

CP = power constant
KH = meter constant
TF = transformer factor
60 = minutes/hour
T = demand interval length During the "disk status" display sequence, the annunciator "code #" will be illuminated. The left most digit of the display (D8) will be set to "9" indicating that this is the ninth code number sequence. The logo will continue to change states every second indicating that the PDR TM is operating in the normal mode. The meter disk status will be displayed on the six right most digits (D6 D5 D4 D3 D2 D1) of the LCD. Digits 6 and 5 are used to indicate the disk's angular position, digits 1, 2 and 3 indicate the number of disk revolutions within the present demand minute, and digit 4 is left blank for readability, i.e., this display sequence is enabled on a meter that is 351 degrees into a forward disk revolution (93), and has 28 disk revolutions within the present demand minute, the display will appear as shown in FIG. 42. The meter disk status is comprised of two, two digit numbers. One number represents the angular position of the disk. The PDR TM has a maximum resolution of 9 degrees on each disk revolution. This information is displayed on digits 5 and 6 of this display sequence. On a forward moving disk, the angular position of the disk can be decoded as follows:

$$AP = 36 \times D6 + 9 \times D5$$

where:
AP = angular position in degrees
D5 = digit #5
D6 = digit #6

The angular position of a disk moving in the reverse direction is slightly different and will not be considered at this time. In the example shown in FIG. 42, the angular position of the disk is equal to "36×9+9×3" or 351 degrees. The other number, which is displayed on digits 1, 2 and 3, represents the total number of 360 degree disk revolutions in the present demand minute. At the end of each minute, this number will be reset to zero and disk counting will continue from that point. The number of disk revolutions just prior to this reset is saved and used for demand calculations.

(D) Override Annunciators

In PDR TM, override annunciators are used to indicate information which is momentary in nature. Although this is not always the case, the override annunciators do indicate the occurrence of some event or status within PDR TM. The override annunciators will not show up on the segment check display sequence (FIG. 10), but their presence will become clear once a display activate has been performed and the next display sequence appears on the LCD.

In PDR TM, the annunciators "rolling", "block", and "cumulative" are called the mode indicators. (See FIG. 43) They are illuminated during the energy, present demand, maximum demand, cumulative demand, alarm on preset, and the load off preset display sequences (FIGS. 11 through 28). Mode indicators are used to indicate the functional mode in which the PDR TM is operating. Such as, block or rolling block, and cumulative or not cumulative. Mode indicators are illuminated according to the information in the "rolling" and "cumulative" bits in the "register type" register.

The PDR TM has three "serial input/output status" (SIO) indicators. (See FIG. 44) Below is a list of the three indicators with their respective meanings.

Reset—The "reset" annunciator will become illuminated for 16 seconds each time the PDR TM executes a billing reset function.

Read—The "read" annunciator will become illuminated for 16 seconds each time the PDR TM executes a meter read function.

Programmed—The "programmed" annunciator will become illuminated for 16 seconds each time the PDR TM executes a meter program function.

Figure 45:
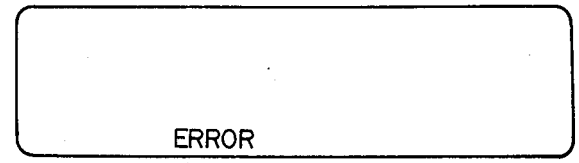
Figure 46:
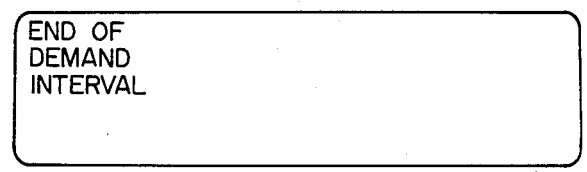

The PDR TM LCD has an "error" annunciator which is used to indicate error detected in the power up diagnostic. When an error is detected, the error annunciator will become illuminated and stay illuminated until either a correct power up sequence is detected or a serial communciation function is performed. The illuminated "error" annunciator is shown in FIG. 45.

The PDR TM has an "end of demand interval indication" for the use of sychronizing to and verifying PDR TM's internal clock. The "end of demand interval" annunciator will illuminate at the end of a demand interval for a period of 16 seconds, see FIG. 46.

Figure 47:
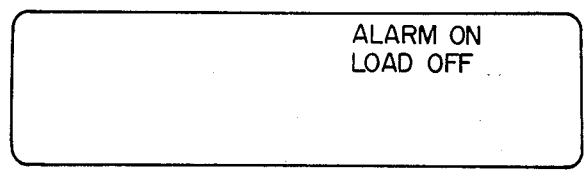

PDR TM has two annunciators on the LCD that reflect the status of the two external control relays, "consumer alert" and "load control" (FIG. 47). The status of each of these annunciators is directly related to the status of its respective relay, i.e., if the "customer alert" really is energized, then the "alarm on" annunciator will be illuminated. See FIG. 47 for the location of these two annunciators.

IV READOUT ANALYSIS (A) Segmentation of Demand Information in PDR TM

Figure 48:
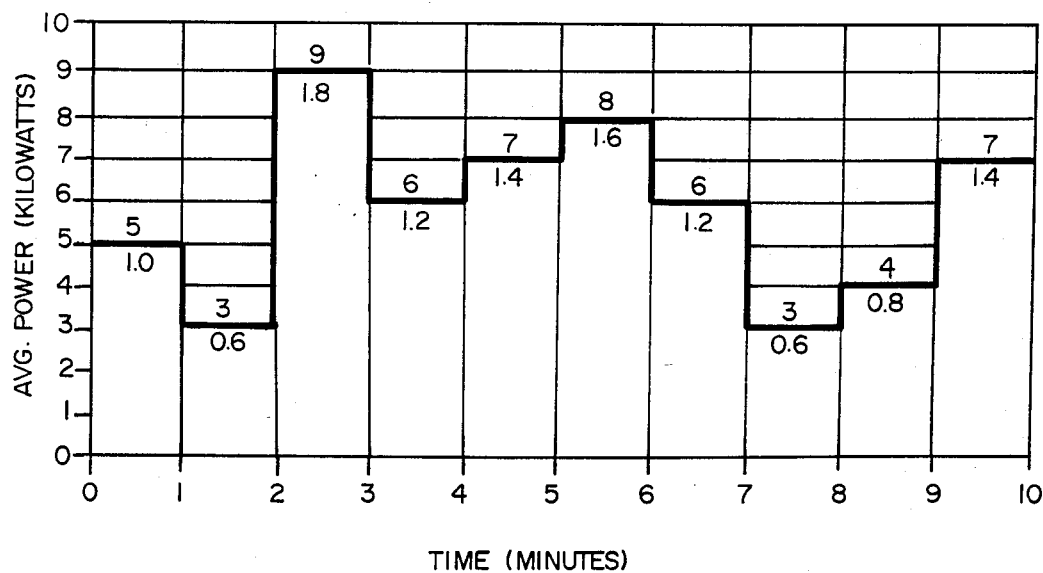
FIG. 48 is a sample load curve.

In PDR TM's normal operating mode, demand information is segmented by accumulating the number of disk rotations every minute. The resultant average demand for a particular minute is called a "demand segment" and that information is stored in the non-volatile RAM for use in calculating the present and maximum demands. In PDR TM, demand can be calculated in two ways, using either a block or a rolling block demand interval. The present and maximum demand registers in PDR TM will respond to a sample load using a 5 minute or a 5 minute rolling block interval. Looking at a sample load curve (FIG. 48), note that the numbers on top of the load curve indicate the average power used in that particular minute. The numbers below the curve indicate the amount of power the top number represents averaged over the 5 minute demand interval, i.e., in the first minute the average power used is 5 kilowatts, but since we are using a 5 minute demand interval, the PDR TM will register one fifth of that or 1 kilowatt in its demand registers. Assume that at time zero the maximum demand is reset to zero.

(B) Block Interval

Figure 49:
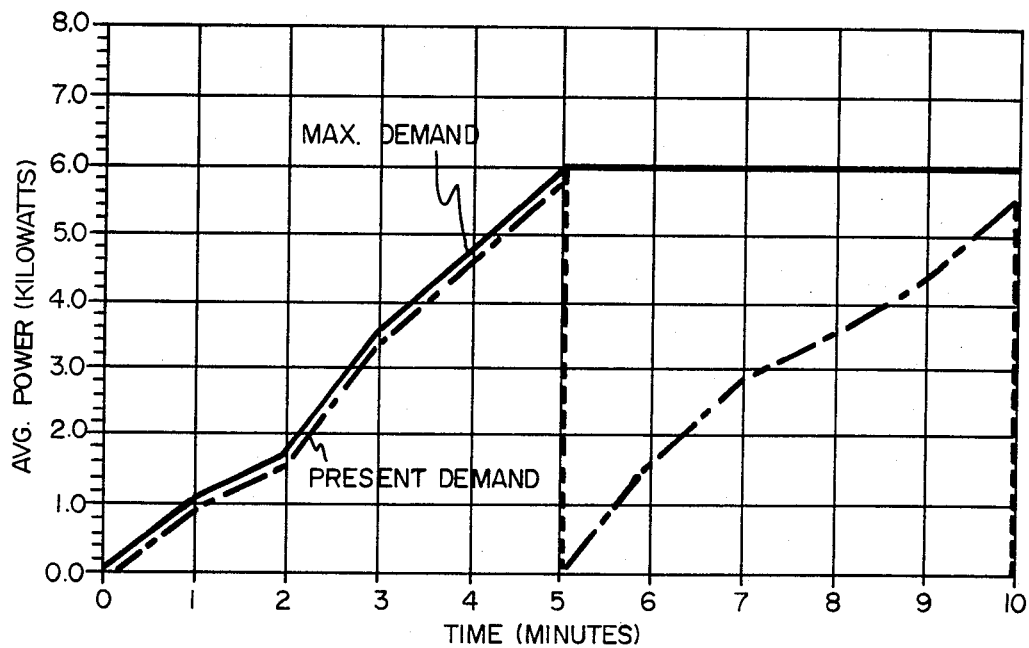
FIGS. 49 and 50 show maximum demand as present demand under varying conditions.

During a block demand interval, demand is accumulated for the duration of the demand interval. At the end of the demand interval, the present demand is reset to zero and demand accumulation begins again for the new demand interval. Looking at a sample load curve, note the effect this load will have on PDR TM's present and maximum demand registers. FIG. 49 is a simplified diagram of the readings of the present and maximum demand registers.

It can be seen from FIG. 49 that the PDR TM detects the maximum demand for this time interval sometime just prior to the 5 minute mark. The maximum demand as it is detected in this example will remain at 6.0 kilowatts until a larger present demand is detected or a billing reset function is performed on the meter.

(C) Rolling Block Interval

Figure 50:
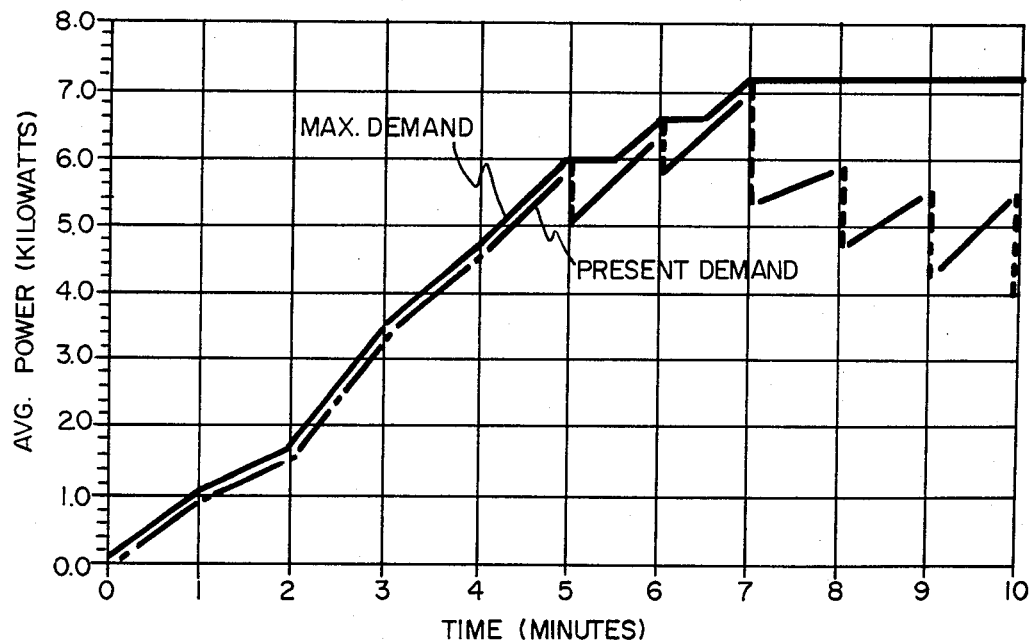
Figure 51:
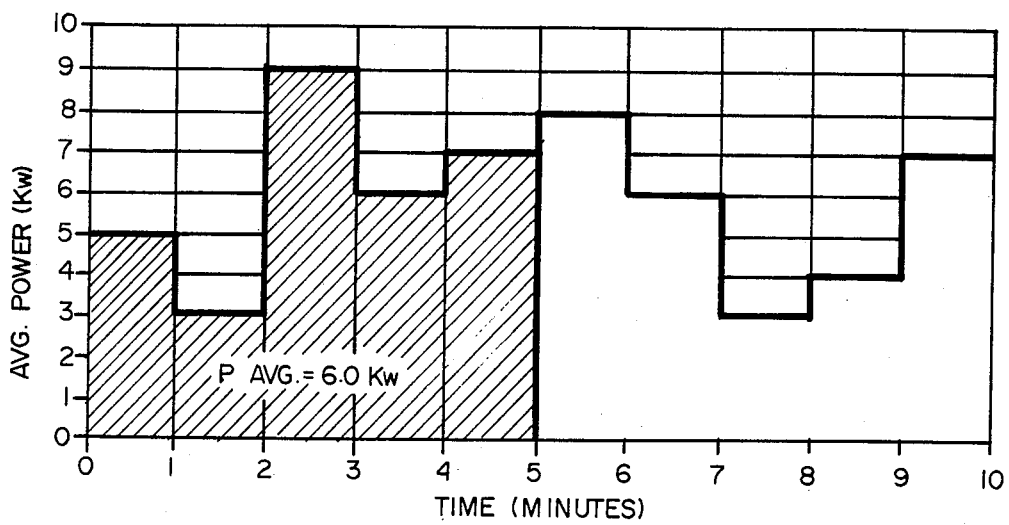
FIGS. 51 through 56 show load curves at various times with the regions being cross hatched where the demand information is gathered for each minute after minute number five.
Figure 52:
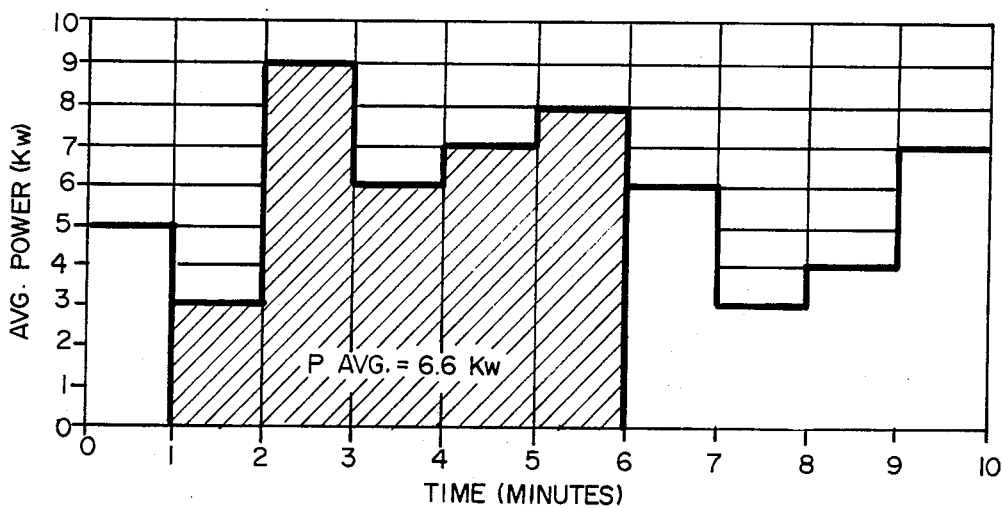
Figure 53:
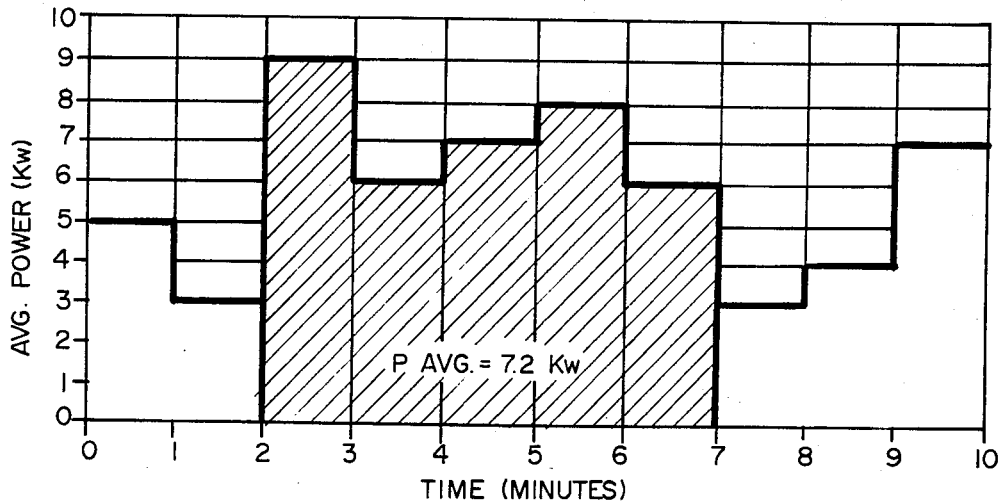
Figure 54:
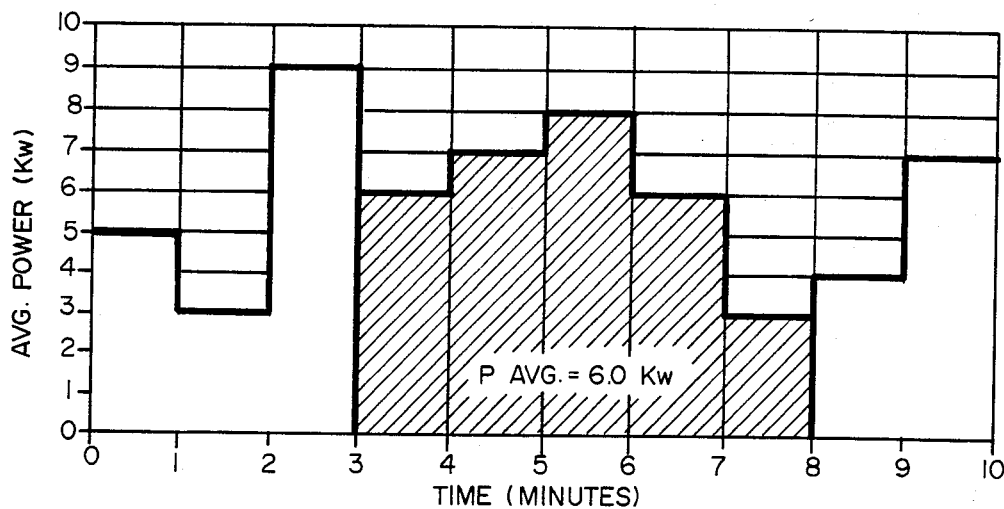
Figure 55:
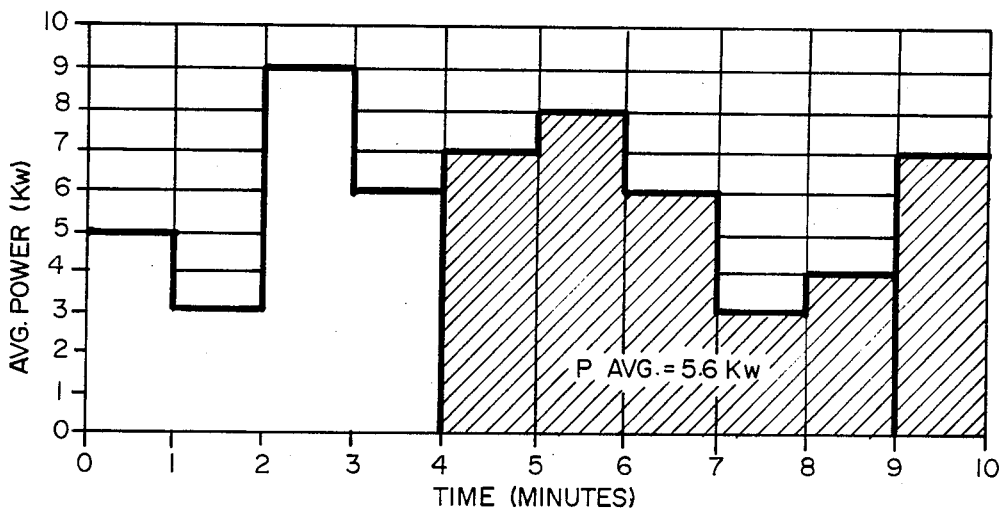
Figure 56:
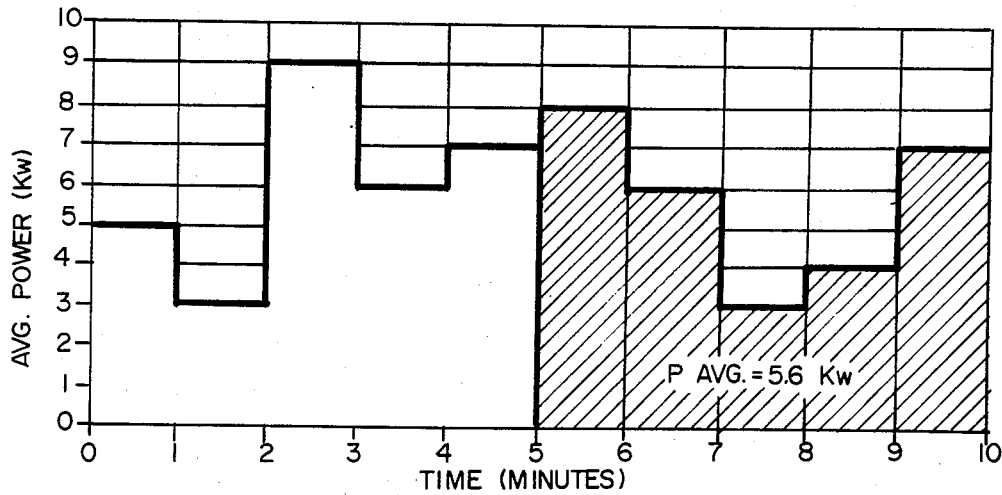
Figure 57:
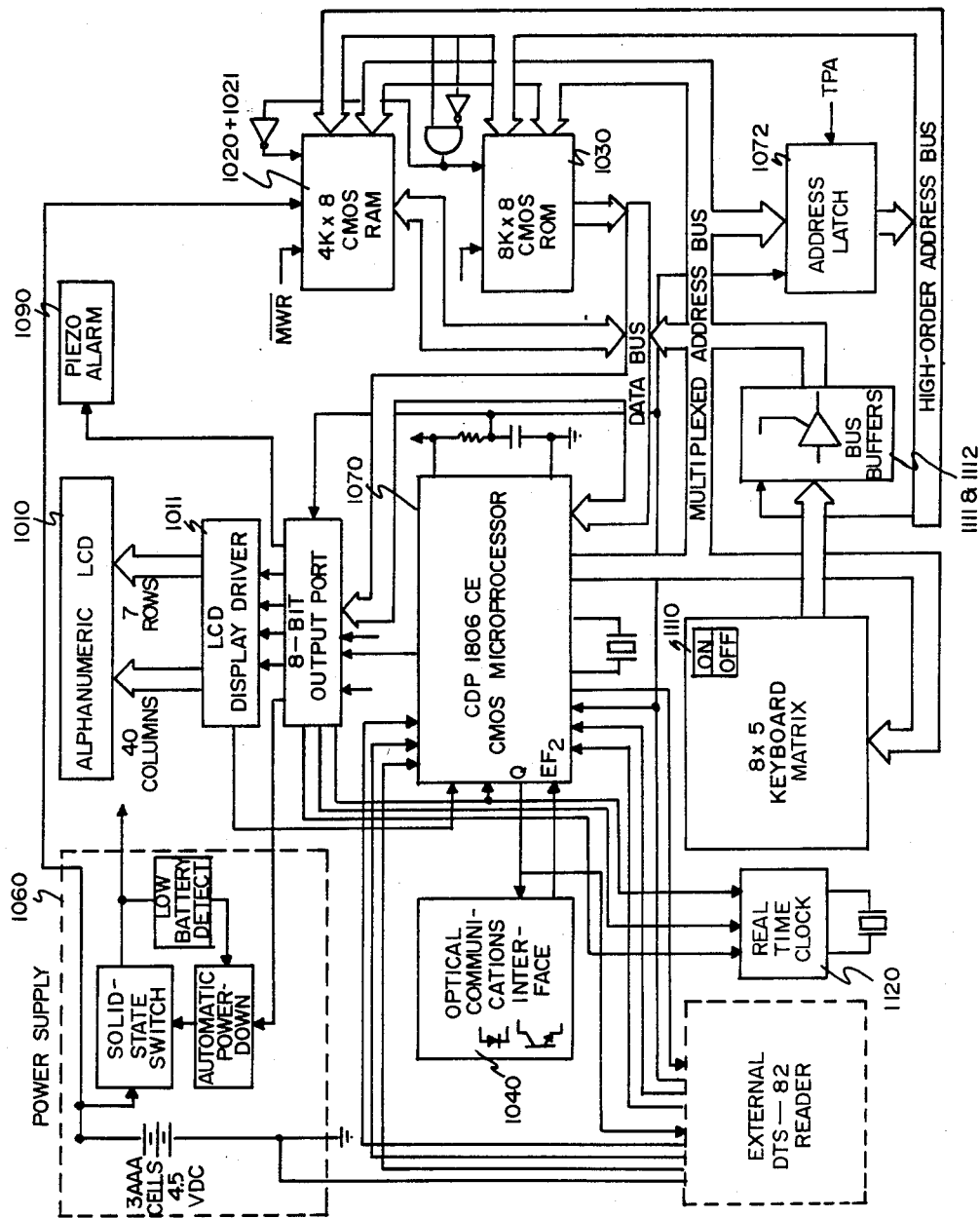
FIG. 57 is a block diagram of the P/R.

During a rolling block demand interval, demand information is accumulated for the duration of the demand interval. At the end of the demand interval, the present demand register is updated by subtracting the oldest demand segment for that demand interval and then continuing the accumulating process for the next minute. At that time, the oldest demand segment is once again subtracted and the accumulating process is continued. Using the sample load curve, note the effect this load will have on PDR TM'demand registers while a rolling interval is being used. FIG. 50 is a simplified diagram of the readings of the present and maximum demand registers. FIGS. 51 through 56 have the regions shaded where the demand information is gathered for each minute after minute number five.

Note what happens at the 5 minute mark:

1. The present demand is decreased by the amount calculated in the first demand segment (1.0 KH).

2. The maximum demand remains at 6.0 kilowatts until the present demand exceeds that value.

3. Accumulation of demand continues without interruption until the end of minute number 6. FIG. 50 shows that the PDR TM detects the maximum demand for this time interval sometime just prior to the 7 minute mark. These examples show the main advantage of using a rolling block interval, and that is the elimination of peak-splitting. Referring back to the block interval example, the maximum demand was detected to be 6.0 kilowatts; whereas, in the rolling interval example the maximum demand was detected to be 7.2 kilowatts. The maximum demand in this example will remain at 7.2 kilowatts until a larger present demand is detected or a billing reset function is performed on the meter.

(B) Hexadecimal Notation in the PDR TM

While there are many different numbering systems, in PDR TM there is a particular interest in the binary and the hexadecimal number systems. Many of PDR TM's display sequences and meter data definitions are based on these two number systems. The purpose of this section is to give a brief overview of how to convert between bases 2 (binary), 10 (decimal) and 16 (hexadecimal). The inherent one to one mapping from binary to hexadecimal notation is obvious. In normal use, a number is usually assumed to be a decimal number, i.e., base ten. In PDR TM, most registers do use the decimal system, but, for some registers it is impractical to represent them to base ten. The "register type" register, which determines many of the functions that the PDR TM performs, has 4,294,967,296 possible combinations. If a chart were made to decode the "register type" number, it would be over 400 million pages long and have over 30 billion entries. With the use of hexadecimal notation, this can be reduced to two pages. A chart of the basic conversion of each base into either of the other bases follows. Note, it requires four binary digits (bits) to represent either a decimal or a hexadecimal number. Also, note that in some cases two decimal digits are required to represent one hexadecimal digit. Following this chart are examples of how to convert binary to hexadecimal, hexadecimal to binary, and hexadecimal to decimal.

| Chart for Conversion Between Binary Decimal, and Hexadecimal Notation | | |
|---|---|---|
| Decimal | Binary | Hexadecimal |
| 0 | 0000 | 0 |
| 1 | 0001 | 1 |
| 2 | 0010 | 2 |
| 3 | 0011 | 3 |
| 4 | 0100 | 4 |
| 5 | 0101 | 5 |
| 6 | 0110 | 6 |
| 7 | 0111 | 7 |
| 8 | 1000 | 8 |
| 9 | 1001 | 9 |
| 10 | 1010 | A |
| 11 | 1011 | B |
| 12 | 1100 | C |
| 13 | 1101 | D |
| 14 | 1110 | E |
| 15 | 1111 | F |
| 16 | 10000 | 10 |
| 17 | 10001 | 11 |
| 18 | 10010 | 12 |

EXAMPLE #1

Conversion from Binary to Hexadecimal

To convert a binary number, to a hexadecimal number substitute the corresponding hexadecimal digit into each group of four binary digits that are to be converted. Note, since there are four binary digits for every hexadecimal digit, the hexadecimal number will have about one fourth the number of digits of the binary number. As an example, convert "0 1 1 0 1 0 0 1 1 0 1 1 0 1" to hexadecimal.

Step #1: Break up the binary number into groups of four binary digits starting from the right.

| 0 1 | 1 0 1 0 | 0 1 1 0 | 1 1 0 1 |
|---|---|---|---|

Step #2: Fill in the remaining binary digits on the left most group with zeros.

| 0 0 0 1 | 1 0 1 0 | 0 1 1 0 | 1 1 0 1 |
|---|---|---|---|

Step #3: Convert groups of binary digits to hexadecimal digits using the notation directly from the chart.

| 0 0 0 1 | 1 0 1 0 | 0 1 1 0 | 1 1 0 1 |
|---|---|---|---|
| 1 | A | 6 | D |

Therefore "01101001101101" binary = "1A6D" hexadecimal.

EXAMPLE #2

Conversion from Hexadecimal to Binary

To convert a hexadecimal number to a binary number substitute the corresponding binary digits into the hexadecimal digits that are to be converted. Since there are four binary digits for every hexadecimal digit, the binary number will have about four times the number of digits of the hexadecimal number. As an example, convert "B E 1 A" to binary.

Step #1: Break up the hexadecimal number into groups of one.

| B | E | 1 | A |
|---|---|---|---|

Step #2: Convert the hexadecimal digits into groups of binary digits using the notation directly from the chart.

| B | E | 1 | A |
|---|---|---|---|
| 1 0 1 1 | 1 1 1 0 | 0 0 0 1 | 1 0 1 0 |

Therefore, "BE1A" hexadecimal = "1011111000011010" binary.

EXAMPLE #3

Conversion from Hexadecimal to Decimal

The conversion of a hexadecimal number to a decimal number requires the use of positional notation. Positional notation means that each digit in a number has a specific value by virtue of its position in the number. To exemplify positional notation, the decimal number 865 has:

8—hundreds
6—tens
5—ones

The digit "8" the above number has an intrinsic value of 800 based on its position within the number. The digit "6" has a value of 60 and the digit "5" has a value of 5. The number 865 is the sum of these three values. To convert a hexadecimal number into a decimal number, determine the positional value of each hexadecimal digit and sum the resultant positional values. As an example, convert "3C" into decimal.

Step #1: Determine the positional value of each digit in the hexadecimal numnber.

3—sixteens
C—ones

Step #2: Sum the resultant values of each position.

| "C" | 3 × 16 = | 48 |
|---|---|---|
| | 12 × 1 = | +12 |
| | | 60 |

Therefore "3C" hexadecimal = "60" decimal.

(C) How to Decode the Register Type Information From the "Register Type" Display There are eight basic programmable functions in PDR TM. Information in the "register type" register directs the PDR TM's central processing unit toward the exact functions or options it is to perform. Each programmable function or option of PDR TM is "bit mapped" into this register with the use of hexadecimal notation. That means for each programmable function of PDR TM, there is a bit assigned to determine whether or not that function is to be performed or enabled. Below is a detailed breakdown of PDR TM's programmable options followed by a chart depicting how each function maps into the "register type" register. This section will be concluded with an example of a typical "register type" and how it maps into the chart.

1. Display time out/no display time out

This option allows the PDR TM to be operated in a mode that forces the display into the "logo flash only" display sequence after one minute of inactivity on the optical port. That is, if the display time out bit is set in the "register type" register and there has been one minute of inactivity on the optical port, then the display will automatically cycle back to the "logo flash only" display sequence. If this bit is not set, then the display will remain in a given display state until a display activate has occured.

2. Negative disk rotation allowed/disallowed

This option allows the PDR TM to be set up in a mode in which negative disk rotation is either counted or ignored. That is, if the disk rotation bit is set in the "register type" register, then negative disk rotation will be handled as delivering power instead of using power and the accumulated energy register will "run backward". If the disk rotation bit is not set, then negative disk rotation will be ignored. Negative demand is not defined; therefore, negative disk rotation is always ignored by PDR TM's demand register.

3. Cumulative register/not cumulative register

This option allows the cumulative function of PDR TM to be disabled. If the cumulative meter bit is set in the "register type" register, then the maximum demand will be added to the cumulative demand with the resolution set forth in the demand display mode bits, each time the PDR TM processes a billing reset. If the cumulative meter bit is not set, then this addition will not take place.

4. Rolling interval/block interval

This option is used to select the interval type, either rolling or a block, in which the PDR TM will operate. That is, if the rolling interval bit is set in the "register type" register, then demand information within the PDR TM will be calculated using a rolling interval. If the rolling interval bit is not set, then demand information will be calculated using a block interval.

5. Customer alert/no customer alert

This option allows PDR TM's external customer alert signal to be disabled regardless of the status of the present demand relative to the customer alert preset. That is, if the customer alert bit is not set in the "register type" register, then the customer alert relay will always be deenergized. If the customer alert bit is set, then the signal for customer alert will operate normally.

6. Load control/no load control

This option allows PDR TM's external load control signal to be disabled regardless of the status of the present demand relative to the load control preset. That is, if the load control bit is not set in the "register type" register, then the load control relay will always be deenergized. If the load control bit is set, then the signal for load control will operate normally.

7. Display sequence enable/disable

This option allows any or all of PDR TM's display sequences to be disabled with the exception of the "logo flash only" display sequence. That is, if a display sequence bit is not set in the "register type" register, then that particular display sequence will become disabled and will not be shown on the display at any time. If the display sequence bit is set, then that particular display sequence will be viewed normally.

8. Energy and demand display modes

Demand resolution and demand display mode bits 0 and 1 of digit 8 of the "register type" register. The demand resolution or display mode may be 0, 1, 2 or 3, indicating the number of digits kept to the right of the decimal point in PDR TM demand registers (See FIGS. 15 through 26). The demand resolution also sets the resolution of the cumulative demand registers. If, when a billing reset is performed and the demand resolution is 0, then the maximum it is truncated up to the digit displayed prior to the addition of the maximum demand register into the cumulative demand register, i.e. if the maximum demand is 42.045, the cumulative demand is 105.285, and the demand resolution is 0 just prior to a billing reset, though the maximum demand will be truncated to 42.000 before it is added to the cumulative register. The resultant cumulative demand would become 147.285. Note, that the cumulative demand display sequence would not display the decimal location ".285" due to the demand resolution being equal to zero.

The energy display mode is determined by bits 2 and 3 of digit 8 of the "register type" register. The following is a breakdown of the four energy display modes (See FIGS. 11 through 14).

0 = 7 digits to the left of the decimal point are displayed
    0 digits to the right. Leading zeros are clipped off this display sequence.
1 = 7 digits to the left of the decimal point are displayed
    1 digit to the right. Leading zeros are clipped off this display sequence.
2 = 6 digits to the left of the decimal point are displayed
    2 digits to the right. Leading zeros are clipped off this display sequence.
3 = 5 digits are displayed to the left of the decimal point.

| Bit # | "Register Type" Bit Map | | | |
|---|---|---|---|---|
| | Bit 3 | Bit 2 | Bit 1 | Bit 0 |
| Disp. Digit 1 | Rolling Interval | Cumulative Meter | Disk Rotation | Display Time Out |
| Digit 2 | Display Disk Status | Always 1 | Load Control | Customer Alert |
| Digit 3 | Display Maximum Demand | Display Present Demand | Display Energy | Display Segment Check |
| Digit 4 | Display MP Ratio | Display Load Off | Display Alarm On | Display Cumulative Demand |
| Digit 5 | Display Transformer Factor | Display Frequency | Display Interval Length | Display Meter Constant |
| Digit 6 | Display Serial Number | Display Power Fails | Display Reset Date | Display Billing Resets |
| Digit 7 | Display Power Constant | Display Energy Constant | Display Time in Interval | Display Register Type |
| Digit 8 | Bits 2 and 3 used to set the energy display mode Bits 0 and 1 used to set the demand resolution and display mode. | | | |

EXAMPLE

Register type = F F E 7 6 3 4 F

To decode this register type expand the hexadecimal digits of the number into binary notation. That is:

3 = 0 0 1 1
4 = 0 1 0 0
6 = 0 1 1 0
7 = 0 1 1 1
E = 1 1 1 0
F = 1 1 1 1 then map the binary representation of each digit directly into the register type chart. If a "1" maps into a particular location then that function will be enabled. If a "0" maps into a particular location then that function will be disabled.

| | | |
|---|---|---|
| Digit 1 = F | 1--interval type equals "rolling" | |
| | 1--cumulative meter function enabled | |
| | 1--negative disk rotation is allowed | |
| | 1--display will time out | |
| Digit 2 = 4 | 0--disk status will not be displayed | |
| | 1--always | |
| | 0--load control relay always off | |
| | 0--customer alert relay always off | |
| Digit 3 = 3 | 0--maximum demand will not be displayed | |
| | 0--present demand will not be displayed | |
| | 1--energy will be displayed | |
| | 1--segment check will be displayed | |
| Digit 4 = 6 | 0--MP ratio will not be displayed | |
| | 1--load off preset will be displayed | |
| | 1--alarm on preset will be displayed | |
| | 0--cumulative demand will not be displayed | |
| Digit 5 = 7 | 0--transformer factor will not be displayed | |
| | 1--system frequency will be displayed | |
| | 1--demand interval length will be displayed | |
| | 1--meter constant KH will be displayed | |
| Digit 6 = E | 1--serial number will be displayed | |
| | 1--power fails will be displayed | |
| | 1--billing reset date will be displayed | |
| | 0--billing resets will not be displayed | |
| Digit 7 = F | 1--power constant will be displayed | |
| | 1--energy constant will be displayed | |
| | 1--time into interval will be displayed | |
| | 1--register type will be displayed | |
| Digit 8 = F | 1--energy display mode = 3 | |
| | 1-- | |
| | 1--demand display mode and resolution = 3 | |
| | 1-- | |

(D) Making Connections to the Outside World

The PDR TM has four outputs which can be connected to devices external to the meter. They are the end of demand interval relay, customer alert relay, the load control relay, and the pulse generator outputs. The actions and settings of these output devices are found or referenced above. The output devices used for the three relay closures are identical. The pulse generator circuit is compatible with a standard pulse generator device.

P/R Electronic Description

Figure 58A:
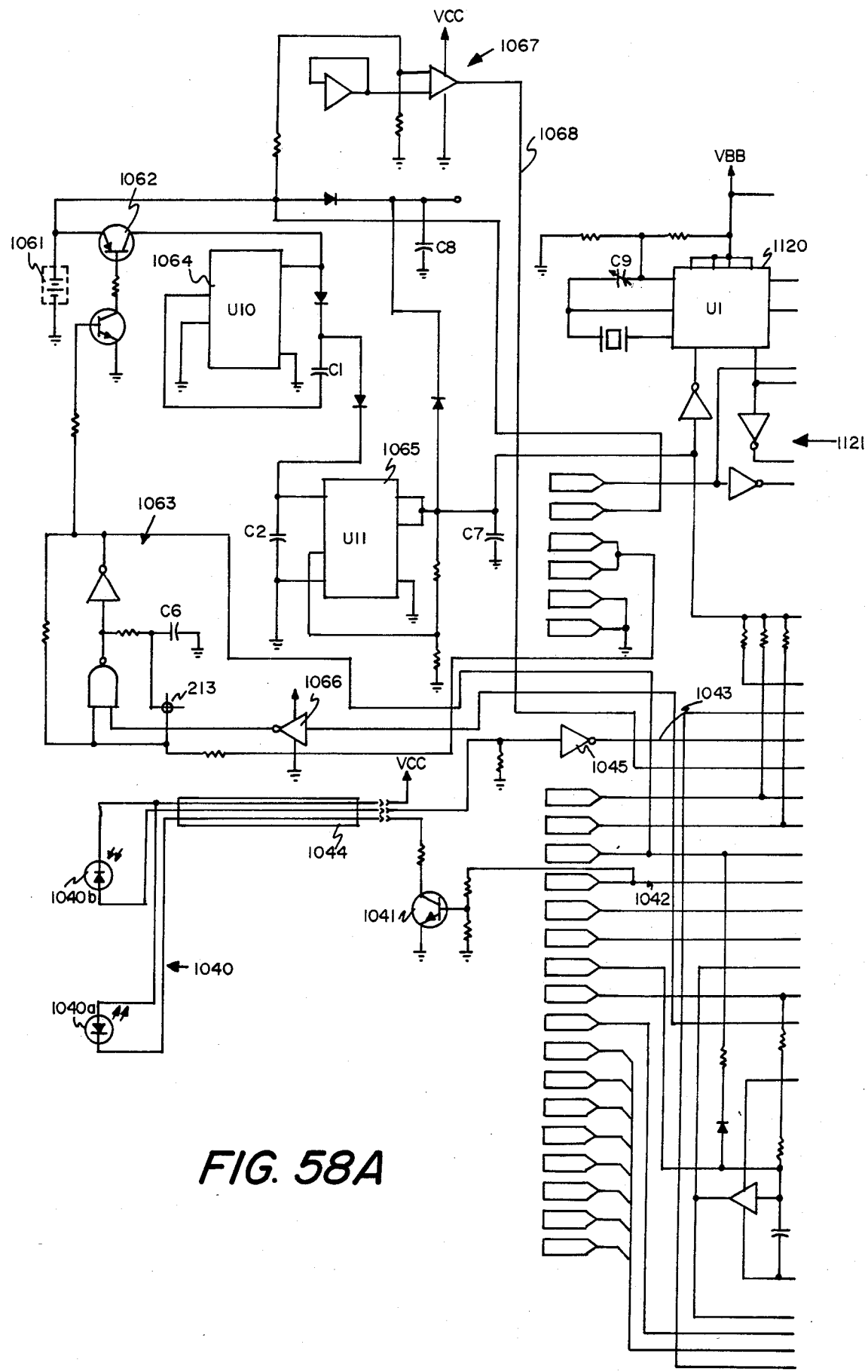
FIG. 58A, 58B, 58C and 58D is an electrical schematic diagram of the P/R circuitry.
Figure 58B:
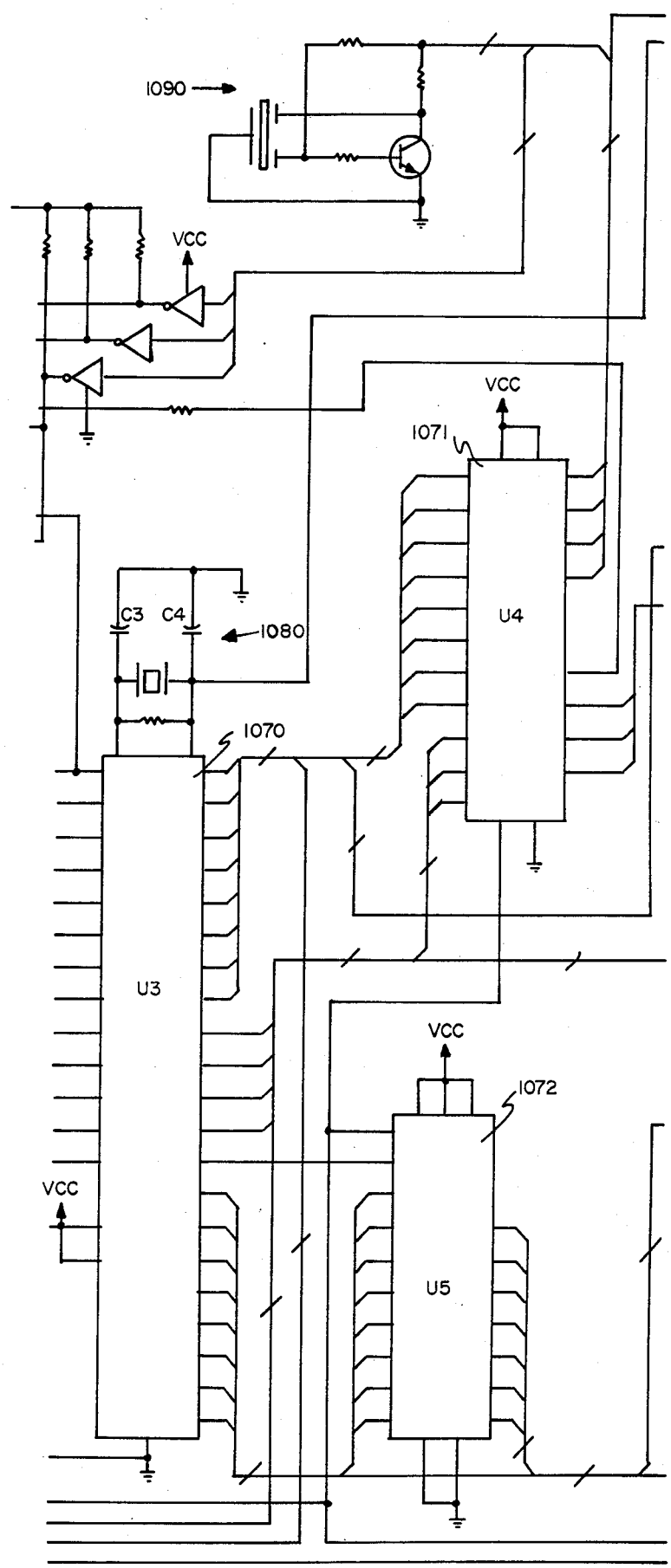
Figure 58C:
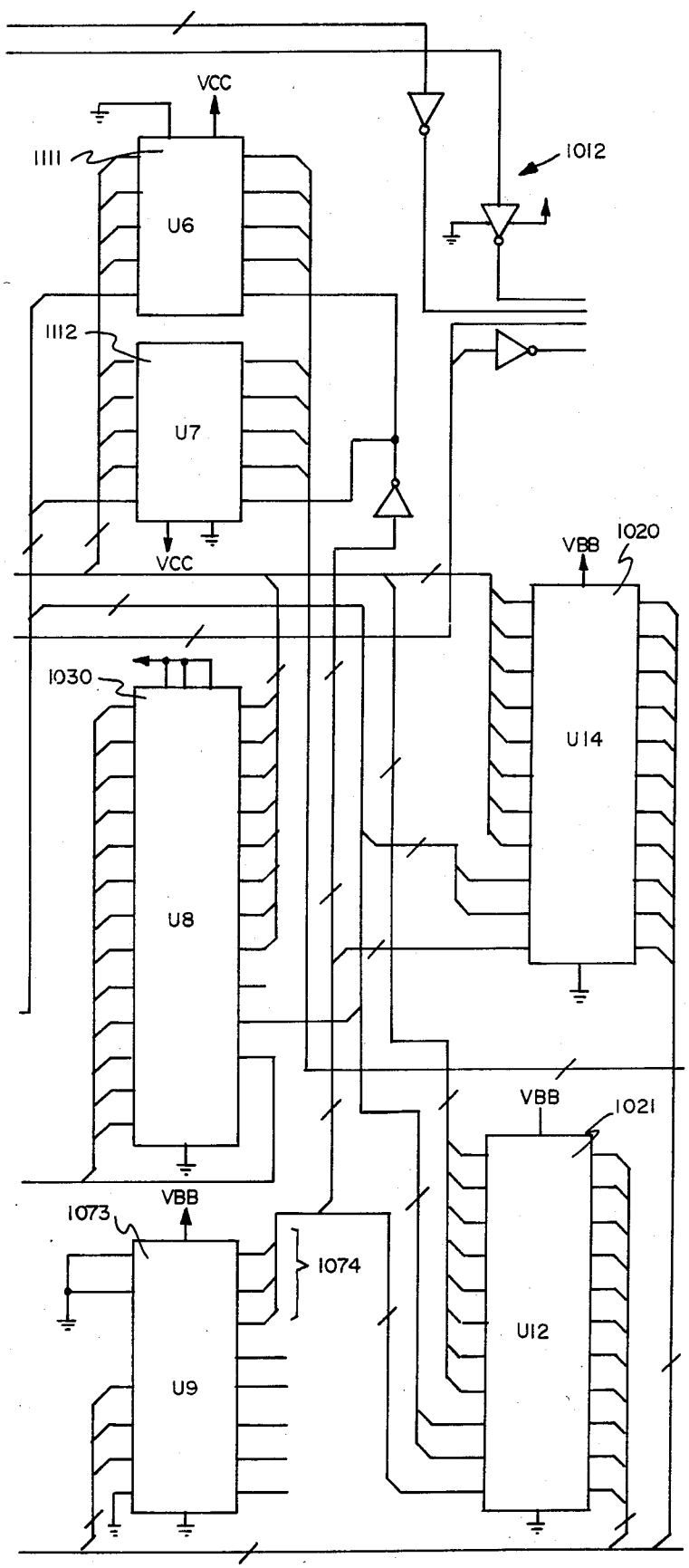
Figure 58D:
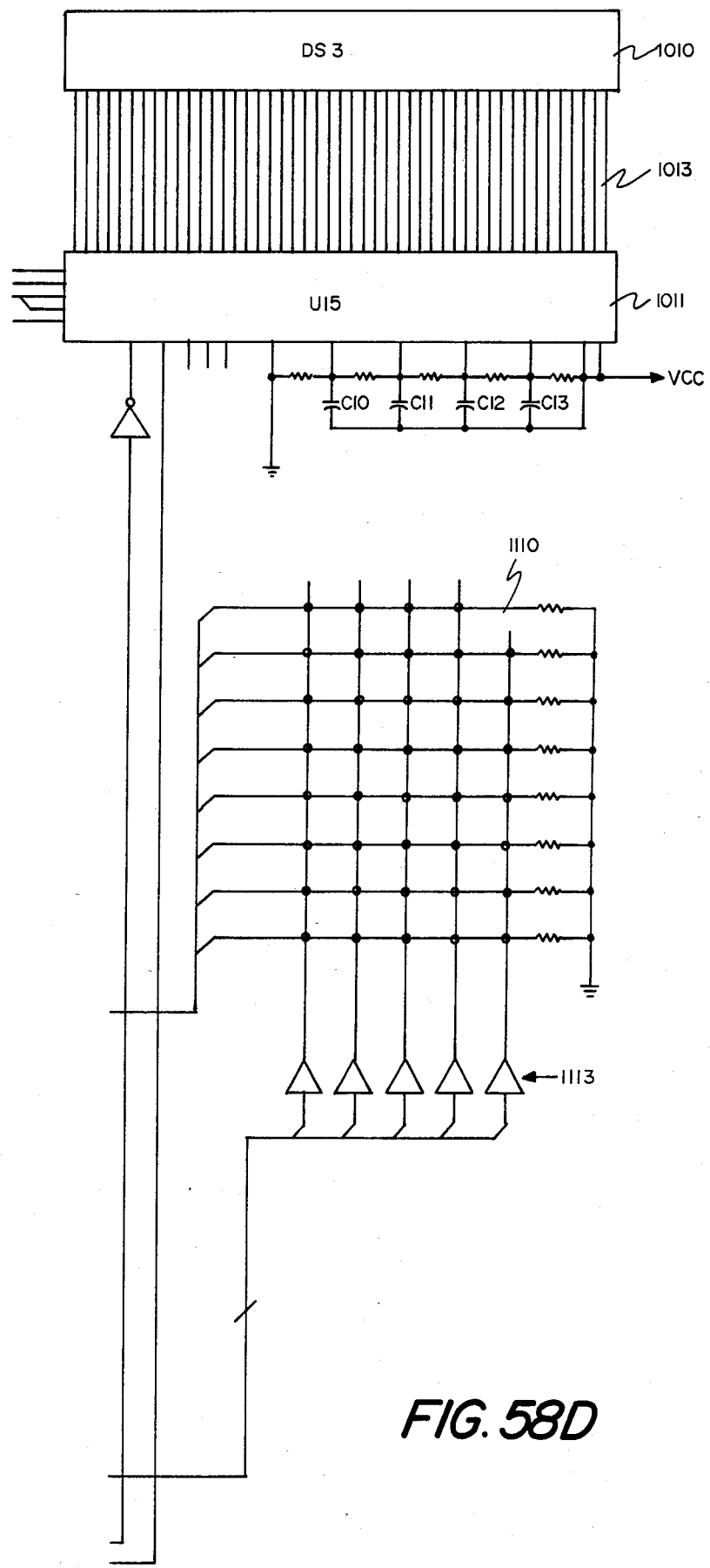

Refer to the preferred embodiment of the electronics for the Programmer/Reader as given in FIGS. 58A and 58B. Starting with the power supply for the device in FIG. 58A, 3 AAA alkaline batteries 1061 furnish power to the unit. A pass transistor 1062 is switched on by a latching ON-OFF circuit when the power switch 213 is depressed by the user. A capacitive voltage doubler circuit 1064 boosts the approximately 4.5 volts to 8-8.5 volts, a level which can then be regulated down to 5.0 VDC for the entire Programmer/Reader by the CMOS micropower regulator 1065. Automatic power-down of the unit controlled by the microprocessor 1070 is achieved via an inverting buffer 1066. A low-battery detector circuit 1067 determines when battery voltage level drops below safe condition and sends a logic signal 1068 to notify the microprocessor.

The central processing unit or microprocessor 1070, provides all control functions for the device. These include scanning the keyboard 1110 for a key closure via the data bus buffers 1111 and 1112 and address bus buffer 1113, to determine which command function the user has requested; outputing serial data information to the LCD display driver 1011; and other data including a control signal for the piezoelectric audio alarm 1090 via output port 1071. Address information is output from the microprocessor and the high-order byte of address is latched in 1072. Address information is decoded in 1073 and program commands can then be retrieved from the program memory (EPROM) 1030 or data written to the data memory (RAM) 1020 and 1021. The microprocessor also controls the optical port 1040 via serial output Q line 1042 and serial input EF2 line 1043.

Firmware for the unit is programmed into and an 8K×8 MBM 27C64-30 CMOS EPROM. Program memory is mapped from 0000 Hex to 1FFF Hex as seen from the memory map in Table 2.

TABLE 2

| MEMORY MAP | | |
|---|---|---|
| Address (Hex) | Label | Description |
| 000H | | |
| | | PROGRAM MEMORY - 8192 BYTES |
| 1FFFH | | |
| 2000H | | |
| | | SPARE - 8192 BYTES |
| 3FFH | | |
| 400H | LOCSP | |
| | | SP STACK - 20 BYTES |
| 4013H | | |
| 4014H | LOCXS | |
| | | X STACK - 20 BYTES |
| 4027H | | |
| 4028H | CTHRS | |
| | | STATUS AREA - 486 BYTES |
| 420DH | LOCST | |
| 420EH | LOCDA | |
| | | DATA MEMORY FOR 85 PDR TM REGISTERS - 3570 BYTES |
| 4FFFH | ENDDA | |
| STATUS AREA DETAILED | | |
| Storage area for Information Programmed into the P/R | | |
| 4028H | CTHRS | CURRENT TIME: HOURS |
| 4029H | CTMIN | |
| 402AH | CTDTE | |
| 402BH | CTMO | |
| 402CH | CTYR | |
| 402DH | CTDOW | |
| 402EH | CTSEC | |
| 402FH | CSHRS | CLOCK SET TIME: HOURS |
| 4030H | CSMIN | |
| 4031H | CSDTE | |
| 4032H | CSMO | |
| 4033H | CSYR | |
| 4034H | CSDOW | |
| 4035H | CSSEC | |
| 4036H | LOVI1 | "SN __" SERIAL NUMBER INFORMATION |
| 4038H | SNDAT | MS DIGIT OF SERIAL NUMBER |
| 403EH | LOVI2 | "__-__-__" DATE INFORMATION |
| 4046H | LOVI3 | "PDR TYPE" REGISTER TYPE DATA IDENTIFIER |
| 404EH | LOVI4 | "A=__ B=__" METER TYPE PARAMETERS |
| 4050H | TYPEA | MS DIGIT FOR PARAMETER A |
| 4054H | TYPEB | MS DIGIT FOR PARAMETER B |
| 4056H | LOVI5 | "C=__ D=__" METER TYPE PARAMETERS |

TABLE 2-continued
MEMORY MAP

| Address (Hex) | Label | Description |
|---|---|---|
| 4058H | TYPEC | MS DIGIT FOR PARAMETER C |
| 405CH | TYPED | MS DIGIT FOR PARAMETER D |
| 405EH | LOVI6 | "E=_ F=_" METER TYPE PARAMETERS |
| 4060H | TYPEE | MS DIGIT OF PARAMETER E |
| 4064H | TYPEF | MS DIGIT OF PARAMETER F |
| 4066H | LOVI7 | "G=_ H=_" METER TYPE PARAMETERS |
| 4068H | TYPEG | MS DIGIT OF PARAMETER G |
| 406CH | TYPEH | MS DIGIT OF PARAMETER H |
| 406EH | LOVI8 | "FREQ=_" FREQUENCY INFORMATION |
| 4074H | FRQDT | MS DIGIT OF FREQ DATA |
| 4076H | LOVI9 | "INT =_" DEMAND INTERVAL LENGTH |
| 407CH | INTDT | MS DIGIT OF INTERVAL DATA |
| 407EH | LOVIA | "KH =_._" KH FACTOR INFORMATION |
| 4082H | KHFAC | MS DIGIT OF KH FACTOR |
| 4086H | LOVIB | "MP =_._" MP FACTOR INFORMATION |
| 408AH | MPFAC | MS DIGIT OF MP FACTOR |
| 408EH | LOVIC | "TF =_" TRANSFORMER FACTOR INFO |
| 4019H | TFACT | MS DIGIT OF TRANSFORMER FACTOR |
| 4096H | LOVID | "ALARM ON" ALARM ON DATA IDENTIFIER |
| 409EH | LOVIE | "KW=_._" ALARM ON KW INFORMATION |
| 40A1H | ALRMD | MS DIGIT OF ALARM ON KW DATA |
| 40A6H | LOVIF | "LOAD OFF" LOAD OFF DATA IDENTIFIER |
| 40AEH | LOVIG | "KW=_._" LOAD OFF KW INFORMATION |
| 40B1H | LOFFD | MS DIGIT OF LOAD OFF KW DATA |
| 40B6H | LOVIH | "ID =_" USER ID (PASSWORD) INFO |
| 40BBH | IDDAT | MS DIGIT OF ID # |
| 40BEH | LOVII | "MEM =_" AVAILABLE DATA MEM SPACE |
| 40C4H | MEMDT | MS DIGIT OF MEMORY SPACE LEFT |
| 40C6H | LOVIJ | "MTRS =_" NUMBER OF METERS READ |
| 40CCH | METRS | MS DIGIT OF NUMBER OF METERS READ |
| 40CEH | LOVIK | "_:_:_" CURRENT TIME OR SET TIME INFORMATION |
| 40D6H | LOVIL | "ID =_" NEW PASSWORD INFORMATION |
| 40DBH | NEWID | MS DIGIT OF NEW PASSWORD |

Storage Area for Display of Meter Data Information

| Address (Hex) | Label | Description |
|---|---|---|
| 40DEH | LORI1 | "SN _" SERIAL NUMBER DATA |
| 40E0H | SNMET | MS DIGIT OF THE METER SERIAL NUMBER |
| 40E6H | LORI2 | "_-_-_" LAST RESET DATE |
| 40EEH | LORI3 | "KWH=_" KILOWATT-HOUR DATA |
| 40F2H | KWHR | MS DIGIT OF KWH DATA |
| 40F6H | LORI4 | "_._" KILOWATT-HOUR DATA CONTD. |
| 40FEH | LORI5 | "PRES KW=" PRESENT KILOWATTS IDENTIFIER |
| 4106H | LORI6 | "_._" PRESENT KW DATA |
| 410EH | LORI7 | "MAX KW=" MAXIMUM KILOWATTS IDENTIFIER |
| 4116H | LORI8 | "_._" MAXIMUM KW DATA |
| 411EH | LORI9 | "CUM KW=_" CUMULATIVE KW DATA |
| 4125H | CUMKW | MS DIGIT OF CUMULATIVE KW DATA |
| 4126H | LORIA | "_._" CUMULATIVE KW DATA CONTD. |
| 412EH | LORIB | "PDR TYPE" REGISTER TYPE INFORMATION |
| 4136H | LORIC | "_ _" METER TYPE DATA |
| 413EH | LORID | "KH=_._" KH FACTOR DATA |
| 4142H | KSUBH | MS DIGIT OF KH FACTOR IN REGISTER |
| 4146H | LORIE | "MP =_._" MP FACTOR DATA |
| 414AH | MSUBP | MS DIGIT OF MP FACTOR IN REGISTER |
| 414EH | LORIF | "TF=_" TRANSFORMER FACTOR DATA |
| 4151H | XFFAC | MS DIGIT OF TRANSFORMER FACTOR |
| 4156H | LORIG | "FREQ =_" FREQUENCY DATA |
| 415CH | FREQD | MS DIGIT OF FREQ DATA IN REGISTER |
| 415EH | LORIH | "INT =_" DEMAND INTERVAL DATA |
| 4164H | DMDIN | MS DIGIT OF DEMAND INTERVAL LENGTH |
| 4166H | LORII | "ALARM ON" ALARM ON DATA IDENTIFIER |
| 416EH | LORIJ | "KW=_._" ALARM ON KW DATA |
| 4171H | KWALR | MS DIGIT OF ALARM ON KW VALUE |
| 4176H | LORIK | "LOAD OFF" LOAD OFF DATA IDENTIFIER |
| 417EH | LORIL | "KW=_._" LOAD OFF KW DATA |
| 4181H | KWOFF | MS DIGIT OF LOAD OFF KW DATA |
| 4186H | LORIM | "PFS=_" NUMBER OF POWER FAILURES |
| 418AH | POUTS | MS DIGIT OF POWER FAILURES |
| 418EH | LORIN | "RSTS=_" NUMBER OF BILLING RESETS |
| 4193H | RSETS | MS DIGIT OF NUMBER OF RESETS |
| 4196H | REND | SPARE |
| 419FH | | SPARE |

Buffer Space for Temporary Storage of 83 Nibbles of PDR Data

| Address (Hex) | Label | Description |
|---|---|---|
| 41A0H | DABUF | BEGINNING OF BUFFER AREA |
| 41A1H | BPFS | BUFFER SPACE FOR POWER FAILS |
| 41A5H | BKWH | BUFFER SPACE FOR KILOWATT-HOUR DATA |
| 41B0H | BMP | BUFFER SPACE FOR MP RATIO DATA |
| 41B3H | BTF | BUFFER SPACE FOR TRANSFORMER FACTOR DATA |
| 41B8H | BCUM | BUFFER SPACE FOR CUMULATIVE KILOWATTS DATA |
| 41C0H | BKH | BUFFER SPACE FOR KH FACTOR DATA |
| 41C3H | BSN | BUFFER SPACE FOR SERIAL NUMBER DATA |
| 41C9H | BDATE | BUFFER SPACE FOR DATE INFO |
| 41CFH | BRSTS | BUFFER SPACE FOR NUMBER OF BILLING RESETS DATA |
| 41D2H | BLOFF | BUFFER SPACE FOR LOAD OFF KILOWATTS DATA |
| 41D6H | BALON | BUFFER SPACE FOR ALARM ON KILOWATTS DATA |
| 41DAH | BMAX | BUFFER SPACE FOR MAXIMUM KILOWATTS DATA |
| 41E1H | BPRES | BUFFER SPACE FOR PRESENT DEMAND IN KILOWATTS DATA |
| 41E8H | BINT | BUFFER SPACE FOR INTERVAL LENGTH DATA |
| 41EAH | BFREQ | BUFFER SPACE FOR FREQUENCY DATA |
| 41ECH | BTYPE | BUFFER SPACE FOR METER TYPE DATA |
| 41F3H | ENBUF | END OF BUFFER AREA (LAST BYTE OF TYPE DATA) |
| 41F4H | | SPARE |
| 41F5H | NXDMP | ADDRESS FOR NEXT METER |

TABLE 2-continued
MEMORY MAP

| Address (Hex) | Label | Description |
|---|---|---|
| 41F6H | | DATA, HIGH-ORDER BYTE |
| | | LOW-ORDER BYTE |
| 41F7H | BYTES | MEMORY CHECK BYTE AA |
| 41F8H | | MEMORY CHECK BYTE 99 |
| 41F9H | | MEMORY CHECK BYTE 55 |
| 41FAH | LOTAU | SIO TIME TAU |
| 4LFBH | HFTAU | TAU / 2 |
| 41FCH | MOTAU | TAU * 3 |
| 41FDH | LETAU | TAU * 2.5 |
| 41FEH | | SPARE |
| 420DH | LOCST | END OF STATUS AREA |

Packing of meter Data in Data Memory for First Meter
(M—Most Significant Digit, L—Least Significant Digit)

| Address | Label | | | Description |
|---|---|---|---|---|
| 420EH | MTR01 | M | X | |
| 420FH | | X | X | SERIAL NUMBER OF PDR |
| 4210H | | X | L | |
| | | +++++++++++++++++++ | | |
| 4211H | | M | X | |
| 4212H | | X | X | LAST RESET DATE |
| 4213H | | X | L | |
| | | +++++++++++++++++++ | | |
| 4214H | | M | X | |
| 4215H | | X | X | |
| 4216H | | X | X | KILOWATT-HOURS |
| 4217H | | X | X | |
| 4218H | | X | X | |
| | | ++++++++++++++++++ | | |
| 4219H | | L+M | | |
| | | ++++ | | |
| 421AH | | X | X | PRESENT KILOWATTS |
| 421BH | | X | X | |
| 421CH | | X | L | |
| | | +++++++++++++++++++ | | |
| 421DH | | M | X | |
| 421EH | | X | X | MAXIMUM KILOWATTS |
| 421FH | | X | X | |
| | | +++++++++++++++++++ | | |
| 4220H | | L+M | | |
| | | ++++ | | |
| 4221H | | X | X | |
| 4222H | | X | X | CUMULATIVE KILOWATTS |
| 4223H | | X | X | |
| | | +++++++++++++++++++ | | |
| 4224H | | L+M | | |
| | | ++++ | | |
| 4225H | | X | X | |
| 4226H | | X | X | REGISTER TYPE |
| 4227H | | X | X | |
| | | +++++++++++++++++ | | |
| 4228H | | L+M | | |
| | | ++++ | KH FACTOR | |
| | | X | L | |
| 4229H | | +++++++++++++++++++ | | |
| 422AH | | M | X | |
| | | | | MP FACTOR |
| | | ++++++++++++++++++ | | |
| 422BH | | L+M | | |
| | | ++++ | | |
| 422CH | | X | X | TRANSFORMER FACTOR |
| 422DH | | X | L | |
| | | ++++++++++++++++++++ | | |
| 422EH | | M | L | FREQUENCY |
| | | +++++++++++++++++++ | | |
| 422FH | | M | L | DEMAND INTERVAL |
| | | | | LENGTH |
| | | +++++++++++++++++++ | | |
| 4230H | | M | X | |
| 4231H | | X | L | ALARM ON KILOWATTS |
| | | +++++++++++++++++++ | | |
| 4232H | | M | X | |
| 4233H | | X | L | LOAD OFF KILOWATTS |
| | | +++++++++++++++++++ | | |
| 4234H | | M | X | |
| 4235H | | X | L | NUMBER OF POWER |
| | | | | FAILURES |
| | | +++++++++++++++++++ | | |
| 4236H | | M | X | |
| 4237H | | L | O | NUMBER OF BILLING |
| | | | | RESETS |
| | | ++++++++++++++++++++ | | |

| Address (Hex) | Label | Description |
|---|---|---|
| 4238H | MTR02 | |
| 4262H | MTR03 | |
| 428CH | MTR04 | |
| 42B6H | MTR05 | |
| 42E0H | MTR06 | |
| 430AH | MTR07 | |
| 4334H | MTR08 | |
| 435EH | MTR09 | |
| 4388H | MTR10 | |
| 43B2H | MTR11 | |
| 43DCH | MTR12 | ETC. . . . |
| 4406H | MTR13 | |
| 4430H | MTR14 | |
| 445AH | MTR15 | |
| 4484H | MTR16 | |
| 44AEH | MTR17 | |
| 44D8H | MTR18 | |
| 4502H | MTR19 | |
| 452CH | MTR20 | |
| 4556H | MTR21 | |
| 4580H | MTR22 | |
| 45AAH | MTR23 | |
| 45D4H | MTR24 | |
| 45FEH | MTR25 | |
| 4628H | MTR26 | |
| 4652H | MTR27 | |
| 467CH | MTR28 | |
| 46A6H | MTR29 | |
| 46D0H | MTR30 | |
| 46FAH | MTR31 | |
| 4724H | MTR32 | |
| 474EH | MTR33 | |
| 4778H | MTR34 | |
| 47A2H | MTR35 | |
| 47CCH | MTR36 | |
| 47F6H | MTR37 | |
| 4820H | MTR38 | |
| 484AH | MTR39 | |
| 4874H | MTR40 | |
| 489EH | MTR41 | ETC. . . . |
| 48C8H | MTR42 | |
| 48F2H | MTR43 | |
| 491CH | MTR44 | |
| 4946H | MTR45 | |
| 4970H | MTR46 | |
| 499AH | MTR47 | |
| 49C4H | MTR48 | |
| 49EEH | MTR49 | |
| 4A18H | MTR50 | |
| 4A42H | MTR51 | |
| 4A6CH | MTR52 | |
| 4A96H | MTR53 | |
| 4AC0H | MTR54 | |
| 4AEAH | MTR55 | |
| 4B14H | MTR56 | |
| 4B3EH | MTR57 | |
| 4B68H | MTR58 | |
| 4B92H | MTR59 | |
| 4BBCH | MTR60 | |
| 4BE6H | MTR61 | |
| 4C10H | MTR62 | |
| 4C3AH | MTR63 | |
| 4C64H | MTR64 | |
| 4C8EH | MTR65 | |
| 4CB8H | MTR66 | |
| 4CE2H | MTR67 | |
| 4D0CH | MTR68 | |
| 4D36H | MTR69 | |
| 4D60H | MTR70 | |
| 4D8AH | MTR71 | |
| 4DB4H | MTR72 | |
| 4DDEH | MTR73 | |
| 4E08H | MTR74 | |
| 4E32H | MTR75 | |
| 4E5CH | MTR76 | ETC. . . . |

TABLE 2-continued
MEMORY MAP

| Address (Hex) | Label | Description |
| --- | --- | --- |
| 4E86H | MTR77 | |
| 4EB0H | MTR78 | |
| 4EDAH | MTR79 | |
| 4F04H | MTR80 | |
| 4F2EH | MTR81 | |
| 4F58H | MTR82 | |
| 4F82H | MTR83 | |
| 4FACH | MTR84 | |
| 4FD6H | MTR85 | |
| 4FFFH | ENDDA | LAST BYTE OF RAM MEMORY |

Besides program control software, the EPROM contains ASCII data which is used by the display driver 1011 to display command words and numerical information on the LCD 1010.

Data memory space is provided by two 2K×8 CMOS static RAM's 1020 and 1021 as seen in FIG. 58B. These components are also state-of-the-art in static CMOS memory devices. RAM is mapped from 4000 Hex to 4FFF Hex as seen from the memory map in Table 2. Address decoder 1073 determines whether EPROM or RAM is being addressed, and outputs chip select signals 1074 to the appropriate devices as necessary. RAM memory is divided into buffer and parameter storage areas and data memory for 85 PDR TM meters worth of data as seen from the memory map.

The liquid crystal display used in the Programmer/Reader 1010 is an 8 digit 5×7 Dot Matrix display which can be driven by one component, the μPD 7277 display driver I.C.1011. This display driver is supplied serial ASCII data from the microprocessor via the output port 1071 as well as the 1 MHZ clock signal from the CPU. Signals are buffered with inverters in 1012. The complex drive waveforms are supplied directly to the LCD at 1013. Temperature compensation for the drive voltages at the LCD is provided internally in the CMOS micropower regulator 1065.

The optical port in the Programmer/Reader is housed in a headshell 1130 which is magnetically held in place on the front of the PDR TM meter cover. A coiled cable 1044 connects the P/R and the optical headshell. The optical components include an infrared emitting diode 1040a and I.R. detector photodiode 1040b. Logic signals produced by the microprocessor 1042 are amplified by transistor amplifier 1041 to drive the I.R. emitter 1040a. Detected light signals received by photodiode 1040b produce a current signal which is amplified by buffer inverter 1045 to produce logic voltage signal 1043 monitored by the microprocessor. Serial communication is performed using a non-standard protocol developed by the applicants. Serial data is redundancy checked to determine that no errors are incurred.

A piezoelectric alarm 1090 is used as an audible feedback to the user to verify that a switch closure on keyboard had occurred properly. The microprocessor detects the switch closure via data bus buffers 1111 and 1112 and determines first if the switch closure is valid. If so, the CPU outputs a logic signal via output port 1071 to the piezoeletric alarm to sound a "BEEP".

A real time clock chip 1120 is incorporated in the Programmer/Reader to provide automatic date updating for user convenience. The current date is entered by the user into the P/R memory and is transferred to the PDR TM during a "RESET" communications sequence. This date information will be automatically updated at midnight by the CPU via the clock chip I.C. 1120. The clock I.C. communicates with the CPU in a serial data format over line 1121. Leap years are automatically handled by the clock I.C. also by a built-in calendar.

P/R Software Description

Refer to the flowcharts in FIGS. 61-65 representing the operating systems for the Programmer/Reader device. Upon power-up, the microprocessor registers are initialized (2000) and a hardware state is checked to determine if the P/R is being used at a field site or it is installed in a DUNCAN DTS-82 translation system reader (2010). Should the P/R be installed in a DUNCAN DTS-82, data RAM can be retrieved by DMA (Direct Memory Access) into the translation computer (2020). The P/R can also be initialized remotely by the translation computer (2030) or the current time set into the P/R (2040), as chosen by the computer operator.

Assuming that the P/R is not in the DTS-82 translation system and is powered-up for the first time, the unit will display "INIT MEM" on the LCD 2050, requesting the user to initialize the unit via the keyboard. By pressing the INIT MEM key on the keyboard (2060), zeros will be stored in RAM memory, initializing the unit. A ROM to RAM transfer of tabular data will occur at this point 2070 and the data memory pointer register set to the first block of meter data RAM space (2080). A logic signal is monitored by the microprocessor to determine battery status (2090) and if battery voltage is OK, the unit will request a password from the operator by displaying "ENTER ID" (2100) on the LCD. Depressing the "USER ID" key (2110) and entering a valid three-digit number (2120) allows the operator to access the main program loop where the P/R displays "COMMAND?" on the LCD (2130). In this loop the P/R scans the keyboard for a valid key closure (2140) requesting one of the many command functions (2150).

The numerous command functions on the P/R can be broken down into three main categories:
(1) Parameter Entry Functions (2160)
(2) P/R Memory Functions (2170)
(3) P/R Communication Functions with the PDR (2180).

Each of these command functions will be described forthwith.

In the first group of P/R functions the user must enter values for the various meter parameters required for proper PDR TM operation. First a "USER ID" (2200) optical communications password must be entered into the P/R as previously discussed. A frequency (2210) value of 50 or 60 Hertz is required as well as a meter constant $K_h$ (2220), $M_p$ ratio (2230), and transformer factor (2240). The PDR TM is assigned a six-digit non-zero serial number (2250), a demand interval length (2260) between 01 and 60 minutes, and a meter type 2270 which determines whether the meter is rolling, block, cumulative, etc. Two preset values, the ALARM ON KW (2280) and LOAD OFF KW (2290) determine at what power levels control relays will actuate in the PDR TM. Finally DATE (2300) and TIME (2210) should be entered in the Programmer/Reader. The date information is used in the PDR TM to specify when a reset of the demand information, has taken place. Additionally the provision is made for a NEW PASSWORD (2320) which the utility can use to secure the PDR TM meter from tampering.

The second group of functions which can be performed with the P/R deal with the RAM memory in the device which contains meter data, programmed meter parameter values, and display information. When first powering-up the device, it is necessary to zero-out all RAM locations before any meaningful data can be stored. In the "INITIALIZE" sequence, zeros (0s) are first written to RAM (2400) and afterwards all RAM is read to verify that all locations are zero. If not, an "ERROR 3" is displayed on the LCD (2410). Finally three memory check bytes AA, 99, 55 are stored in a status area in RAM (2420) as defined in the memory map. These are checked at device power-up to see if RAM data is intact.

Parameter information which has been previously entered by the user can be viewed sequentially on the LCD by performing the "PROG VERIFY" function (2430). Meter data which has been read and stored in memory in the P/R can be viewed in similar fashion by using the "METER DATA" key function (2440). A "PAUSE/CONTINUE" key allows the user to stop any displayed information that is desired and hold it on the LCD. Pressing the "PAUSE/CONTINUE" key a second time resumes the sequencing of information (2450). When in a paused condition, the four arrow keys (↑ ↓ ←→) on the Programmer/Reader keyboard can be used to manually scroll through the data or shift energy and cumulative demand data left and right on the LCD (2460).

The amount of meter data stored in the P/R and, conversely, the amount of free data RAM space still remaining can be determined using the "METERS READ" function (2460) and "AVAIL MEM" (2450) functions of the Programmer/Reader. Data memory will contain zeros if no meter data has been previously stored. By determining where blocks of zeros start appearing in data memory, the CPU determines how much data is stored and consequently how much free RAM remains.

The third group of functions which are performed using the Programmer/Reader are the important optical communications with the PDR TM meter. During a "READ" communications sequence, data contained in the PDR TM consisting of energy and demand information as well as meter parameters are sent serially via the optical port to a buffer in the P/R RAM space. The data is packed into a 42 byte block and then stored in the area designated by the Data Memory Pointer register as determined by the CPU (2510).

In a "PROGRAM" sequence, programmed parameter information which has been supplied by the operator and stored in the P/R is sent serially to the PDR TM in three blocks (2520). Date information is excluded as it is sent only in a "RESET" communications sequence.

A "MASTER RESET" (2540) and "BILLING RESET" (2530) are both available on the Programmer/Reader to clear demand information and energy information on the PDR TM. Refer to the description of the PDR TM operation concerning the exact nature of these functions.

Finally, a communications sequence to determine the unknown value of the PDR TM password (2550) is incorporated in the Programmer/Reader.

The Billing Period Resetter (BPR) and the BPR-1

Figure 66:
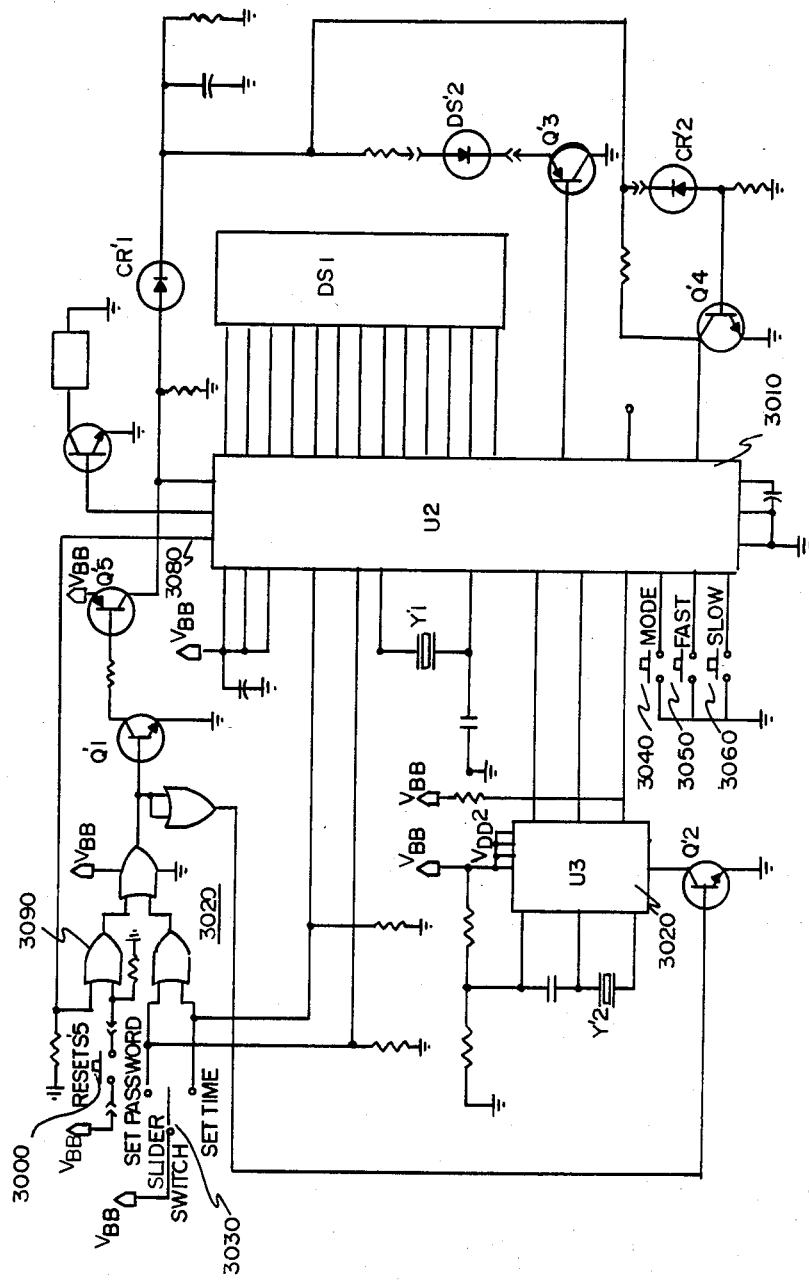
FIG. 66 is an electrical schematic diagram for the BPR.
Figure 68:
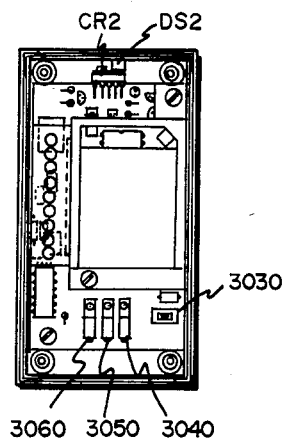
FIG. 68 is a top plan view of the BPR with the cover removed.
Figure 69:
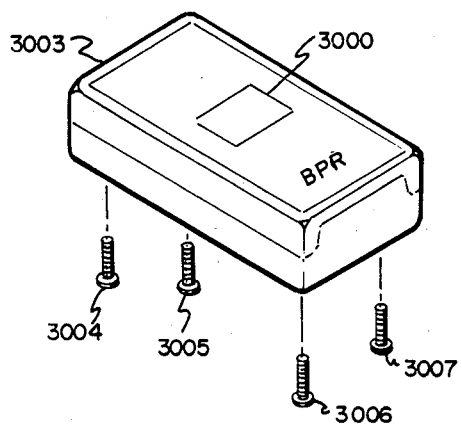
FIG. 69 shows the BPR cover.

The circuit diagram for the BPR is shown in FIG. 66. The BPR and the BPR-1 Billing Period Resetters are handheld, battery powered devices for use with the above-described Programmable Demand Register TM (PDR TM) series. The difference between the two resetters is that the BPR incorporates a realtime clock, which allows the actual date of reset to be set into the PDR TM for added security, and an LED display for setting of the clock and the password. The BPR-1 does not set the actual date into the PDR TM and the password is set via an eight position DIP switch.

Figure 71:
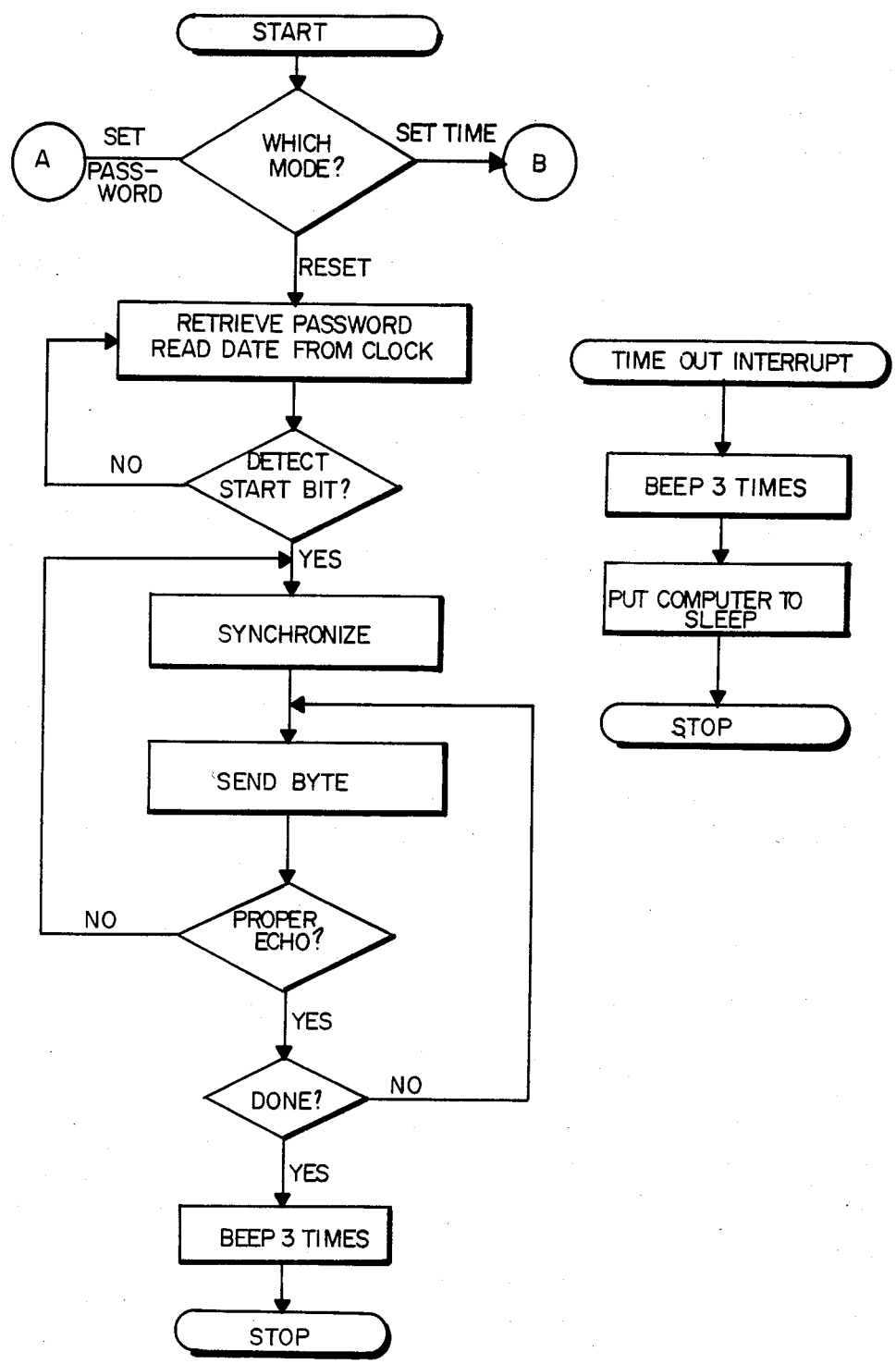
FIG. 71 is a BPR flowchart.

The function of the BPR is to reset the billing information in the PDR TM at the end of a billing cycle. This is accomplished by placing the locating collar (not shown) of the BPR in position on the meter cover and depressing the large RESET button 3000. Immediately upon pressing the RESET button, the BPR will beep once to inform the user that positive contact of the switch has been made, and that the battery is functional. When the RESET button has been depressed, the power to the microcomputer 3010 is applied as described hereinafter under the "BPR Unique Power Latch Circuit". The microcomputer monitors the optical communications port, (Q3, Q4, DS2 and CR2) for incoming data from the PDR TM. When data is detected, the BPR times the length of the start bit from the PDR TM and syncronizes itself to the PDR TM. Then, the BPR transfers the password to the PDR TM, and if correct, it then sends the reset command word and the date that has been read from the clock, 3020. As each of the pieces of data is transferred to the PDR TM, the PDR TM echoes it back to the BPR in asynchronous fashion to ensure that correct data has been transferred. If incorrect data is encountered, the process is repeated from the timing of the start bit forward. After completing a valid billing period reset, the BPR turns itself off, also described in the "power latch" disclosure. Also, when data has been transferred between the BPR and the PDR, the resetter will beep three times to let the user know that a valid reset has taken place. If for some reason a valid reset has not been accomplished, six beeps will sound on the resetter after a period of approximately six seconds. Should this occur, an additional try will be necessary to reset the meter. Once reset the meter cannot be reset again for 15 seconds. The flowchart for the reset operation is shown in FIG. 71.

To set the clock, place the slide switch 3030 in the up position (toward the LED display). The display will illuminate, and will display "0000" (with a new battery). This indicates the hours and minutes information, which upon initialization is zero hours, zero minutes. To change the time, depress the bottom setting switch (the MODE button 3040). The first two digits will begin flashing, indicating that they may now be changed. To change the hours information, use the FAST (3050) and SLOW (3060) buttons, as appropriate, to advance the hours. The clock (3020) in the BPR is a 24 hour type, and the display will advance from "00" to "23" and then back to "00". When the desired hours number is reached, release the button. Should the desired value be passed inadvertently, continue on and the counter will wrap around to "00" and start over.

Next, depress the MODE button 3040 again and the minutes digits will begin flashing. Using the same procedure as for the hours, advance the minutes to the desired value. The minutes data will advance from "00" to "59" and then back to "00".

Depressing the MODE button again will bring up the date display. Upon initialization, the display will read "010100", indicating Jan. 1, year 00. The date is displayed in the familiar "month-day-year" format. The date is set in the exact same manner as the time was set. The BPR will not accept "00" as a valid entry for either the month or day.

Figure 72:
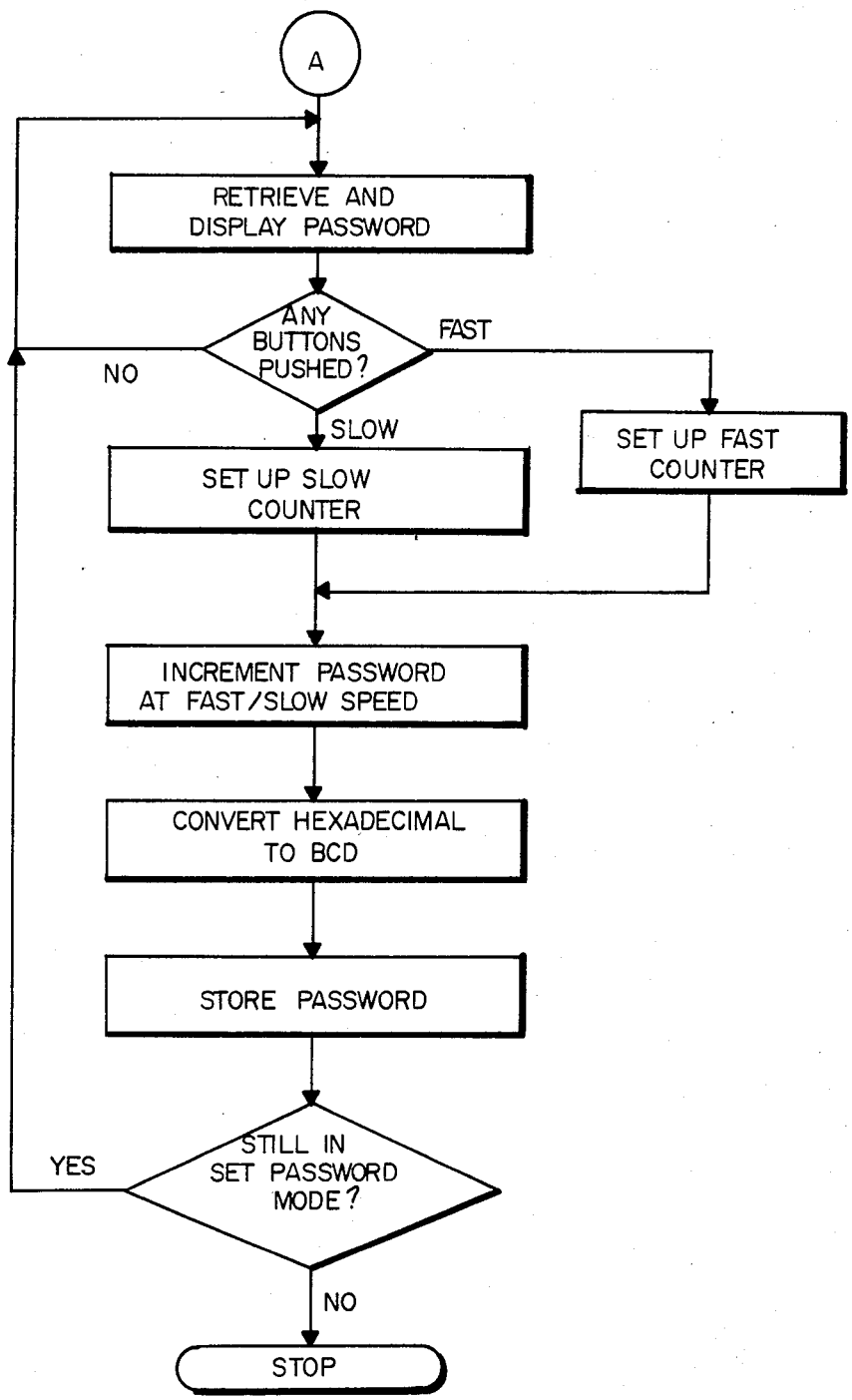
FIG. 72 is a BPR flowchart.
Figure 75:
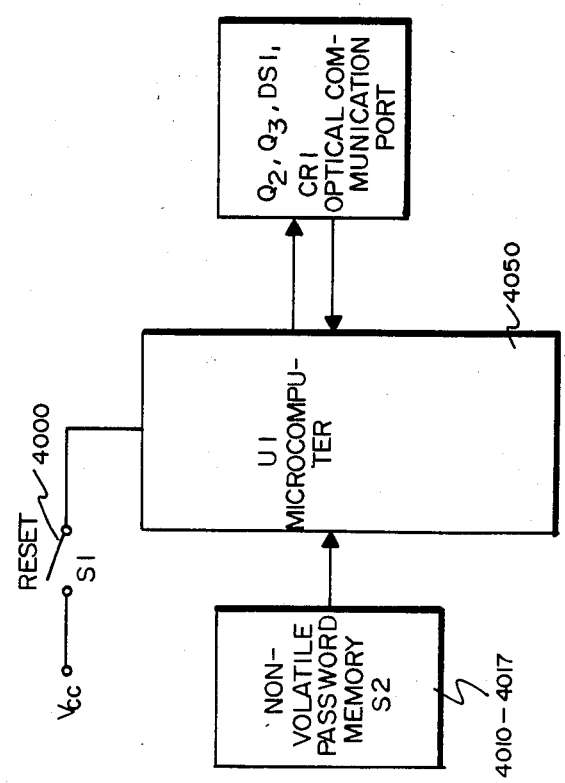
FIG. 75 is a block diagram of the BPR-1.
Figure 73:
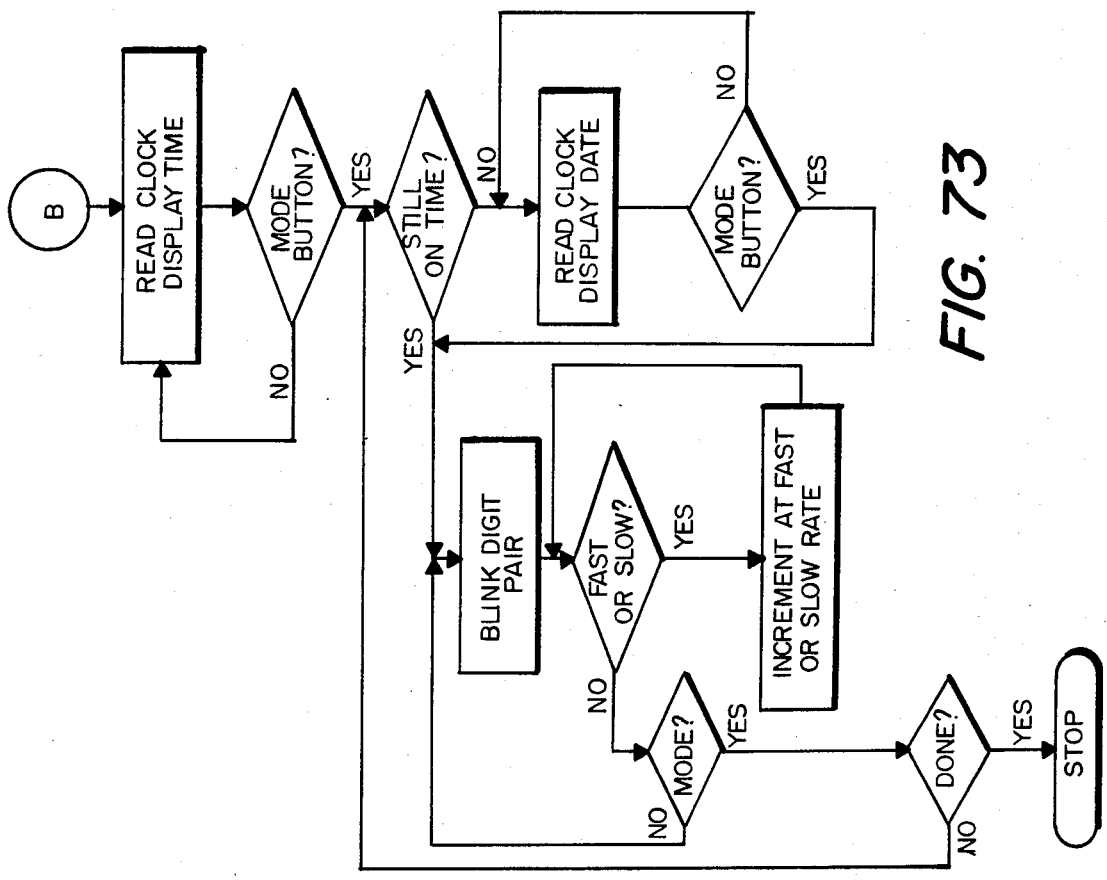
FIG. 73 is a BPR flowchart.

When the date is set in correctly, the time and date may be reviewed by depressing the MODE switch to bring about the desired display. After successfully setting the time and date, return the slide switch 3030 to the center OFF position. The flowchart is shown in FIG. 72.

Note that the clock in the BPR is used for setting the date, only, in the PDR TM. Therefore, the time information may run as much as 5 minutes fast or slow per month. This is normal and indicates no problem with the time keeping function of the BPR.

Setting of the communications password is similar to the setting of the time and date. Place the slide switch (3030) in the down position (away from the LED display). Three digits should appear on the display. Usually, upon replacement of the battery, "000" will appear, but other values may appear instead. To advance the counter, use the FAST and SLOW buttons in the same manner as used in setting the time. The MODE button 3040 has no function in password set function. When the correct password appears in the display, return the slide switch to the center OFF position.

When correct values for both the time/date and password have been set into the BPR, replace the cover 3003 and secure with the four screws, 3004, 3005, 3006 and 3007.

Figure 70:
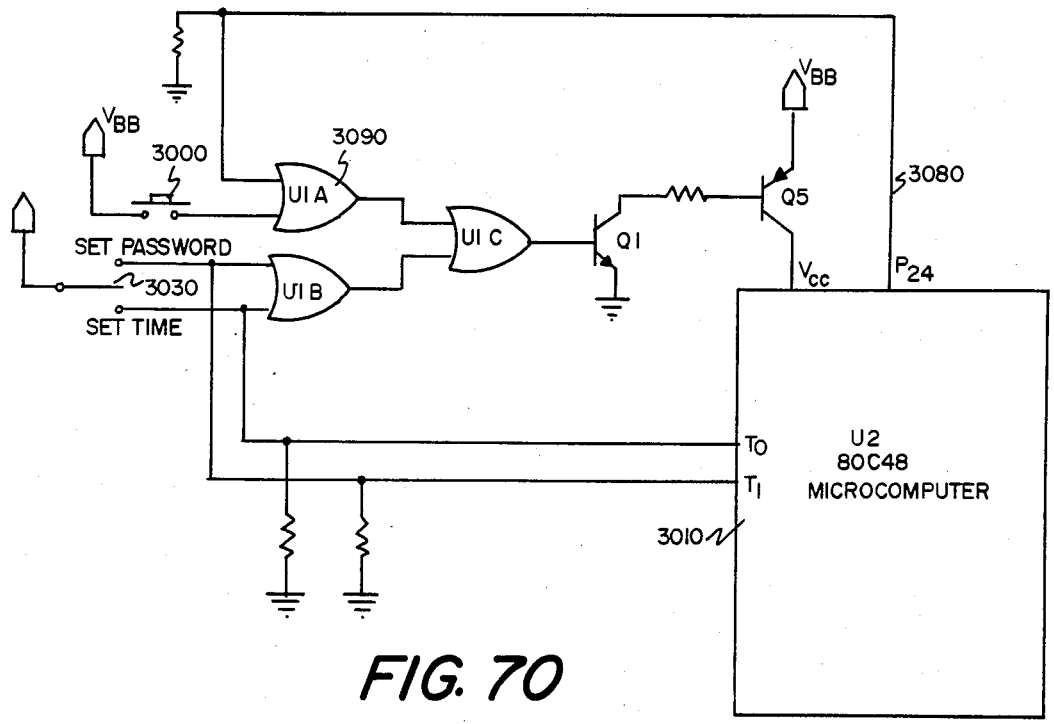
FIG. 70 shows some details of the BPR circuit.

The BPR incorporates an automatic power latch circuit by which the microcomputer turns power to itself on and off at optimum times which allows significant saving of power and conservation of battery life. The operation of this circuit is hereafter described, and shown in FIG. 70.

When the reset switch (3000) is depressed, the OR gate 3020 causes transistor pair Q1-Q5 to turn on and this in turn applies voltage (VBB) to the microcomputer, 3010. With voltage applied, the microcomputer begins executing its instruction. One of the first instructions executed is to cause output line 3080 to go to the high state, thereby latching 3090 in the high state also. Once this is accomplished (which takes only a few microseconds) the operator may remove his finger from the button. When the microcomputer has finished its task, it then writes a low to output line 3080 which now causes 3090 to go to the low state (if the reset button is released) and the transistor pair Q1-Q5 to turn off, thus turning the microcomputer off. Since the microcomputer is able to determine exactly when it has finished its task, it will be shut off at the optimum moment and allow for maximum battery life.

Switch 3030 allows the microcomputer to run for extended periods of time to allow setting of the password of the time. The switch contacts are monitored by the microcomputer, and when the switch is returned to its normal center off position, the microcomputer finishes its task and shuts itself off in the same manner as above, once again allowing for maximum possible battery life.

The BPR-1

Figure 74:
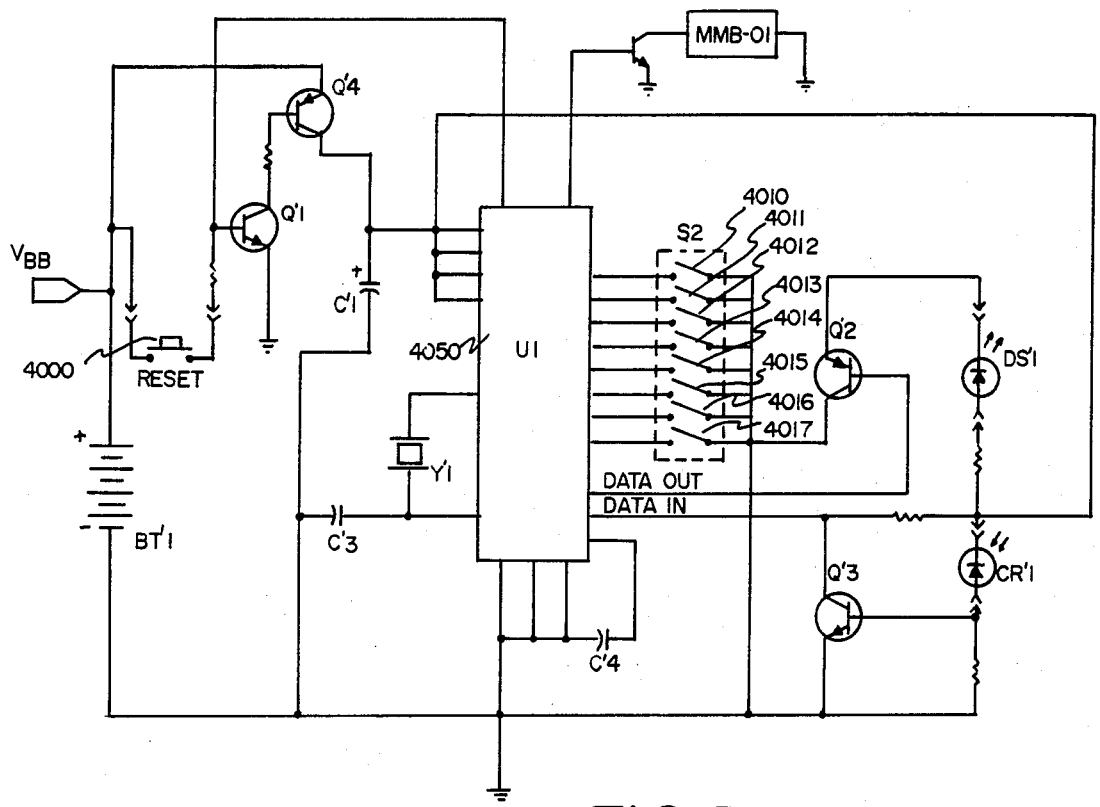
FIG. 74 is a schematic electrical diagram for the BPR-1.
Figure 76:
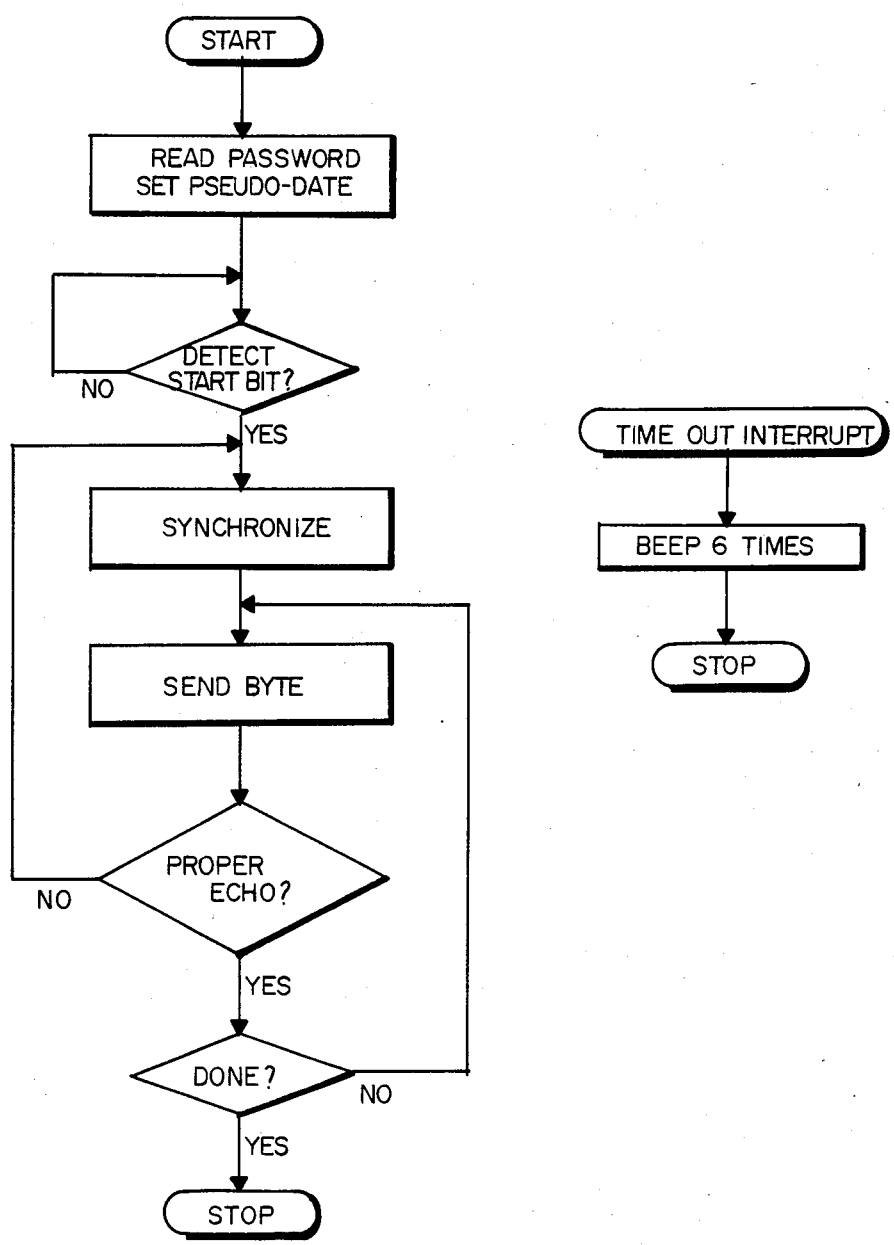
FIG. 76 is a flowchart for BPR-1.

The circuit diagram for the BPR-1 is shown in FIG. 74. The function of the BPR-1, like the BPR, is to reset the billing information in the PDR TM at the end of a billing cycle. Like the BPR, this is accomplished by placing the locating collar of the BPR-1 (not shown) in position on the meter cover and depressing the large RESET button (4000) immediately upon pressing the RESET button, the BPR-1 will beep once to inform the user that positive contact of the switch has been made and that the button is functional. The microcomputer (4010) monitors the optical communications port (Q2, Q3, DS1 and CR1) (shown in FIG. 74) for incoming data from the PDR TM. When data is detected, the BPR-1 times the length of the start bit from the PDR TM and synchronizes itself to the PDR TM. Then, the BPR-1 transfers the password to the PDR TM, and if correct, it then sends the reset command word and a pseudo date value (88-88-88). As each of the pieces of data is transferred to the PDR TM, the PDR TM echoes it back to the BPR-1 in asynchronous fashion to ensure that correct data has been transferred. If incorrect data is encountered, the process is repeated from the timing of the start bit forward. The BPR-1 will beep three times and turn itself off by removing power to transistor Q1 when correct data has been communicated between the resetter and the PDR TM. If the reset operation should not be completed after six seconds, the BPR-1 will beep six times denoting an incomplete reset attempt. The flowchart for this operation is shown in FIG. 76.

The BPR-1 does not have a clock, nor is the password stored in a volatile memory. Therefore, the password need not be entered each time the battery is changed. The initial setting of the password or changing of the password is accomplished in the following manner.

Figure 77:
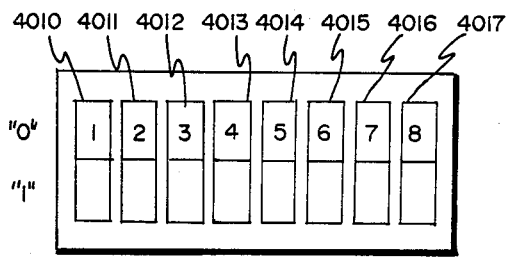
FIG. 77 is an enlarged view of the switches shown in FIG. 79.

Remove the four screws 4001, 4002, 4003 and 4004 securing the cover 4005 and lift the cover off being careful not to damage the switch leads. The password is set using the series of 8 DIP switches 4010, 4011, 4012, 4013, 4014, 4015, 4016 and 4017, at the end of the printed circuit board opposite of the communications port. The switches are labeled "1" or "0" as shown in FIGS. 77 and 78. The password is entered on the switches by referring to Table 3 and finding the corresponding binary value for the desired password.

A partial showing of correct encoding for password setting is shown in the following Table.

| Password | Switch | Setting |
| --- | --- | --- |
| 000 | 0 0 0 0 | 0 0 0 0 |
| 001 | 0 0 0 0 | 0 0 0 1 |
| 002 | 0 0 0 0 | 0 0 1 0 |
| 003 | 0 0 0 0 | 0 0 1 1 |
| 004 | 0 0 0 0 | 0 1 0 0 |
| 005 | 0 0 0 0 | 0 1 0 1 |
| 006 | 0 0 0 0 | 0 1 1 0 |
| 007 | 0 0 0 0 | 0 1 1 1 |
| 008 | 0 0 0 0 | 1 0 0 0 |
| 009 | 0 0 0 0 | 1 0 0 1 |
| 010 | 0 0 0 0 | 1 0 1 0 |
| 011 | 0 0 0 0 | 1 0 1 1 |
| 012 | 0 0 0 0 | 1 1 0 0 |
| 013 | 0 0 0 0 | 1 1 0 1 |
| 014 | 0 0 0 0 | 1 1 1 0 |
| 015 | 0 0 0 0 | 1 1 1 1 |
| 016 | 0 0 0 1 | 0 0 0 0 |
| 017 | 0 0 0 1 | 0 0 0 1 |

-continued

| Password | Switch | Setting |
|---|---|---|
| 018 | 0 0 0 1 | 0 0 1 0 |
| 019 | 0 0 0 1 | 0 0 1 1 |
| 020 | 0 0 0 1 | 0 1 0 0 |

Once the password is set, the cover is replaced and secured with the four screws.

What is claimed is:

1. A programmable demand register (PDR) for registering AC electric energy consumption by a load comprising:
   energy flow pick-up means;
   optical scanning means including light emitting and light receiving sources, completion of light transmission therebetween being periodically interrupted by said energy flow pick-up means;
   a transducer responsive to the transmit-non transmit mode of said optical scanner means to produce a binary code output which is directly related to electric energy consumption and which is stored in a first memory;
   clock means producing real time data;
   a second memory containing program control data;
   bidrectional optical communciation port means,
   PDR data output means whereby, upon receipt of a signal, the data stored in said first memory is transmitted to a receiver external of the PDR; and
   PDR data input means whereby the meter memories may, upon receipt of a proper password signal, be actuated.

2. The PDR according to claim 1 in which the energy flow pick-up means is comprised of a single rotatable disk positioned for response directly proportional to the energy flow through the PDR in either rotational direction.

3. The PDR according to claim 2 having at least two light emitters and two light receivers which are located inside the outer periphery of said disk, and wherein said disk has at least one slot therein.

4. The PDR according to claim 3 in which the said light receivers are exposed to a combination of ambient light conditions and light emitter output, depending on the rotational position of said disk.

5. The PDR according to claim 3 in which said emitters are serially energized and deenergized by control means forming part of said second memory whereby data reported to the said first memory is compared and checked for error, and whereby the multiplex operation conserves energy usage by the PDR.

6. The PDR according to claim 1 in which said second memory includes a NOVRAM whereby power failure conditions do not clear the data prestored in said memory.

7. The PDR according to claim 1 in which said second memory contains multiple function modes which are selectively, singly or in groups, programmable externally through said bidirectional optical communications port means.

8. A programmable demand register according to claim 7, in which said communication port means is bidirectional in that information may be inserted into the PDR through said port, or extracted from the PDR through the same port.

9. The PDR according to claim 8 in which said communication port is responsive to a predetermined external light reflectance which causes switch means in the PDR to turn on, and the absence of which reflectance conditions turns said switch means off.

10. The PDR according to claim 9 in which said light responsive switch means is exposed to ambient light conditions surrounding the exterior of the PDR.

11. The PDR according to claim 1 in which said communications port includes a single optical infrared light tunnel which extends between a meter cover and the meter face whereby extraneous ambient light sources are obscured.

12. For use with the PDR of claim 1, a Programmer/Reader (P/R) unit comprising:
   a central processing unit which provides all the control functions for said P/R;
   a program memory (EPROM) which controls the serial operations of the P/R;
   a random access data memory (RAM) adapted for retrieval of information from EPROM or information directly written to RAM;
   an optical port for bidirectional communication between the interface of said PDR and the P/R and by means of which the various metering functions of the PDR may be enabled or disabled, either singly or serially, and further by means of which meter output information is received back and stored by the P/R.

13. The P/R according to claim 12, including firmware preprogrammed into said EPROM whereby the two way communication functions between the BPR and the P/R are accomplished.

14. The P/R according to claim 13 in which all functions are passively activated and driven by power supplied from the PDR, whereby no independent power source is required on board the P/R resulting in a convenient, portable and lightweight unit.

15. The P/R according to claim 13 in which the optical communication means of the P/R is located in a self-contained headshell which is flexibly connected to the main P/R, and which headshell is adapted for magnetic affixation to the PDR meter cover, and said optical communication means being symmetrical whereby its ability to correctly communicate with the meter is independent of its rotational orientation on the meter face.

16. The P/R according to claim 12 which includes output means compatible with existing data translation stations whereby data stored in the P/R may be readily down loaded to a central translation station.

17. The P/R according to claim 12 in which additional functions are provided; namely
   billing reset is accomplished,
   master reset of all circuits in the PDR is accomplished;
   and password find interrogation is accomplished.

18. A billing period resetter (BPR) for use with the PDR described in claim 1 and comprised of:
   a microprocessor;
   a power supply;
   a light emitting diode display; and
   an optical communication port adapted to receive the output from the optical communications port of the PDR.

19. The BPR according to claim 18 in which the microprocessor includes a power latch circuit adapted so that the microprocessor latches itself on and then turns itself off responsive precisely to completion of the its read-out task whereby battery life is conserved.

20. The BPR according to claim 18 which includes automatic bit rate synchronizer means whereby the microprocessor times the length of the 1,0 pattern presented at its optical port and uses this data to synchronize itself with the communications speed of the PDR whereby the BPR is usable with any PDR even though bit output rates may vary between PDRs.

21. The BPR according to claim 18 including software adapted to set the date of reset into the PDR meter as it resets it whereby the date of every reset is recorded in the PDR and unauthorized resets may be readily detected.

22. A billing period resetter, of simplified construction (BPR-1) for use with the PDR of claim 1 comprising:
- a group of switches manually set to selectively indicate one or zero in binary code, said code number being used to define the password for access to the PDR, and wherein only a simple memory circuit is contained in said BPR-1 whereby a low cost lightweight portable meter reading, data storage, and resetter device is provided.

23. A programmable demand register (PDR) for registering AC electric energy consumption by a load comprising:
- energy flow pick-up means being responsive to the field created by the secondary coil of the PDR in the standard manner, the improvement comprising:
- secondary coil input impedance compensation means including,
- a bridge circuit connected so that, under stable voltage conditions, circuit current remains stable, and with voltage increase the circuit current also rises, and with voltage decrease the circuit current also decreases, and whereby all the three aforesaid conditions present the same input impedance to the said secordary coil;
- optical scanning means including light emitting and light receiving sources, completion of light transmission therebetween being periodically interrupted by said energy flow pick-up means;
- a transducer responsive to the transmit-non transmit mode of said optical scanner means to produce a binary code output which is directly related to electric energy consumption and which is stored in a first memory;
- clock means producing real time data;
- a second memory containing program control data;
- bidirectional optical communication port means;
- PDR data output means whereby, upon receipt of a signal, the data stored in said first memory is transmitted to a receiver external of the PDR; and
- PDR data input means whereby the meter memories may, upon receipt of a proper password signal, be actuated.

* * * * *